United States Patent
Tsubaki et al.

(10) Patent No.: US 10,962,884 B2
(45) Date of Patent: *Mar. 30, 2021

(54) TREATMENT LIQUID AND PATTERN FORMING METHOD

(71) Applicant: FUJIFILM Corporation, Tokyo (JP)

(72) Inventors: Hideaki Tsubaki, Shizuoka (JP); Toru Tsuchihashi, Shizuoka (JP); Wataru Nihashi, Shizuoka (JP); Kei Yamamoto, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 173 days.

This patent is subject to a terminal disclaimer.

(21) Appl. No.: 15/937,876

(22) Filed: Mar. 28, 2018

(65) Prior Publication Data
US 2018/0217503 A1   Aug. 2, 2018

Related U.S. Application Data

(63) Continuation of application No. PCT/JP2016/078230, filed on Sep. 26, 2016.

(30) Foreign Application Priority Data

Sep. 30, 2015 (JP) .............................. JP2015-195057

(51) Int. Cl.
| | | |
|---|---|---|
| G03F 7/32 | (2006.01) | |
| G03F 7/40 | (2006.01) | |
| G03F 7/075 | (2006.01) | |
| G03F 7/095 | (2006.01) | |
| G03F 7/039 | (2006.01) | |
| G03F 7/004 | (2006.01) | |
| G03F 7/11 | (2006.01) | |
| G03F 7/038 | (2006.01) | |
| H01L 21/304 | (2006.01) | |
| G03F 7/16 | (2006.01) | |
| G03F 7/20 | (2006.01) | |
| G03F 7/38 | (2006.01) | |

(52) U.S. Cl.
CPC .............. *G03F 7/32* (2013.01); *G03F 7/0043* (2013.01); *G03F 7/0046* (2013.01); *G03F 7/038* (2013.01); *G03F 7/039* (2013.01); *G03F 7/0382* (2013.01); *G03F 7/0392* (2013.01); *G03F 7/0397* (2013.01); *G03F 7/0758* (2013.01); *G03F 7/095* (2013.01); *G03F 7/11* (2013.01); *G03F 7/16* (2013.01); *G03F 7/168* (2013.01); *G03F 7/2004* (2013.01); *G03F 7/325* (2013.01); *G03F 7/38* (2013.01); *G03F 7/40* (2013.01); *H01L 21/304* (2013.01)

(58) Field of Classification Search
CPC .................................. G03F 7/32; G03F 7/325
See application file for complete search history.

(56) References Cited

U.S. PATENT DOCUMENTS

| | | |
|---|---|---|
| 2011/0287234 A1 | 11/2011 | Tsuchihashi et al. |
| 2012/0219755 A1 | 8/2012 | Bae et al. |
| 2013/0122425 A1 | 5/2013 | Yoshida et al. |
| 2014/0242518 A1* | 8/2014 | Hatakeyama ............ G03F 1/32 430/281.1 |

FOREIGN PATENT DOCUMENTS

| | | |
|---|---|---|
| JP | S5559459 | 5/1980 |
| JP | S5882244 | 5/1983 |
| JP | S58106536 | 6/1983 |
| JP | H0566570 | 3/1993 |
| JP | 2010256858 | 11/2010 |
| JP | 2011065105 | 3/2011 |
| JP | 2012181523 | 9/2012 |
| JP | 2013117701 | 6/2013 |
| KR | 20130048166 | 5/2013 |
| TW | 201035685 | 10/2010 |

OTHER PUBLICATIONS http://www.stenutz.eu/chem/solv6.php?name=2-hexanone (Year: 2020).*
https://www.ebi.ac.uk/chebi/searchId.do;jsessionid= CD5289DCF51F2583ACE271D48DCC15EB?chebiId= CHEBI:46342 (Year: 2020).*
"Office Action of Japan Counterpart Application," with English translation thereof, dated Mar. 26, 2019, p. 1-p. 7.
"International Search Report (Form PCT/ISA/210) of PCT/JP2016/ 078230", dated Dec. 27, 2016, with English translation thereof, pp. 1-5.
"Written Opinion of the International Searching Authority of PCT/ JP2016/078230" with English translation thereof, dated Dec. 27, 2016, p. 1-p. 9.
"Office Action of Korea Counterpart Application," with English translation thereof, dated Oct. 14, 2019, p. 1-p. 11.
"Office Action of Japan Counterpart Application", dated Dec. 4, 2018, with English translation thereof, p. 1-p. 7.
"Office Action of Korea Counterpart Application", dated Apr. 28, 2020, with English translation thereof, p. 1-p. 6.

(Continued)

*Primary Examiner* — Kathleen Duda
(74) *Attorney, Agent, or Firm* — JCIPRNET

(57) ABSTRACT

An object of the present invention is to provide a treatment liquid for patterning a resist film and a pattern forming method, each of which can simultaneously suppress the occurrence of pattern collapse in a resist L/S pattern and the occurrence of omission failure in a resist C/H pattern.

The treatment liquid of the present invention is a treatment liquid for patterning a resist film, which is used for subjecting a resist film obtained from an actinic ray-sensitive or radiation-sensitive resin composition to at least one of development or washing, and contains an organic solvent, in which the treatment liquid contains a first organic solvent having an SP value of 16.3 $MPa^{1/2}$ or less and a second organic solvent having an SP value of 17.1 $MPa^{1/2}$ or more.

8 Claims, No Drawings

(56) References Cited

OTHER PUBLICATIONS

"Office Action of Taiwan Counterpart Application", dated Feb. 19, 2020, with (partial) English translation thereof, p. 1-p. 10.
"Office Action of Taiwan Counterpart Application", dated May 26, 2020, with (partial) English translation thereof, p. 1-p. 11.

* cited by examiner

TREATMENT LIQUID AND PATTERN FORMING METHOD

CROSS-REFERENCE TO RELATED APPLICATIONS

This application is a Continuation of PCT International Application No. PCT/JP2016/078230 filed on Sep. 26, 2016, which claims priority under 35 U.S.C. § 119(a) to Japanese Patent Application No. 2015-195057 filed on Sep. 30, 2015. The above application is hereby expressly incorporated by reference, in its entirety, into the present application.

BACKGROUND OF THE INVENTION

1. Field of the Invention

The present invention relates to a treatment liquid for patterning a resist film and a pattern forming method.

More specifically, the present invention relates to a treatment liquid which is used in a process for manufacturing a semiconductor such as an integrated circuit (IC), the manufacture of a circuit board for a liquid crystal, a thermal head, or the like, and other lithographic processes for photofabrication processes, and the like, and a pattern forming method.

2. Description of the Related Art

In the related art, in a process for manufacturing a semiconductor device such as an integrated circuit (IC) and a large scale integrated circuit (LSI), microfabrication by lithography using a photoresist composition has been carried out. In recent years, ultrafine pattern formation in a submicron region and a quarter-micron region has been required, in accordance with realization of high integration of integrated circuits. In such a circumstance, exposure wavelength has a tendency to become shorter, such as from a g-ray to an i-ray, and further to KrF excimer laser light. Further, development of lithography using electron beams, X-rays, or extreme ultraviolet (EUV) light, in addition to the excimer laser light, is also now progressing.

In such the lithography, after forming a film using a photoresist composition (also called an actinic ray-sensitive or radiation-sensitive resin composition or a chemically amplified resist composition), the obtained film has been developed with a developer, or the developed film has been rinsed with a rinsing liquid.

For example, JP2012-181523A discloses that an organic treatment liquid containing a mixture of a first organic solvent and a second organic solvent, selected from a ketone-based solvent and an ester-based solvent, is used as a developer.

SUMMARY OF THE INVENTION

In recent years, in accordance with realization of high integration of integrated circuits, formation of a fine pattern using a photoresist composition (actinic ray-sensitive or radiation-sensitive resin composition) has been required. In such the formation of a fine pattern, the following problems occur as the patterns become finer, and thus, the performance of the resist pattern is easily deteriorated. That is, in an L/S pattern (line space pattern), as the pattern becomes finer, a distance between the patterns becomes shorter, resulting in generation of a large capillary force, and thus, "pattern collapse" easily occurs. On the other hand, in a C/H pattern (contact hole pattern), as the pattern becomes finer, a pore diameter of the contact hole is smaller, and thus, "omission failure", such as failures in which the edges of the holes are connected to each other or the holes do not open at all, easily occurs. The developer and the rinsing liquid are not limited in terms of the types of patterns, such as an L/S pattern and a C/H pattern, and have been required to exhibit good performance, and a developer and a rinsing liquid, capable of simultaneously addressing the problems of the occurrences of pattern collapse and omission failure, have been required.

However, a developer and a rinsing liquid, each of which can simultaneously suppress the occurrences of pattern collapse and omission failure in fine patterns, have yet not been known.

The present invention has been made in view of the above viewpoints, and has an object to provide a treatment liquid for patterning a resist film and a pattern forming method, each of which can simultaneously suppress the occurrence of pattern collapse in a resist L/S pattern and the occurrence of omission failure in a resist C/H pattern.

The present inventors have conducted extensive studies on the above object, and as a result, have discovered that a desired effect is obtained by using an organic treatment liquid including a combination of at least two organic solvents having solubility parameters (hereinafter also referred to as "SP values") in different specific ranges.

More specifically, the present inventors have discovered that the object can be accomplished by the following configurations.

(1) A treatment liquid for patterning a resist film,
used for subjecting a resist film obtained from an actinic ray-sensitive or radiation-sensitive resin composition to at least one of development or washing, and
containing an organic solvent,
in which the treatment liquid contains a first organic solvent having an SP value of 16.3 $MPa^{1/2}$ or less and a second organic solvent having an SP value of 17.1 $MPa^{1/2}$ or more.

(2) The treatment liquid as described in (1),
in which the treatment liquid is a rinsing liquid.

(3) The treatment liquid as described in (2),
in which the first organic solvent includes a hydrocarbon-based solvent.

(4) The treatment liquid as described in (3),
in which the first organic solvent includes a hydrocarbon-based solvent having 10 or more carbon atoms.

(5) The treatment liquid as described in (3) or (4),
in which the hydrocarbon-based solvent includes undecane.

(6) The treatment liquid as described in any one of (1) to (5),
in which the second organic solvent includes a ketone-based solvent.

(7) The treatment liquid as described in (6),
in which the ketone-based solvent includes an acyclic ketone.

(8) A pattern forming method comprising:
a resist film forming step of forming a resist film using an actinic ray-sensitive or radiation-sensitive resin composition;
an exposing step of exposing the resist film; and
a treating step of treating the exposed resist film with the treatment liquid as described in any one of (1) to (7).

(9) The pattern forming method as described in (8),
in which the treating step includes:
a developing step of carrying out development with a developer; and
a rinsing step of carrying out washing with a rinsing liquid, and
the rinsing liquid is the treatment liquid as described in any one of (1) to (7).
(10) The pattern forming method as described in (9),
in which the developer includes an ester-based solvent.
(11) The pattern forming method as described in (10),
in which the ester-based solvent is a solvent including at least one selected from the group consisting of butyl acetate, amyl acetate, isoamyl acetate, 2-methylbutyl acetate, 1-methylbutyl acetate, hexyl acetate, pentyl propionate, hexyl propionate, heptyl propionate, butyl butanoate, and butyl isobutanoate.

According to the present invention, it is possible to provide a treatment liquid for patterning a resist film and a pattern forming method, each of which can simultaneously suppress the occurrence of pattern collapse in a resist L/S pattern and the occurrence of omission failure in a resist C/H pattern.

DESCRIPTION OF THE PREFERRED EMBODIMENTS

[Treatment Liquid]

The treatment liquid of the present invention is a treatment liquid for patterning a resist film, which is used for subjecting a resist film obtained from an actinic ray-sensitive or radiation-sensitive resin composition to at least one of development or washing, and contains an organic solvent. The treatment liquid of the present invention includes a first organic solvent having an SP value of 16.3 $MPa^{1/2}$ or less and a second organic solvent having an SP value of 17.1 $MPa^{1/2}$ or more.

With the treatment liquid of the present invention, the occurrence of pattern collapse in a resist L/S pattern and the occurrence of omission failure in a resist C/H pattern can be simultaneously suppressed. Details of the reason therefor are still not clear, but are presumed to be as follows.

It is generally known that as the affinity of a developer and a rinsing liquid to a resist pattern is higher, it is excessively easy for the developer and the rinsing liquid to permeate into the pattern, which causes the swelling of the pattern. The swelling of the pattern excessively reduces a distance between the patterns with respect to an original pattern latent image, and as a result, a capillary force is further increased. With regard to this problem, it is presumed that by using a first organic solvent having an SP value of 16.3 $MPa^{1/2}$ or less, excessive penetration of the resist and the treatment liquid of the present invention, that is, the swelling, can be suppressed, and thus, the occurrence of pattern collapse in a resist L/S pattern can be suppressed.

On the other hand, omission failure in a C/H pattern is a problem which is particularly easily manifested with organic solvent development. That is, it is thought that due to an effect of a photoacid generator (PAG) or the like, unevenly deposited on the surface, a deprotection amount is slightly larger than that of a bulk layer, and thus, the surface layer of a resist film with relatively high polarity is not dissolved due to an insufficient dissolution contrast of organic solvent development. It is presumed that the treatment liquid of the present invention can penetrate into the surface layer of a resist film with relatively high polarity as described above by incorporation of a second organic solvent having an SP value of 17.1 $MPa^{1/2}$ or more, and thus, it is possible to make the solubilities of the bulk and the film surface layer approximate to each other, and thus to suppress the lack of the dissolution of the surface layer, that is, the omission failure of C/H.

As described above, the above-mentioned treatment liquid used as a developer and/or a rinsing liquid can simultaneously suppress the occurrence of pattern collapse in a resist L/S pattern and the occurrence of omission failure in a resist C/H pattern by incorporation of at least two organic solvents having different SP values.

In addition, particularly as a treatment liquid used in a step to be carried out later, a treatment liquid including a first organic solvent having an SP value of 16.3 $MPa^{1/2}$ or less and a second organic solvent having an SP value of 17.1 $MPa^{1/2}$ or more is preferably used, and that is, the treatment liquid of the present invention is preferably used in the rinsing liquid.

Furthermore, the SP value of the present invention is a value calculated using the Fedors method described in "Properties of Polymers, $2^{nd}$ edition, published in 1976". Further, the unit of the SP value is $MPa^{1/2}$ unless otherwise specified.

The treatment liquid of the present invention is typically used as a developer and/or a rinsing liquid. The treatment liquid contains an organic solvent, and preferably contains an antioxidant and/or a surfactant.

Hereinafter, the organic solvent will be first described, and the antioxidant and the surfactant which can be included in the treatment liquid will be then described.

The treatment liquid in the present invention includes a first organic solvent having an SP value of 16.3 $MPa^{1/2}$ or less and a second organic solvent having an SP value of 17.1 $MPa^{1/2}$ or more.

In a case where the SP value of the first organic solvent is more than 16.3 $MPa^{1/2}$, the affinity to the resist film is extremely high, and the developer and the rinsing liquid excessively easily penetrate into the resist film pattern, which causes the swelling of the pattern. Further, in a case where the SP value of the second organic solvent is less than 17.1 $MPa^{1/2}$, the solubility of the surface layer of the resist film with a relatively high polarity with respect to the bulk layer as described above is insufficient, and thus, the omission failure of C/H occurs.

<First Organic Solvent Having SP Value of 16.3 $MPa^{1/2}$ or Less>

The first organic solvent having an SP value of 16.3 $MPa^{1/2}$ or less is selected from various organic solvents, but for example, a solvent such as a hydrocarbon-based solvent, an ether-based solvent, and an ester-based solvent can be used. The lower limit of the SP value of the first organic solvent is not particularly limited, but is, for example, 14.5 $MPa^{1/2}$ or more.

Among these, from the viewpoint that the effect of the present invention is superior, a hydrocarbon-based solvent or an ether-based solvent having an SP value of 16.3 $MPa^{1/2}$ or less is preferable, and a hydrocarbon-based solvent having an SP value of 16.3 $MPa^{1/2}$ or less is more preferable.

In addition, the SP value of the first organic solvent is preferably 16.0 $MPa^{1/2}$ or less, and more preferably in the range from 15.0 to 16.0 $MPa^{1/2}$. By setting the SP value to this range, the omission failure of C/H can also be further improved.

From the viewpoint of an effect that the occurrence of pattern collapse in a resist L/S pattern and the occurrence of omission failure in a resist C/H pattern can be simultaneously suppressed (hereinafter also referred to as "the effect of the present invention") is superior, the a relative dielectric constant of the first organic solvent having an SP value of 16.3 MPa$^{1/2}$ or less is preferably 4.0 or less, more preferably 3.0 or less, and still more preferably 2.5 or less.

In addition, as the "relative dielectric constant", the relative dielectric constant (usually a value at a temperature of 20° C.) described in "Handbook of Organic Solvent Properties, Ian M. Smallwood, 1996, Elsevier" and "CRC Handbook of Chemistry and Physics, 96th Edition, William M. Haynes, 2015, CRC Press" is used.

Examples of the hydrocarbon-based solvent are shown below. The numbers in the parentheses represent SP values.

Aliphatic hydrocarbon-based solvents such as pentane (14.5), hexane (14.9), heptane (15.2), octane (15.5), nonane (15.7), decane (15.8), undecane (16.0), dodecane (16.1), hexadecane (16.2), 2,2,4-trimethylpentane (14.3), 2,2,3-trimethylhexane (14.6), isohexane (14.4), isoheptane (14.8), isooctane (15.1), isodecane (15.5), isododecane (14.7), and isohexadecane (15.0), and unsaturated hydrocarbon-based solvents such as octene (15.6), nonene (15.8), decene (16.0), undecene (16.1), and dodecene (16.2).

The number of the double bonds and the triple bonds contained in the unsaturated hydrocarbon solvent is not particularly limited, and the double bonds and the triple bonds may be contained in any of positions in the hydrocarbon chain (provided that the above-mentioned values represent cases where the first position of the carbon atoms is substituted with a double bond). Further, in a case where the unsaturated hydrocarbon solvent has a double bond, cis isomers and trans isomers may coexist.

The aliphatic hydrocarbon-based solvent which is a hydrocarbon-based solvent may be a mixture of compounds having the same number of carbon atoms and different structures as long as the SP values are within the ranges. For example, in a case where decane is used as the aliphatic hydrocarbon-based solvent, 2-methylnonane (15.5), 2,2-dimethyloctane (15.2), 4-ethyloctane (15.5), and the like, which are compounds having the same number of carbon atoms and different structures, may be included in the aliphatic hydrocarbon-based solvent.

Furthermore, one kind or a plurality of kinds of the compounds having the same number of carbon atoms and different structures may be included.

The upper limit value of the number of carbon atoms of the aliphatic hydrocarbon-based solvent is not particularly limited, but is may be, for example, 16 or less, preferably 14 or less, and more preferably 12 or less.

Among the aliphatic hydrocarbon-based solvents, decane (15.8), undecane (16.0), or isodecane (15.5) is preferable, and undecane (16.0) is more preferable.

Examples of the ether solvent are shown below. The numbers in the parentheses represent SP values.

For example, acyclic aliphatic ether-based solvents such as dipentyl ether (16.2), dibutyl ether (15.9), and dipropyl ether (15.5), and acyclic aliphatic ether-based solvents having a branched alkyl group, such as di-2-ethylhexyl ether (15.9), diisopentyl ether (15.6), diisobutyl ether (15.2), diisopropyl ether (14.6), diisohexyl ether (15.6), ethylisopentyl ether (15.4), propylisopentyl ether (15.6), methylisobutyl ether (14.7), ethylisobutyl ether (15.1), propylisobutyl ether (15.4), and ethylisopropyl ether (14.7).

Diisobutyl ether (15.2) or diisopentyl ether (15.6) is particularly preferable.

The treatment liquid of the present invention preferably includes a hydrocarbon-based solvent having 10 or more carbon atoms, and more preferably includes undecane (16.0), as the first organic solvent, from the viewpoint that a superior effect of the present invention is obtained.

<Second Organic Solvent Having SP Value of 17.1 MPa$^{1/2}$ or More>

The second organic solvent having an SP value of 17.1 MPa$^{1/2}$ or more is selected from various organic solvents, but for example, a ketone-based solvent, an ester-based solvent, an alcohol-based solvent, an amide-based solvent, an ether-based solvent, or a hydrocarbon-based solvent can be used. The upper limit of the SP value of the second organic solvent is not particularly limited, but is, for example, 27.0 MPa$^{1/2}$ or less.

Among these, a ketone-based solvent or an ester-based solvent having an SP value of 17.1 MPa$^{1/2}$ or more is preferable and a ketone-based solvent having an SP value of 17.1 MPa$^{1/2}$ or more is more preferable.

In addition, the SP value of the second organic solvent is preferably 17.1 to 23.0 MPa$^{1/2}$, more preferably 17.1 to 20.0 MPa$^{1/2}$, and still more preferably 17.1 to 18.1 MPa$^{1/2}$. By setting the SP value to these ranges, the pattern collapse of L/S can also be further improved.

From the viewpoint that the effect of the present invention is superior, the relative dielectric constant of the second organic solvent having an SP value of 17.1 MPa$^{1/2}$ or more is preferably 6.0 or more, more preferably from 6 to 20, still more preferably from 6 to 14, and even still more preferably from 6 to 10.

Moreover, in the present invention, the ester-based solvent refers to a solvent having an ester group in a molecule thereof, the ketone-based solvent refers to a solvent having a ketone group in a molecule thereof, the alcohol-based solvent refers to a solvent having an alcoholic hydroxyl group in a molecule thereof, the amide-based solvent refers to a solvent having an amide group in a molecule thereof, and the ether-based solvent refers to a solvent having an ether bond in a molecule thereof. Among these, a solvent having a plurality of kinds of functional groups in one molecule thereof, but in this case, the solvent is intended to correspond to any of solvents including the functional groups contained in the above-mentioned solvent. For example, diethylene glycol monomethyl ether is intended to correspond to any of the alcohol-based solvent and the ether-based solvent among the solvents.

Examples of an organic solvent which can be used as the second organic solvent are shown, but the present invention is not limited thereto. The numbers in the parentheses represent SP values.

Examples of the ester-based solvent include methyl acetate (18.0), ethyl acetate (17.9), butyl acetate (17.8), isobutyl acetate (17.4), amyl acetate (pentyl acetate) (17.8), propyl acetate (17.8), isopropyl acetate (17.4), isoamyl acetate (isopentyl acetate, 3-methylbutyl acetate) (17.4), 2-methylbutyl acetate (17.4), 1-methylbutyl acetate (17.4), hexyl acetate (17.8), heptyl acetate (17.7), octyl acetate (17.7), ethyl methoxyacetate (18.3), ethyl ethoxyacetate (18.2), propylene glycol monomethyl ether acetate (PG-MEA; alternative name: 1-methoxy-2-acetoxypropane) (17.9), ethylene glycol monoethyl ether acetate (18.2), ethylene glycol monopropyl ether acetate (18.2), ethylene glycol monobutyl ether acetate (18.1), ethylene glycol monophenyl ether acetate (18.4), diethylene glycol monomethyl ether acetate (18.5), diethylene glycol monopropyl ether acetate (18.4), diethylene glycol monoethyl ether acetate (18.4), diethylene glycol monophenyl ether acetate (20.4), diethylene glycol monobutyl ether acetate (18.3), 2-methoxybutyl acetate (17.8), 3-methoxybutyl acetate (17.8), 4-methoxybutyl acetate (18.2), 3-methyl-3-methoxybutyl acetate (17.5), 3-ethyl-3-methoxybutyl acetate (18.1), propylene glycol monoethyl ether acetate (17.8), propylene glycol monopropyl ether acetate (17.8), 2-ethoxybutyl acetate (17.8), 4-ethoxybutyl acetate (18.1), 4-propoxybutyl acetate (18.1), 2-methoxypentyl acetate (17.8), 3-methoxypentyl acetate (17.8), 4-methoxypentyl acetate (17.8), propylene glycol diacetate (19.6), methyl formate (21.0), ethyl formate (20.2), butyl formate (19.4), propyl formate (19.7), lactic acid ethyl (24.4), lactic acid butyl (23.0), propyl lactate (23.6), ethylmethyl carbonate (18.5), methylpropyl carbonate (18.3), methylbutyl carbonate (18.2), methyl pyruvate (21.6), ethyl pyruvate (21.1), propyl pyruvate (20.7), butyl pyruvate (20.3), methyl acetoacetate (21.1), ethyl acetoacetate (20.7), methyl propionate (17.9), ethyl propionate (17.8), propyl propionate (17.8), isopropyl propionate (17.4), butyl propionate (17.8), pentyl propionate (17.8), hexyl propionate (17.7), heptyl propionate (17.7), butyl butanoate (17.8), isopropyl butanoate (17.4), isobutyl butanoate (17.4), pentyl butanoate (17.7), hexyl butanoate (17.7), propyl pentanoate (17.8), isopropyl pentanoate (17.4), butyl pentanoate (17.7), pentyl pentanoate (17.7), ethyl hexanoate (17.8), propyl hexanoate (17.7), butyl hexanoate (17.7), isobutyl hexanoate (17.5), methyl heptanoate (17.8), ethyl heptanoate (17.7), propyl heptanoate (17.7), cyclohexyl acetate (19.7), cycloheptyl acetate (19.5), 2-ethylhexyl acetate (17.5), and cyclopentyl propionate (26.3).

Among these, butyl acetate (17.8), amyl acetate (17.8), isoamyl acetate (17.4), 2-methylbutyl acetate (17.4), 1-methylbutyl acetate (17.4), hexyl acetate (17.8), pentyl propionate (17.8), hexyl propionate (17.7), heptyl propionate (17.7), butyl butanoate (17.8), or isobutyl isobutanoate (17.1) is preferable, and isoamyl acetate (17.4) is more preferable.

Examples of the ketone-based solvent include 2 2-octanone (18.0), 3-octanone (18.0), 4-octanone (18.0), 2-nonanone (18.0), 3-nonanone (18.0), 4-nonanone (18.0), 5-nonanone (18.0), acetone (18.6), 2-heptanone (18.1), 3-heptanone (18.1), 4-heptanone (18.1), 2-hexanone (18.2), 3-hexanone (18.2), diisobutyl ketone (17.4), diisopentyl ketone (17.4), diisohexyl ketone (17.4), diisoheptyl ketone (17.4), ethyl isobutyl ketone (17.7), methyl isopentyl ketone (17.7), ethyl isopentyl ketone (17.7), propyl isopentyl ketone (17.7), propyl isobutyl ketone (17.7), 3-methyl-2-butanone (17.8), 3,3-dimethyl-2-butanone (17.3), cyclohexanone (20.0), cyclopentanone (20.5), 3-methylcyclohexanone (19.4), 4-methylcyclohexanone (19.4), phenylacetone (21.2), methyl ethyl ketone (18.4), methyl isobutyl ketone (17.8), acetylacetone (21.7), acetonyl acetone (21.2), diacetonyl alcohol (23.9), acetylmethyl carbinol (26.3), acetophenone (21.6), isophorone (17.6), propylene carbonate (23.6), and γ-butyrolactone (23.8).

Among these, from the viewpoint that the effect of the present invention is superior, an acyclic ketone-based solvent (acyclic ketone) is preferable, 2-octanone (18.0), 3-octanone (18.0), 4-octanone (18.0), 2-nonanone (18.0), 3-nonanone (18.0), 4-nonanone (18.0), 5-nonanone (18.0), 2-heptanone (18.1), 3-heptanone (18.1), 4-heptanone (18.1), diisobutyl ketone (17.4), diisopentyl ketone (17.4), diisohexyl ketone (17.4), or diisoheptyl ketone (17.4) is more preferable, diisobutyl ketone (17.4), diisopentyl ketone (17.4), diisohexyl ketone (17.4), diisoheptyl ketone (17.4), 4-heptanone (18.1), or 5-nonanone (18.0) is still more preferable, and diisobutyl ketone (17.4) is particularly preferable.

As the alcohol-based solvent, for example, alcohols (monovalent alcohols) such as methanol (28.2), ethanol (25.7), 1-propanol (24.2), isopropanol (23.7), 1-butanol (23.2), 2-butanol (22.7), 3-methyl-1-butanol (22.0), tert-butyl alcohol (22.3), 1-pentanol (22.4), 2-pentanol (22.0), 1-hexanol (21.9), 1-heptanol (21.4), 1-octanol (21.0), 1-decanol (20.5), 2-hexanol (21.5), 2-heptanol (21.1), 2-octanol (20.7), 3-hexanol (21.5), 3-heptanol (21.1), 3-octanol (20.7), 4-octanol (20.7), 3-methyl-3-pentanol (21.2), cyclopentanol (24.5), 2,3-dimethyl-2-butanol (20.8), 3,3-dimethyl-2-butanol (20.8), 2-methyl-2-pentanol (21.2), 2-methyl-3-pentanol (20.1), 3-methyl-2-pentanol (20.1), 3-methyl-3-pentanol (21.2), 4-methyl-2-pentanol (21.2), cyclohexanol (23.6), 5-methyl-2-hexanol (20.8), 4-methyl-2-hexanol (20.8), 4,5-dimethyl-2-hexanol (20.2), 6-methyl-2-heptanol (20.5), 7-methyl-2-octanol (20.2), 8-methyl-2-nonal (20.0), 9-methyl-2-decanol (19.8), and 3-methoxy-1-butanol (22.3), glycol-based solvents such as ethylene glycol (36.5), diethylene glycol (30.6), and triethylene glycol (27.8), and glycol ether-based solvents containing a hydroxyl group, such as ethylene glycol monomethyl ether (24.5), propylene glycol monomethyl ether (PGME; alternative name: 1-methoxy-2-propanol) (23.0), diethylene glycol monomethyl ether (23.0), triethylene glycol monoethyl ether (21.7), 3-methoxy3-methylbutanol (21.5), ethylene glycol monoethyl ether (23.5), ethylene glycol monopropyl ether (22.7), ethylene glycol monobutyl ether (22.1), propylene glycol monoethyl ether (22.3), propylene glycol monopropyl ether (21.8), propylene glycol monobutyl ether (21.4), and propylene glycol monophenyl ether (24.2).

Among these, the glycol ether-based solvents are preferably used.

Examples of the ether-based solvent include aromatic ether-based solvents such as anisole (19.2) and phenethol (19.0), and alicyclic ether-based solvents such as tetrahydrofuran (18.4), tetrahydropyran (18.2), and 1,4-dioxane. Among these, the glycol ether-based solvents or the aromatic ether-based solvents such as anisole are preferable.

As the amide-based solvent, N-methyl-2-pyrrolidone (22.2), N,N-dimethylacetamide (18.7), N,N-dimethylpropioamide (18.5), N,N-dimethylformamide (21.2), or the like can be used.

Examples of the hydrocarbon-based solvent include aliphatic hydrocarbon-based solvents such as cyclohexane (17.5), cycloheptane (17.5), and cyclooctane (17.5), and aromatic hydrocarbon-based solvents such as toluene (18.7), xylene (18.6), ethylbenzene (18.5), propylbenzene (18.4), 1-methyl-4-propylbenzene (18.4), diethylbenzene (18.4), and trimethylbenzene (18.6).

The contents of the first organic solvent and the second organic solvent are not particularly limited, but the content of the first organic solvent is usually 10% to 95% by mass, preferably 20% to 95% by mass, more preferably 30% to 80% by mass, and still more preferably 50% to 80% by mass, with respect to the total mass of the treatment liquid.

Furthermore, the content of the second organic solvent is usually 5% to 95% by mass, preferably 10% to 70% by mass, and still more preferably 10% to 60% by mass, with respect to the total mass of the treatment liquid.

The mass ratio of the first organic solvent to the second organic solvent (first organic solvent/second organic solvent) is not particularly limited, but is preferably 0.25 to 9, and more preferably 0.4 to 3.

The treatment liquid of the present invention may include the following ionic liquids. Further, it is noted that in a case where the treatment liquid includes an ionic liquid, the ionic liquid is not included as an organic solvent (in other words, not included in the first and second organic solvents).

As the ionic liquid, for example, an ionic liquid which has an aromatic ion such as a pyridinium ion and an imidazolium ion, an aliphatic amine type ion such as a trimethyl hexyl ammonium ion, or the like as a cation, and an inorganic ion such as $NO_3^-$, $CH_3CO_2^-$, $BF_6^-$, and $PF_6^-$, a fluorine-containing organic anion such as $(CF_3SO_2)_2N^-$, $CF_3CO_2^-$, or $CF_3SO_2^-$, and the like as an anion; or a quaternary ammonium salt-based ionic liquid is preferably used.

Examples of commercially available products of the ionic liquid include IL-P14 and IL-A2 (both manufactured by Koei Chemical Co., Ltd.); and ELEGAN SS-100 (manufactured by NOF Corporation) which is a quaternary ammonium salt-based ionic liquid. The ionic liquids are used singly or in combination of two or more kinds thereof.

The content of the ionic liquid is not particularly limited, but in a case where the ionic liquid is contained, the content is preferably 0.5% to 15% by mass, more preferably 1% to 10% by mass, and still more preferably 1% to 5% by mass, with respect to the total mass of the treatment liquid.

The treatment liquid of the present invention may include, as an organic solvent, at least one of each of the first organic solvent having an SP value of 16.3 $MPa^{1/2}$ or less and the second organic solvent having an SP value of 17.1 $MPa^{1/2}$ or more as described above, may include a plurality of these organic solvents, or may also include components to be added, such as organic solvents (for example, other organic solvents having an SP value not satisfying the above-mentioned range) or ionic liquids.

Furthermore, the treatment liquid may contain water, but in particular, the moisture content in the rinsing liquid is usually 60% by mass or less, preferably 30% by mass or less, still more preferably 10% by mass or less, and most preferably 5% by mass or less. By setting the moisture content to 60% by mass or less, good rinsing characteristics can be obtained.

As described above, the treatment liquid of the present invention may be used in both of a developer and a rinsing liquid as a washing liquid, but is preferably used in the rinsing liquid.

In a case where the treatment liquid of the present invention is used as the rinsing liquid in the formation of a pattern, the developer is not particularly limited, and the treatment liquid of the present invention, or a developer (particularly preferably an ester-based solvent) which can be used in combination with the treatment liquid of the present invention, which will be described later, is preferably used.

In addition, in a case where the treatment liquid of the present invention is used as the developer in the formation of a pattern, the rinsing liquid is not particularly limited, and the treatment liquid of the present invention, or a rinsing liquid which can be used in combination with the treatment liquid of the present invention, which will be described later, is preferably used.

Hereinafter, the developer or the rinsing liquid which can be used in combination with the treatment liquid of the present invention will be described in detail.

Furthermore, an organic solvent used in the developer and an organic solvent used in the rinsing liquid, which will be shown below, are also organic solvents (organic solvents having SP values not satisfying the above-mentioned range) which can be used in combination with the first organic solvent and the second organic solvent, in each of the liquids selected from the developer and the rinsing liquid. In other words, the developer can be prepared as a liquid containing both of the first organic solvent and the second organic solvent as described above, and an organic solvent used in the developer as shown below. Further, the rinsing liquid can also be prepared as a liquid containing both of the first organic solvent and the second organic solvent as described above, and an organic solvent used in the rinsing liquid as shown below. In addition, among the organic solvents shown below, an organic solvent having an SP value within the above-mentioned range (in other words, an organic solvent having an SP value of 16.3 $MPa^{1/2}$ or less, or an organic solvent having an SP value of 17.1 $MPa^{1/2}$ or more) is also included, but it is noted that the organic solvent having an SP value within the above-mentioned range corresponds to any one of the first organic solvent and the second organic solvent. That is, in a case where the developer and the rinsing liquid contain other organic solvents, in addition to the first organic solvent and the second organic solvent, such the other organic solvents are selected from the organic solvents having an SP value not satisfying the above-mentioned range as described below.

<Developer which can be Used in Combination with Treatment Liquid of Present Invention, or Organic Solvent Used in Developer>

The vapor pressure of the organic solvent used in the developer (in the case of a mixed solvent, the total vapor pressure) is preferably 5 kPa or less, more preferably 3 kPa or less, and particularly preferably 2 kPa or less, at 20° C. By adjusting the vapor pressure of the organic solvent to 5 kPa or less, the evaporation of the developer on a substrate or in a developing cup is suppressed, the temperature uniformity in the wafer surface is improved, and as a result, the dimensional uniformity within a wafer surface is improved.

As the organic solvent used in the developer, various organic solvents are widely used, and for example, solvents such as an ester-based solvent, a ketone-based solvent, an alcohol-based solvent, an amide-based solvent, an ether-based solvent, and a hydrocarbon-based solvent can be used.

The developer preferably contains, among those, at least one solvent selected from a ketone-based solvent, an ester-based solvent, an alcohol-based solvent, and an ether-based solvent.

Examples of the ester-based solvent include methyl acetate, ethyl acetate, butyl acetate, isobutyl acetate, propyl acetate, isopropyl acetate, amyl acetate (pentyl acetate), isoamyl acetate (isopentyl acetate, 3-methylbutyl acetate), 2-methylbutyl acetate, 1-methylbutyl acetate, hexyl acetate, isohexyl acetate, heptyl acetate, octyl acetate, ethyl methoxyacetate, ethyl ethoxyacetate, propylene glycol monomethyl ether acetate (PGMEA; alternative name: 1-methoxy-2-acetoxy propane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monoethyl ether acetate, propylene glycol propyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, butyl propionate, pentyl propionate, hexyl propionate, heptyl propionate, butyl butanoate, butyl isobutanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, butyl acetate, amyl acetate, isoamyl acetate, 2-methylbutyl acetate, 1-methylbutyl acetate, hexyl acetate, pentyl propionate, hexyl propionate, heptyl propionate, or butyl butanoate is preferably used, and isoamyl acetate is particularly preferably used.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, and γ-butyrolactone, and among these, 2-heptanone is preferable.

Examples of the alcohol-based solvent include alcohols (monovalent alcohols) such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, 9-methyl-2-decanol, and 3-methoxy-1-butanol; glycol-based solvents such as ethylene glycol, diethylene glycol, and triethylene glycol; and glycol ether-based solvents having a hydroxyl group, such as ethylene glycol monomethyl ether, propylene glycol monomethyl ether (PGME; alternative name: 1-methoxy-2-propanol), diethylene glycol monomethyl ether, triethylene glycol monoethyl ether, methoxymethylbutanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, and propylene glycol monophenyl ether. Among these, the glycol ether-based solvents are preferably used.

Examples of the ether-based solvent include, in addition to the glycol ether-based solvents having a hydroxyl group, glycol ether-based solvents having no hydroxyl group, such as propylene glycol dimethyl ether, propylene glycol diethyl ether, diethylene glycol dimethyl ether, and diethylene glycol diethyl ether; aromatic ether solvents such as anisole and phenetole; and dioxane, tetrahydrofuran, tetrahydropyran, perfluoro-2-butyl tetrahydrofuran, perfluoro tetrahydrofuran, 1,4-dioxane, and isopropyl ether. Among these, the glycol ether-based solvents or the aromatic ether-based solvents such as anisole are preferable.

Examples of the amide-based solvent include N-methyl-2-pyrrolidone, N,N-dimethylacetamide, N,N-dimethylformamide, hexamethylphosphoric amide, and 1,3-dimethyl-2-imidazolidinone.

Examples of the hydrocarbon-based solvent include aliphatic hydrocarbon-based solvents such as pentane, hexane, octane, nonane, decane, dodecane, undecane, hexadecane, 2,2,4-trimethylpentane, 2,2,3-trimethylhexane, perfluorohexane, and perfluoroheptane; and aromatic hydrocarbon-based solvents such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, and dipropylbenzene.

In addition, as the hydrocarbon-based solvent, an unsaturated hydrocarbon-based solvent can also be used, and examples thereof include unsaturated hydrocarbon-based solvents such as octene, nonene, decene, undecene, dodecene, and hexadecene. The number of double bonds or triple bonds contained in the unsaturated hydrocarbon solvent is not particularly limited, and a hydrocarbon chain may be present at an arbitrary position. In addition, in a case where the unsaturated hydrocarbon solvent has a double bond, cis isomers and trans isomers may coexist.

Moreover, the aliphatic hydrocarbon-based solvent which is the hydrocarbon-based solvent may be a mixture of compounds having the same number of carbon atoms and different structures. For example, in a case where decane is used as the aliphatic hydrocarbon-based solvent, the aliphatic hydrocarbon-based solvent may include compounds having the same number of carbon atoms and different structures such as 2-methylnonane, 2,2-dimethyloctane, 4-ethyloctane, and isooctane.

In addition, as the compounds having the same number of carbon atoms and different structures, one kind may be included, and a plurality of kinds may be included.

In a case where extreme ultraviolet (EUV) light or electron beams (EB) are used in an exposing step which will be described below, from the viewpoint that the swelling of a resist film can be suppressed, an ester solvent having 6 or more carbon atoms (preferably 6 to 14 carbon atoms, more preferably 6 to 12 carbon atoms, and still more preferably 6 to 10 carbon atoms) and having 2 or less heteroatoms is preferably used in the developer.

The heteroatom of the ester-based solvent is an atom other than a carbon atom and a hydrogen atom, and examples thereof include an oxygen atom, a nitrogen atom, and a sulfur atom. The number of heteroatoms is preferably 2 or less.

As a preferred example of the ester-based solvent having 6 or more carbon atoms and 2 or less heteroatom, at least one selected from butyl acetate, amyl acetate, isoamyl acetate, 2-methylbutyl acetate, 1-methylbutyl acetate, hexyl acetate, pentyl propionate, hexyl propionate, heptyl propionate, butyl butanoate, and butyl isobutanoate is preferable, and isoamyl acetate or butyl isobutanoate is more preferable.

In a case where extreme ultraviolet (EUV) light or electron beams (EB) are used in an exposing step which will be described below, a mixed solvent of the ester-based solvent and the hydrocarbon-based solvent or a mixed solvent of the ketone-based solvent and the hydrocarbon solvent may be used, instead of the ester-based solvent having 6 or more carbon atoms and having 2 or less heteroatoms, in the developer. Even in this case, the use of the solvents is effective for suppression of the swelling of a resist film.

In a case where the ester-based solvent and the hydrocarbon-based solvent are used in combination, it is preferable that isoamyl acetate is used as the ester-based solvent. In addition, it is preferable that a saturated hydrocarbon solvent (for example, octane, nonane, decane, dodecane, undecane, and hexadecane) is used as the hydrocarbon-based solvent from the viewpoint of adjusting the solubility of a resist film.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, 2,5-dimethyl-4-hexanone, cyclohexanone, methylcyclohexanone, phenylacetone, methyl ethyl ketone, methylisobutyl ketone, acetylacetone, acetonyl acetone, ionone, diacetonyl alcohol, acetyl carbinol, acetophenone, methyl naphthyl ketone, isophorone, and propylene carbonate, and diisobutyl ketone or 2,5-dimethyl-4-hexanone is preferably used.

In a case where the above-mentioned mixed solvent is used, the content of the hydrocarbon-based solvent depends on the solvent solubility of a resist film. Therefore, the content of the hydrocarbon-based solvent is not particularly limited, and may be appropriately adjusted to be a necessary content.

A plurality of the above-mentioned organic solvents may be mixed, or the solvent may be used in combination with a solvent other than the above-mentioned solvents or with water. Here, in order to exhibit the effects of the present invention sufficiently, the moisture content of the entirety of the developer is preferably less than 10% by mass, and the developer more preferably substantially does not contain moisture.

The concentration of the organic solvent (a sum total content in a case where a plurality of solvents are mixed together) in the developer is preferably 50% by mass or more, more preferably 85% % by mass or more, still preferably 90% by mass or more, and particularly preferably 95% by mass or more, and a case where the developer is formed of substantially only an organic solvent is the most preferable. Moreover, a case where the developer is formed of substantially only an organic solvent includes a case where components such as trace amounts of a surfactant, an antioxidant, a stabilizer, and an anti-foaming agent are contained in a case where the developer is contained in the amount of 100% by mass.

Moreover, suitable examples of the organic solvent used in the developer also include, in addition to the above-mentioned ester-based solvents, an ester-based solvent represented by General Formula (S1) or General Formula (S2), which will be described later. As the ester-based solvent, the solvent represented by General Formula (S1) is preferably used among the ester-based solvents represented by General Formula (S1) or General Formula (S2), alkyl acetate is still more preferable, and butyl acetate, amyl acetate (pentyl acetate), or isoamyl acetate (isopentyl acetate) is still more preferable.

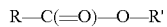  General Formula (S1)

In General Formula (S1), R and R' each independently represent a hydrogen atom, an alkyl group, a cycloalkyl group, an alkoxyl group, an alkoxycarbonyl group, a carboxyl group, a hydroxyl group, a cyano group, or a halogen atom. R and R' may be bonded to each other to form a ring.

The number of carbon atoms in the alkyl group, the alkoxyl group, and the alkoxycarbonyl group represented by R and R' is preferably 1 to 15, and the number of carbon atoms in the cycloalkyl group represented by R and R' is preferably 3 to 15. As R and R', a hydrogen atom or an alkyl group is preferable. The alkyl group, the cycloalkyl group, the alkoxyl group, and the alkoxycarbonyl group for R and R', and a ring which is formed by R and R' being bonded to each other may be substituted with a hydroxyl group, a group (for example, an acyl group, an aldehyde group, or an alkoxycarbonyl group) including a carbonyl group, or a cyano group.

Examples of the solvent represented by General Formula (S1) include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, and ethyl 2-hydroxypropionate.

Among these, it is preferable that R and R' are each an unsubstituted alkyl group.

As the solvent represented by General Formula (S1), alkyl acetate is preferable, butyl acetate, amyl acetate (pentyl acetate), or isoamyl acetate (isopentyl acetate) is more preferable, and isoamyl acetate is still more preferable.

The solvent represented by General Formula (S1) may be used in combination with one or more other organic solvents. The solvent to be combined is not particularly limited as long as it can be mixed with the solvent represented by General Formula (S1) without being separated therefrom. A combination of the solvents represented by General Formula (S1) may be used, or a mixture of the solvent represented by General Formula (S1) and a solvent selected from the group consisting of other ester-based solvents, ketone-based solvents, alcohol-based solvents, amide-based solvents, ether-based solvents, and hydrocarbon-based solvents may be used. As the solvent to be combined, one or more kinds may be used, but one kind is preferably used from the viewpoint of obtaining stable performance. In a case where a mixture of the solvent represented by General Formula (S1) and one solvent to be combined is used, a mixing ratio of the solvent represented by General Formula (S1) to the solvent to be combined is usually 20:80 to 99:1, preferably 50:50 to 97:3, more preferably 60:40 to 95:5, and most preferably 60:40 to 90:10 in terms of a mass ratio.

As the organic solvent used in the developer, a glycol ether-based solvent may be used. As the glycol ether-based solvent, a solvent represented by General Formula (S2) may be used.

  General Formula (S2)

In General Formula (S2),

R" and R"" each independently represent a hydrogen atom, an alkyl group, a cycloalkyl group, an alkoxyl group, an alkoxycarbonyl group, a carboxyl group, a hydroxyl group, a cyano group, or a halogen atom. R" and R"" may be bonded to each other to form a ring.

R" and R"" are each preferably a hydrogen atom or an alkyl group. The number of carbon atoms in the alkyl group, the alkoxyl group, and the alkoxycarbonyl group for R" and R"" is preferably in the range of 1 to 15, and the number of carbon atoms in the cycloalkyl group represented by R" and R"" is preferably 3 to 15.

R"' represents an alkylene group or a cycloalkylene group. R"' is preferably an alkylene group. The number of carbon atoms in the alkylene group for R"' is preferably in the range of 1 to 10, and the number of carbon atoms in the cycloalkylene group is preferably in the range of 3 to 10.

The alkyl group, the cycloalkyl group, the alkoxyl group, or the alkoxycarbonyl group for R" and R"", the alkylene group or the cycloalkylene group for R"', and a ring which is formed by R" and R"" being bonded to each other may be substituted with a hydroxyl group, a group (for example, an acyl group, an aldehyde group, and an alkoxycarbonyl group) including a carbonyl group, or a cyano group.

In General Formula (S2), the alkylene group for R'" may have an ether bond in an alkylene chain.

Examples of the solvent represented by General Formula (S2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol propyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxy butyl acetate, 3-methoxy butyl acetate, 4-methoxy butyl acetate, 3-methyl-3-methoxy butyl acetate, 3-ethyl-3-methoxy butyl acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, and 4-methyl-4-methoxy pentyl acetate, with propylene glycol monomethyl ether acetate being preferable.

Among these, it is preferable that R" and R"" are each an unsubstituted alkyl group, and R'" is an unsubstituted alkylene group, it is more preferable that R" and R"" are each a methyl group or an ethyl group, and it is still more preferable that R" and R"" are each a methyl group.

The solvent represented by General Formula (S2) may be used in combination with one or more other organic solvents. The solvent to be combined is not particularly limited as long as it can be mixed with the solvent represented by General Formula (S2) without being separated therefrom. A combination of the solvents represented by General Formula (S2) may be used, or a mixture of the solvent represented by General Formula (S2) and a solvent selected from the group consisting of other ester-based solvents, ketone-based solvents, alcohol-based solvents, amide-based solvents, ether-based solvents, and hydrocarbon-based solvents may be used. As the solvent to be combined, one or more kinds may be used, but one kind is preferably used from the viewpoint of obtaining stable performance. In a case where a mixture of the solvent represented by General Formula (S2) and one solvent to be combined is used, the mixing ratio of the solvent represented by General Formula (S2) to the solvent to be combined is usually 20:80 to 99:1, preferably 50:50 to 97:3, more preferably 60:40 to 95:5, and most preferably 60:40 to 90:10 in terms of a mass ratio.

In addition, suitable examples of the organic solvent used in the developer also include, in addition to the above-mentioned ether-based solvents, an ether-based solvent having one or more aromatic rings. Among those, a solvent represented by General Formula (S3) is preferable, and anisole is more preferable.

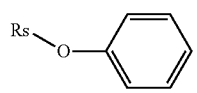
(S3)

In General Formula (S3), $R_S$ represents an alkyl group. As the alkyl group, an alkyl group having 1 to 4 carbon atoms is preferable, a methyl group or an ethyl group is more preferable, and a methyl group is still more preferable.

As the organic solvent included in the developer, an organic solvent used in an actinic ray-sensitive or radiation-sensitive resin composition which will be described later can be used.

<Rinsing Liquid which can be Used in Combination with Treatment Liquid of Present Invention, or Organic Solvent Used in Rinsing Liquid>

The vapor pressure of the organic solvent used in the rinsing liquid (in the case of a mixed solvent, the total vapor pressure) is preferably from 0.05 kPa to 5 kPa, more preferably from 0.1 kPa to 5 kPa, and still more preferably from 0.12 kPa to 3 kPa, at 20° C. By adjusting the vapor pressure of the rinsing liquid to from 0.05 kPa to 5 kPa, the temperature uniformity in the wafer surface is improved, the swelling caused by the penetration of the rinsing liquid is also suppressed, and thus, the dimensional uniformity within a wafer surface is improved.

As the organic solvent included in the rinsing liquid, various organic solvents are used, but at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of these organic solvents are the same as those of the organic solvent described above for the developer.

In a case where extreme ultraviolet (EUV) light or electron beams (EB) are used in an exposing step which will be described later, as the organic solvent included in the rinsing liquid, a hydrocarbon-based solvent is preferably used, and an aliphatic hydrocarbon-based solvent is more preferably used, among the above-mentioned organic solvents. As the aliphatic hydrocarbon-based solvent used in the rinsing liquid, from the viewpoint of further improving the effects, an aliphatic hydrocarbon-based solvent having 5 or more carbon atoms (for example, pentane, hexane, octane, decane, undecane, dodecane, and hexadecane) is preferable, an aliphatic hydrocarbon-based solvent having 8 or more carbon atoms is more preferable, and an aliphatic hydrocarbon-based solvent having 10 or more carbon atoms is still more preferable.

Incidentally, the upper limit value of the number of carbon atoms in the aliphatic hydrocarbon-based solvent is not particularly limited and, for example, is 16 or less, preferably 14 or less, and more preferably 12 or less.

Among the aliphatic hydrocarbon-based solvents, decane, undecane, or dodecane is particularly preferable, and undecane is the most preferable.

In addition, as the hydrocarbon-based solvent included in the rinsing liquid, an unsaturated hydrocarbon-based solvent can be used, and examples thereof include unsaturated hydrocarbon-based solvents such as octene, nonene, decene, undecene, dodecene, and hexadecene. The number of double bonds or triple bonds in the unsaturated hydrocarbon solvent is not particularly limited, and a hydrocarbon chain may be present at an arbitrary position. In addition, in a case where the unsaturated hydrocarbon solvent has a double bond, cis isomers and trans isomers may coexist.

By using the hydrocarbon-based solvent (in particular, the aliphatic hydrocarbon-based solvent) as the organic solvent included in the rinsing liquid, a small amount of the developer permeating into the developed resist film is rinsed, the swelling is further suppressed, and thus, an effect of suppressing pattern collapse is further exhibited.

In addition, as the organic solvent included in the rinsing liquid, a mixed solvent of the ester-based solvent and the hydrocarbon-based solvent or a mixed solvent of the ketone-based solvent and the hydrocarbon solvent may be used. It is preferable that the mixed solvent includes a hydrocarbon solvent as a major component.

Furthermore, from the viewpoint that the ester-based solvent and the ketone-based solvent are particularly effective for reducing a residue after development, at least one selected from the group consisting of the ester-based solvent and the ketone-based solvent may be used as the organic solvent included in the rinsing liquid in an embodiment.

In a case where the rinsing liquid contains at least one selected from the group consisting of the ester-based solvent and the ketone-based solvent, it is preferable that the rinsing liquid contains at least one solvent selected from the group consisting of butyl acetate, isopentyl acetate (isoamyl acetate), n-pentyl acetate, ethyl 3-ethoxypropionate (EEP), and 2-heptanone as a major component, and it is more preferable that the rinsing liquid contains at least one solvent selected from the group consisting of butyl acetate and 2-heptanone as a major component.

In addition, in a case where the rinsing liquid contains at least one selected from the group consisting of the ester-based solvent and the ketone-based solvent, it is preferable that the rinsing liquid contains a solvent selected from the group consisting of an ester-based solvent, a glycol ether-based solvent, a ketone-based solvent, and an alcohol-based solvent as a minor component, and it is more preferable that the rinsing liquid contains a solvent selected from the group consisting of propylene glycol monomethyl ether acetate (PGMEA), propylene glycol monomethyl ether (PGME), ethyl acetate, ethyl lactate, 3-methyl methoxypropionate, cyclohexanone, methyl ethyl ketone, γ-butyrolactone, propanol, 3-methoxy-1-butanol, N-methylpyrrolidone, and propylene carbonate.

In particular, in a case where an ester-based solvent is used as the organic solvent, it is preferable that two or more ester-based solvents are used in a view that the effects are further exhibited. Specific examples of the case include a case where an ester-based solvent (preferably butyl acetate) is used as a major component and another ester-based solvent having a different chemical structure (preferably propylene glycol monomethyl ether acetate (PGMEA)) is used as a minor component.

In addition, in a case where an ester-based solvent is used as the organic solvent, a glycol ether-based solvent may be used, in addition to an ester-based solvent (one kind or two or more kinds), from the viewpoint of further exhibiting the effects. Specific examples of the case include a case where an ester-based solvent (preferably butyl acetate) is used as a major component and a glycol ether-based solvent (preferably propylene glycol monomethyl ether (PGME)) is used as a minor component.

In a case where a ketone-based solvent is used as the organic solvent, an ester-based solvent and/or a glycol ether-based solvent may also be used, in addition to the (one kind or two or more kinds of) ketone-based solvent, in a view that the effects are further exhibited. Specific examples of the case include a case where a ketone-based solvent (preferably 2-heptanone) is used as a major component and an ester-based solvent (preferably, propylene glycol monomethyl ether acetate (PGMEA)) and/or a glycol ether-based solvent (preferably propylene glycol monomethyl ether (PGME)) is used as a minor component.

Here, the above-mentioned "major component" indicates that the content of the component is 50% to 100% by mass, preferably 70% to 100% by mass, more preferably 80% to 100% by mass, still more preferably 90% to 100% by mass, and particularly preferably 95% to 100% by mass, with respect to the total mass of the organic solvent.

In addition, in a case where the minor component is contained, the content of the minor component is preferably 0.1% to 20% by mass, more preferably 0.5% to 10% by mass, and still more preferably 1% to 5% by mass, with respect to the total mass (100% by mass) of the major component.

A plurality of the organic solvents may be mixed, or the solvent may be used in combination with an organic solvent other than the above-mentioned solvents. The solvent may also be mixed with water, but the moisture content in the rinsing liquid is usually 60% by mass or less, preferably 30% by mass or less, more preferably 10% by mass or less, and most preferably 5% by mass or less. By adjusting the moisture content to 60% by mass or less, excellent rinsing characteristics can be obtained.

Hereinafter, various additives which can be included in the treatment liquid of the present invention will be described in detail. Various additives shown below may certainly be included in the above-mentioned developer and/or rinsing liquid which can be used in combination with the treatment liquid of the present invention.

<Surfactant>

It is preferable that the treatment liquid contains a surfactant, which improves the wettability for a resist film and allows the development and/or the rinsing to proceed more effectively.

As the surfactant, the same one as the surfactant used in an actinic ray-sensitive or radiation-sensitive resin composition which will be described later can be used.

The content of the surfactant is usually 0.001% to 5% by mass, preferably 0.005% to 2% by mass, and still more preferably 0.01% to 0.5% by mass, with respect to the total mass of the treatment liquid.

<Antioxidant>

It is preferable that the treatment liquid contains an antioxidant, which can suppress the generation of an oxidant over time and further reduce the content of the oxidant.

Known antioxidants may be used as the antioxidant, but in a case where the antioxidant is used for semiconductor applications, an amine-based antioxidant or a phenol-based antioxidant is preferably used.

Examples of the amine-based antioxidant include a naphthylamine-based antioxidant such as 1-naphthylamine, phenyl-1-naphthylamine, p-octylphenyl-1-naphthylamine, p-nonylphenyl-1-naphthylamine, p-dodecylphenyl-1-naphthylamine, and phenyl-2-naphthylamine; a phenylenediamine-based antioxidant such as N,N'-diisopropyl-p-phenylenediamine, N,N'-diisobutyl-p-phenylenediamine, N,N'-diphenyl-p-phenylenediamine, N,N'-di-β-naphthyl-p-phenylenediamine, N-phenyl-N'-isopropyl-p-phenylenediamine, N-cyclohexyl-N'-phenyl-p-phenylenediamine, N-1,3-dimethylbutyl-N'-phenyl-p-phenylenediamine, dioctyl-p-phenylenediamine, phenylhexyl-p-phenylenediamine, and phenyloctyl-p-phenylenediamine; a diphenylamine-based antioxidant such as dipyridylamine, diphenylamine, p,p'-di-n-butyldiphenylamine, p,p'-di-t-butyldiphenylamine, p,p'-di-t-pentyldiphenylamine, p,p'-dioctyldiphenylamine, p,p'-dinonyldiphenylamine, p,p'-didecyldiphenylamine, p,p'-didodecyldiphenylamine, p,p'-distyryldiphenylamine, p,p'-dimethoxydiphenylamine, 4,4'-bis(4-α,α-dimethylbenzoyl)

diphenylamine, p-isopropoxydiphenylamine, and dipyridyl amine; and a phenothiazine-based antioxidant such as phenothiazine, N-methylphenothiazine, N-ethylphenothiazine, 3,7-dioctylphenothiazine, phenothiazine carboxylic acid ester, and phenoselenazine.

Examples of the phenol-based antioxidant include 2,6-ditertiarybutylphenol (tertiary butyl is hereinafter simply referred to as t-butyl), 2,6-di-t-butyl-p-cresol, 2,6-di-t-butyl-4-methylphenol, 2,6-di-t-butyl-4-ethylphenol, 2,4-dimethyl-6-t-butylphenol, 4,4'-methylenebis(2,6-di-t-butylphenol), 4,4'-bis(2,6-di-t-butylphenol), 4,4'-bis(2-methyl-6-t-butylphenol), 2,2'-methylenebis(4-methyl-6-t-butylphenol), 2,2'-methylenebis(4-ethyl-6-t-butylphenol), 4,4'-butylidenebis(3-methyl-6-t-butylphenol), 4,4'-isopropylidenebis(2,6-di-t-butylphenol), 2,2'-methylenebis(4-methyl-6-cyclohexylphenol), 2,2'-methylenebis(4-methyl-6-nonylphenol), 2,2'-isobutylidenebis(4,6-dimethylphenol), 2,6-bis(2'-hydroxy-3'-t-butyl-5'-methylbenzyl)-4-methylphenol, 3-t-butyl-4-hydroxyanisole, 2-t-butyl-4-hydroxyanisole, octyl 3-(4-hydroxy-3,5-di-t-butylphenyl)propionate, stearyl 3-(4-hydroxy-3,5-di-t-butylphenyl)propionate, oleyl 3-(4-hydroxy-3,5-di-t-butylphenyl)propionate, dodecyl 3-(4-hydroxy-3,5-di-t-butylphenyl)propionate, decyl 3-(4-hydroxy-3,5-di-t-butylphenyl)propionate, tetrakis {3-(4-hydroxy-3,5-di-t-butylphenyl)propionyloxymethyl}methane, 3-(4-hydroxy-3,5-di-t-butylphenyl)propionic acid glycerin monoester, an ester of 3-(4-hydroxy-3,5-di-t-butylphenyl) propionic acid and glycerin monooleyl ether, 3-(4-hydroxy-3,5-di-t-butylphenyl)propionic acid butylene glycol diester, 3-(4-hydroxy-3,5-di-t-butylphenyl)propionic acid thiodiglycol diester, 4,4'-thiobis(3-methyl-6-t-butylphenol), 4,4'-thiobis(2-methyl-6-t-butylphenol), 2,2'-thiobis(4-methyl-6-t-butylphenol), 2,6-di-t-butyl-a-dimethylamino-p-cresol, 2,6-di-t-butyl-4-(N,N'-dimethylaminomethylphenol), bis(3,5-di-t-butyl-4-hydroxybenzyl)sulfide, tris{(3,5-di-t-butyl-4-hydroxyphenyl)propionyloxyethyl}isocyanurate, tris(3,5-di-t-butyl-4-hydroxyphenyl)isocyanurate, 1,3,5-tris(3,5-di-t-butyl-4-hydroxybenzyl)isocyanurate, bis{2-methyl-4-(3-n-alkylthiopropionyloxy)-5-t-butylphenyl} sulfide, 1,3,5-tris(4-t-butyl-3-hydroxy-2,6-dimethylbenzyl)isocyanurate, tetraphthaloyl-di(2,6-dimethyl-4-t-butyl-3-hydroxybenzyl sulfide), 6-(4-hydroxy-3,5-di-t-butylanilino)-2,4-bis(octylthio)-1,3,5-triazine, 2,2-thio-{diethyl-bis-3-(3,5-di-t-butyl-4-hydroxyphenyl)}propionate, N,N'-hexamethylene bis(3,5-di-t-butyl-4-hydroxy-hydrocinnamate), 3,9-bis[1,1-dimethyl-2-{β-(3-t-butyl-4-hydroxy-5-methylphenyl) propionyloxy}ethyl]-2,4,8,10-tetraoxaspiro[5,5]undecane, 1,1,3-tris(2-methyl-4-hydroxy-5-t-butylphenyl)butane, 1,3,5-trimethyl-2,4,6-tris(3,5-di-t-butyl-4-hydroxybenzyl)benzene, and bis{3,3'-bis-(4'-hydroxy-3'-t-butylphenyl)butyric acid}glycol ester.

The content of the antioxidant is not particularly limited, but is preferably 0.0001% to 1% by mass, more preferably 0.0001% to 0.1% by mass, and still more preferably 0.0001% to 0.01% by mass, with respect to the total mass of the treatment liquid. In a case where the content of the antioxidant is 0.0001% by mass or more, a superior antioxidant effect is obtained. In a case where the content of the antioxidant is 1% by mass or less, there is a tendency that generation of the residues after development and/or rinsing can be suppressed.

<Basic Compound>

It is preferable that the treatment liquid of the present invention contains a basic compound. Specific examples of the basic compound include the compounds exemplified as a basic compound (E) which can be included in an actinic ray-sensitive or radiation-sensitive resin composition which will be described later.

Among the basic compounds which can be included in the treatment liquid of the present invention, the following nitrogen-containing compound can be preferably used.

(Nitrogen-Containing Compound)

In the case where the nitrogen-containing compound is included in the developer, the nitrogen-containing compound can interact with a polar group generated in a resist film by the action of an acid to further improve the insolubility of the exposed area in an organic solvent. Here, the interaction between the nitrogen-containing compound and the polar group refers to an action in which the nitrogen-containing compound and the polar group react to form a salt, an ionic bond, or the like.

The nitrogen-containing compound is preferably a compound represented by Formula (1).

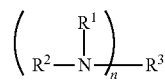

(1)

In Formula (1), $R^1$ and $R^2$ are each independently a hydrogen atom, a hydroxyl group, a formyl group, an alkoxy group, an alkoxycarbonyl group, a chained hydrocarbon group having 1 to 30 carbon atoms, an alicyclic hydrocarbon group having 3 to 30 carbon atoms, an aromatic hydrocarbon group having 6 to 14 carbon atoms, or a group formed by a combination of two or more of these groups. $R^3$ is a hydrogen atom, a hydroxyl group, a formyl group, an alkoxy group, an alkoxycarbonyl group, an n-valent chained hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group formed by a combination of two or more of these groups. n is an integer of 1 or more. However, in a case where n is 2 or more, a plurality of $R^1$'s and $R^2$'s may be respectively the same or different from one another. In addition, any two of $R^1$ to $R^3$, taken together with the nitrogen atom to which each is bonded, may form a ring structure.

Examples of the chained hydrocarbon group having 1 to 30 carbon atoms, represented by $R^1$ and $R^2$, include a methyl group, an ethyl group, an n-propyl group, an i-propyl group, an n-butyl group, a 2-methylpropyl group, a 1-methylpropyl group, and a t-butyl group.

Examples of the alicyclic hydrocarbon group having 3 to 30 carbon atoms, represented by $R^1$ and $R^2$, include a cyclopropyl group, a cyclopentyl group, a cyclohexyl group, an adamantyl group, and a norbornyl group.

Examples of the aromatic hydrocarbon group having 6 to 14 carbon atoms, represented by $R^1$ and $R^2$, include a phenyl group, a tolyl group, and a naphthyl group.

Examples of the group formed by a combination of two or more of those groups represented by $R^1$ and $R^2$ include aralkyl groups having 6 to 12 carbon atoms, such as a benzyl group, a phenethyl group, a naphthylmethyl group, and a naphthylethyl group.

Examples of the n-valent chained hydrocarbon group having 1 to 30 carbon atoms, represented by $R^3$, include groups formed by removing (n-1) hydrogen atoms from the same groups as those groups exemplified as the chained hydrocarbon group having 1 to 30 carbon atoms, represented by $R^1$ and $R^2$.

Examples of the alicyclic hydrocarbon group having 3 to 30 carbon atoms, represented by $R^3$, include groups formed by removing (n-1) hydrogen atoms from the same groups as those groups exemplified as the cyclic hydrocarbon group having 3 to 30 carbon atoms, represented by $R^1$ and $R^2$.

Examples of the aromatic hydrocarbon group having 6 to 14 carbon atoms, represented by $R^3$, include groups formed by removing (n-1) hydrogen atoms from the same groups as those groups exemplified as the aromatic hydrocarbon group having 6 to 14 carbon atoms, represented by $R^1$ and $R^2$.

Examples of the group formed by a combination of two or more of those groups represented by $R^3$ include groups formed by removing (n-1) hydrogen atoms from the same groups as those groups exemplified as the group formed by a combination of two or more of those groups represented by $R^1$ and $R^2$.

The groups represented by $R^1$ to $R^3$ may be substituted. Specific examples of the substituent include a methyl group, an ethyl group, a propyl group, an n-butyl group, a t-butyl group, a hydroxyl group, a carboxy group, a halogen atom, and an alkoxy group. Examples of the halogen atom include a fluorine atom, a chlorine atom, and a bromine atom. Examples of the alkoxy group include a methoxy group, an ethoxy group, a propoxy group, and a butoxy group.

Examples of the compound represented by Formula (1) include a (cyclo)alkylamine compound, a nitrogen-containing heterocyclic compound, an amide group-containing compound, and a urea compound.

Examples of the (cyclo)alkylamine compound include a compound having one nitrogen atom, a compound having two nitrogen atoms, and a compound having three or more nitrogen atoms.

Examples of the (cyclo)alkylamine compound having one nitrogen atom include mono(cyclo)alkylamines such as n-hexylamine, n-heptylamine, n-octylamine, n-nonylamine, 1-aminodecane, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; substituted alkylamines such as triethanolamine; and aromatic amines such as aniline, N-methylaniline, N,N-dimethylaniline, 2-methylaniline, 3-methylaniline, 4-methylaniline, N,N-dibutylaniline, 4-nitroaniline, diphenylamine, triphenylamine, naphthylamine, 2,4,6-tri-tert-butyl-N-methylaniline, N-phenyldiethanolamine, 2,6-diisopropylaniline, 2-(4-aminophenyl)-2-(3-hydroxyphenyl)propane, and 2-(4-aminophenyl)-2-(4-hydroxyphenyl)propane.

Examples of the (cyclo)alkylamine compound having two nitrogen atoms include ethylenediamine, tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolidinone, 2-quinoxalinol, and N,N,N',N'-tetrakis(2-hydroxypropyl)ethylenediamine.

Examples of the (cyclo)alkylamine compound having three or more nitrogen atoms include polymers such as polyethyleneimine, polyallylamine, and 2-dimethylaminoethylacrylamide.

Examples of the nitrogen-containing heterocyclic compound include a nitrogen-containing aromatic heterocyclic compound and a nitrogen-containing aliphatic heterocyclic compound.

Examples of the nitrogen-containing aromatic heterocyclic compound include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; and pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 4-hydroxyquinoline, 8-oxyquinoline, acridine, and 2,2':6',2''-terpyridine.

Examples of the nitrogen-containing aliphatic heterocyclic compound include piperazines such as piperazine and 1-(2-hydroxyethyl)piperazine; pyrazine, pyrazole, pyridazine, quinoxaline, purine, pyrrolidine, proline, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, and 1,4-diazabicyclo[2.2.2]octane.

Examples of the amide group-containing compound include N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonyl hexamethylenediamine, N,N,N',N'-tetra-t-butoxycarbonyl hexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, and tris(2-hydroxyethyl) isocyanurate.

Examples of the urea compound include urea, methylurea, 1,1-dimethylurea, 1,3-dimethylurea, 1,1,3,3-tetramethylurea, 1,3-diphenylurea, and tri-n-butylthiourea.

Among the above-mentioned nitrogen-containing compounds, a nitrogen-containing compound having an SP value of 18 or less is preferably used from the viewpoint of suppressing development defects. This is because the nitrogen-containing compound having an SP value of 18 or less has a good affinity with a rinsing liquid used in a rinsing process which will be described later, and is thus capable of suppressing the occurrence of development defects such as precipitation.

The SP value of the nitrogen-containing compound used in the present invention is calculated using the Fedors method described in "Properties of Polymers, $2^{nd}$ edition, 1976". The calculation formula used and the parameters of each substituent are shown below.

SP value (Fedors method)=[(Sum of cohesive energies of individual substituents)/(Sum of volumes of individual substituents)]$^{0.5}$

TABLE 1

| Substituent | Cohesive energy (J/mol) | Volume (cm³/mol) | Substituent | Cohesive energy (J/mol) | Volume (cm³/mol) |
|---|---|---|---|---|---|
| CH$_3$ | 4,710 | 33.5 | CN | 25,530 | 24 |
| CH$_2$ | 4,940 | 16.1 | OH | 29,800 | 10 |
| CH | 3,430 | −1 | CHO | 21,350 | 22.3 |
| C | 1,470 | −19.2 | COOH | 27,630 | 28.5 |
| CH$_2$= | 4,310 | 28.5 | —O— | 3,350 | 3.8 |
| =CH— | 4,310 | 13.5 | CO | 17,370 | 10.8 |
| =C< | 4,310 | −5.5 | COO | 18,000 | 18 |
| Ph | 31,940 | 71.4 | 5-Membered or higher ring | 1,050 | 16 |
| NH$_2$ | 12,560 | 19.2 | | | |
| NH | 8,370 | 4.5 | | | |
| N< | 4,190 | −9 | | | |

Fedors substituent constants extracted (Properties of Polymers, $2^{nd}$ edition, pp. 138 to 140)

Among those, preferred is a (cyclo)alkylamine compound or a nitrogen-containing aliphatic heterocyclic compound, which satisfies the above-mentioned conditions (SP value), and more preferred is 1-aminodecane, di-n-octylamine, tri-n-octylamine, or tetramethylethylenediamine. The SP values and the like of these nitrogen-containing aliphatic heterocyclic compounds are shown in the following table.

TABLE 2

| | CH$_3$ | CH$_2$ | NH$_2$ | NH | N | SP value |
|---|---|---|---|---|---|---|
| 1-Aminodecane | 1 | 9 | 1 | | | 17.7 |
| Di-n-octylamine | 2 | 14 | | 1 | | 17.1 |
| Tri-n-octylamine | 3 | 21 | | | 1 | 16.9 |
| Tetramethylethylenediamine | 4 | 2 | | | 2 | 15.8 |

The content of the basic compound (preferably the nitrogen-containing compound) in the treatment liquid is not particularly limited, but is preferably 10% by mass or less, and more preferably 0.5% to 5% by mass, with respect to the total amount of the treatment liquid, from the viewpoint that the effect of the present invention is superior.

In addition, in the present invention, the above-mentioned nitrogen-containing compounds may be used singly or two or more of the compounds having different chemical structures may be used in combination.

The above-mentioned treatment liquid can also be suitably applied to a non-chemically amplified resist for the purpose of, for example, solving the problems of the present application.

Examples of the non-chemically amplified resist include the following ones.

(1) A resist material in which a main chain is cut, the molecular weight decreases, and the solubility changes upon irradiation with a g-ray, a h-ray, an i-ray, KrF, ArF, EB, EUV, or the like (for example, a resist material including a copolymer of an a-chloroacrylate compound and an a-methylstyrene compound as a major component, which is described in paragraphs 0025 to 0029, and 0056 of JP2013-210411A and 0032 to 0036, and 0063 of US2015/0008211A).

(2) A resist material such as a hydrogen silsesquioxane resist (HSQ) and a chlorine-substituted calixarene in which a silanol condensation reaction occurs with a g-ray, a h-ray, an i-ray, KrF, ArF, EB, EUV, or the like.

(3) A resist which includes a metal complex (a complex of magnesium, chromium, manganese, iron, cobalt, nickel, copper, zinc, silver, cadmium, indium, tin, antimony, cesium, zirconium, hafnium, or the like; titanium, zirconium, or hafnium is preferable from the viewpoint of pattern formability) having an absorption to light such as a g-ray, a h-ray, an i-ray, KrF, ArF, EB, and EUV, and in which ligand disengagement or ligand exchange occurs in a case of being used in combination with a photoacid generator (for example, a resist material described in 0017 to 0033, and 0037 to 0047 of JP2015-075500A, in paragraphs 0017 to 0032, and 0043 to 0044 of JP2012-185485A, paragraphs 0042 to 0051, and 0066 of US2012/0208125A, and the like)

In addition, the above-mentioned treatment liquid can also be suitably applied to a silicon-based resist for the purpose of, for example, solving the problems of the present application.

Examples of the silicon-based resist include the resist materials described in paragraphs 0010 to 0062 and paragraphs 0129 to 0165 of JP2008-83384A.

[Pattern Forming Method]

The pattern forming method of the present invention includes a resist film forming step of forming a resist film using an actinic ray-sensitive or radiation-sensitive resin composition (hereinafter also referred to as a "resist composition"), an exposing step of exposing the resist film, and a treating step of treating the exposed resist film with the above-described treatment liquid.

According to the pattern forming method of the present invention, the above-mentioned treatment liquid is used, and therefore, it is possible to simultaneously suppress the occurrence of pattern collapse in a resist L/S pattern and the occurrence of omission failure in a resist C/H pattern.

Hereinafter, the respective steps of the pattern forming method of the present invention will be described. In addition, as an example of the treating step, each of a developing step and a rinsing step will be described.

<Resist Film Forming Step>

The resist film forming step is a step of forming a resist film using an actinic ray-sensitive or radiation-sensitive resin composition and, for example, can be carried out using the following method.

In order to form the resist film (actinic ray-sensitive or radiation-sensitive resin composition film) on the substrate using the actinic ray-sensitive or radiation-sensitive resin composition, respective components described below are dissolved in a solvent to prepare an actinic ray-sensitive or radiation-sensitive resin composition, the actinic ray-sensitive or radiation-sensitive resin composition is optionally filtered through a filter and applied to the substrate. As the filter, a polytetrafluoroethylene-, polyethylene- or nylon-made filter having a pore size of preferably 0.1 microns or less, more preferably 0.05 microns or less, and still more preferably 0.03 microns or less is preferable.

The actinic ray-sensitive or radiation-sensitive resin composition is applied to the substrate (e.g.: a silicon dioxide-coated substrate), which is used for manufacturing an integrated circuit element, using an appropriate coating method such as a method using a spinner. Next, the actinic ray-sensitive or radiation-sensitive resin composition is dried to form a resist film. Optionally, various undercoating films (an inorganic film, an organic film, or an antireflection film) may be formed below the resist film.

As the drying method, a method of drying heating the composition is generally used. Heating may be carried out using means provided in a typical exposure or developing device, and may be carried out using a hot plate or the like.

The heating temperature is preferably 80° C. to 180° C., more preferably 80° C. to 150° C., still more preferably 80° C. to 140° C., and particularly preferably 80° C. to 130° C.

The heating time is preferably 30 to 1,000 seconds, more preferably 60 to 800 seconds, and still more preferably 60 to 600 seconds.

The film thickness of the resist film is generally 200 nm or less, and preferably 100 nm or less.

For example, in order to resolve a 1:1 line-and-space pattern having a size of 30 nm or less, the film thickness of a resist film to be formed is preferably 50 nm or less. In a case where a resist film having a film thickness of 50 nm or less is applied to a developing step described below, pattern collapse is not likely to occur, and higher resolution performance can be obtained.

The film thickness is more preferably in a range of 15 nm to 45 nm. In a case where the film thickness is 15 nm or more, sufficient etching resistance is obtained. The film thickness is still more preferably is in a range of 15 nm to 40 nm. In a case where the film thickness is in the range, etching resistance and higher resolution performance can be simultaneously satisfied.

Moreover, in the pattern forming method of the present invention, an upper layer film (topcoat film) may be formed on the upper layer of the resist film. The upper layer film can be formed by using, for example, a composition for forming an upper layer film, which contains a hydrophobic resin, an acid generator, and a basic compound. The upper layer film and the composition for forming an upper layer film are the same as described later.

<Exposing Step>

The exposing step is a step of exposing the resist film and can be carried out by using the following method, for example.

The resist film formed as described above is irradiated with actinic rays or radiation through a predetermined mask. For irradiation of an electron beam, drawing (direct drawing) not using a mask is generally used. Further, a pre-exposure baking step (also referred to as post-application baking (PB; prebaking)) is preferably included after the formation of the film and before the exposing step.

The actinic rays or radiation is not particularly limited, and is, for example, KrF excimer laser, ArF excimer laser, extreme ultraviolet (EUV) light, electron beams (EB), or the like. The exposure may be liquid immersion exposure.

<Baking>

In the pattern forming method of the present invention, it is preferable that a post-exposure baking (PEB) after the exposing step and before the developing step. Due to the post-exposure baking step, a reaction of an exposed area is promoted, and the sensitivity or the pattern profile is improved.

The heating temperature is preferably 80° C. to 150° C., more preferably 80° C. to 140° C., and still more preferably 80° C. to 130° C.

The heating time is preferably 30 to 1,000 seconds, more preferably 60 to 800 seconds, and still more preferably 60 to 600 seconds.

Heating may be carried out using means provided in a typical exposure or developing device, and may be carried out using a hot plate or the like.

In addition, the heating temperature and the heating time of the above-mentioned pre-exposure baking step are the same as the heating temperature and the heating time of the above-mentioned post-exposure baking step.

<Developing Step>

The developing step is a step of developing the exposed resist film with a developer.

As a developing method, for example, a method in which a substrate is dipped in a tank filled with a developer for a certain period of time (a dip method), a method in which a developer is heaped up to the surface of a substrate by surface tension and developed by maintaining for a certain period of time (a puddle method), a method in which a developer is sprayed on the surface of a substrate (a spray method), or a method in which a developer is continuously discharged on a substrate rotated at a constant rate while scanning a developer discharging nozzle at a constant rate (a dynamic dispense method) can be applied.

In addition, a step of stopping development while replacing the solvent with another solvent may be carried out after the developing step.

The developing time is not particularly limited as long as it is a period of time where a non-exposed area of a resin is sufficiently dissolved. The development time is usually 10 to 300 seconds and preferably 20 to 120 seconds.

The temperature of the developer is preferably 0° C. to 50° C., and more preferably 15° C. to 35° C.

As the developer used in the developing step, the above-described treatment liquid is preferably used. The developer is as described above. In addition to the development using the treatment liquid, development using an alkali developer may further be carried out (so-called double development).

<Rinsing Step>

The rinsing step is a step of carrying out washing (rinsing) with a rinsing liquid after the developing step.

In the rinsing step, the developed wafer is subjected to a washing treatment using the above-described rinsing liquid.

A rinsing method is not particularly limited, and for example, a method in which a rinsing liquid is continuously discharged to a substrate which is rotating at a constant rate (a rotation discharging method), a method in which a substrate is dipped in a tank filled with a rinsing liquid for a certain period of time (a dip method), or a method in which a rinsing liquid is sprayed on the surface of a substrate (a spray method) can be applied, and among these, it is preferable that a rinsing treatment is carried out using the rotation discharging method, and the rinsed substrate is rotated at a rotation speed of 2,000 rpm to 4,000 rpm to remove the rinsing liquid from the substrate.

The rinsing time is not particularly limited, and is usually 10 seconds to 300 seconds, preferably 10 seconds to 180 seconds, and most preferably 20 seconds to 120 seconds.

The temperature of the rinsing liquid is preferably 0° C. to 50° C., and more preferably 15° C. to 35° C.

In addition, after the development treatment or the rinsing treatment, a treatment of removing the developer or the rinsing liquid which is attached to the pattern, using a supercritical fluid, may be carried out.

Incidentally, after the development treatment, the rinsing treatment, or the treatment using the supercritical fluid, a heating treatment can be carried out so as to remove the solvent remaining in the pattern. The heating temperature is not particularly limited as long as a good resist pattern is obtained, and is usually 40° C. to 160° C. The heating temperature is preferably 50° C. to 150° C., and most preferably 50° C. to 110° C. The heating time is not particularly limited as long as a good resist pattern is obtained, but is usually 15 to 300 seconds and preferably 15 to 180 seconds.

As the rinsing liquid, the above-mentioned treatment liquid is preferably used. Description on the rinsing liquid is the same as above.

In the pattern forming method of the present invention, it is preferable that at least one of the developer or the rinsing liquid is the above-described treatment liquid, but it is particularly preferable that the rinsing liquid is the above-mentioned treatment liquid.

Moreover, in general, the developer and the rinsing liquid are stored in a waste liquid tank through a pipe after use. At this time, in a case where an ester-based solvent is used as the developer and a hydrocarbon-based solvent is used as the rinsing liquid, the resist dissolved in the developer precipitates, is attached to side and back surfaces of a wafer, a side surface of the pipe, and the like, and contaminates a device.

In order to solve the problems, a method of passing a solvent for dissolving a resist through the pipe again may be used. Examples of the method of passing a solvent through a pipe include a method in which a side surface, a back surface, or the like of a substrate which has been washed with the rinsing liquid is washed by passing a solvent for dissolving the resist therethrough, and a method in which a solvent for dissolving a resist is passed through a pipe while being not brought into contact with the resist.

The solvent which is passed through the pipe is not particularly limited as long as it can dissolve the resist, and examples thereof include the above-mentioned solvents used as a developer. Specific examples thereof include propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate, propylene glycol monomethyl ether (PGME), propylene glycol monoethyl ether, propylene glycol monopropyl ether, propylene glycol monobutyl ether, ethylene glycol monomethyl ether, ethylene glycol monoethyl ether, 2-heptanone, lactic acid ethyl, 1-propanol, and acetone. Among these, PGMEA, PGME, or cyclohexanone is preferable.

[Actinic Ray-Sensitive or Radiation-Sensitive Resin Composition (Resist Composition)]

Next, the actinic ray-sensitive or radiation-sensitive resin composition which is preferably used in combination with the treatment liquid of the present invention will be described in detail. Hereinafter, the components which can be included in the actinic ray-sensitive or radiation-sensitive resin composition will be first described.

(A) Resin

It is preferable that a "resin (A)" is contained as the actinic ray-sensitive or radiation-sensitive resin composition which is preferably used in combination with the treatment liquid of the present invention. The resin (A) has at least (i) a repeating unit having a group capable of decomposing by the action of an acid to generate a carboxyl group (may further include a repeating unit having a phenolic hydroxyl group), or at least (ii) a repeating unit having a phenolic hydroxyl group.

Furthermore, in a case where the resin (A) has the repeating unit capable of decomposing by the action of an acid to generate a carboxyl group, the solubility in an alkali developer increases and the solubility in the organic solvent increases due to the action of an acid.

Examples of the repeating unit having a phenolic hydroxyl group contained in the resin (A) include a repeating unit represented by General Formula (I).

In the formula, $R_{41}$, $R_{42}$, and $R_{43}$ each independently represent a hydrogen atom, an alkyl group, a halogen atom, a cyano group, or an alkoxycarbonyl group. $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents a (n+1)-valent aromatic ring group, and in a case where $Ar_4$ is bonded to $R_{42}$ to form a ring, $Ar_4$ represents a (n+2)-valent aromatic ring group.

n represents an integer of 1 to 5.

As the alkyl group of $R_{41}$, $R_{42}$, and $R_{43}$ in General Formula (I), an alkyl group having 20 or less carbon atoms, which may have a substituent, such as a methyl group, an ethyl group, a propyl group, an isopropyl group, a n-butyl group, a sec-butyl group, a hexyl group, a 2-ethylhexyl group, an octyl group, and a dodecyl group, is preferable, an alkyl group having 8 or less carbon atoms is more preferable, and an alkyl group having 3 or less carbon atoms is still more preferable.

The cycloalkyl groups of $R_{41}$, $R_{42}$, and $R_{43}$ in General Formula (I) may be monocyclic or polycyclic. Among those, a monocycloalkyl group having 3 to 8 carbon atoms, which may have a substituent, such as a cyclopropyl group, a cyclopentyl group, or a cyclohexyl group, is preferable.

Examples of the halogen atom of $R_{41}$, $R_{42}$, and $R_{43}$ in General Formula (I) include a fluorine atom, a chlorine atom, a bromine atom, and an iodine atom, with the fluorine atom being preferable.

As the alkyl group included in the alkoxycarbonyl group of $R_{41}$, $R_{42}$, and $R_{43}$ in General Formula (I), the same group as the alkyl group in $R_{41}$, $R_{42}$, and $R_{43}$ is preferable.

Preferred examples of a substituent of each of the groups include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the number of carbon atoms in the substituent is preferably 8 or less.

$Ar_4$ represents an (n+1)-valent aromatic ring group. In a case where n is 1, a divalent aromatic ring group may have a substituent, and preferred examples thereof include an arylene group having 6 to 18 carbon atoms such as a phenylene group, a tolylene group, a naphthylene group, or an anthracenylene group; and an aromatic ring group having a heterocycle, such as thiophene, furan, pyrrole, benzothiophene, benzofuran, benzopyrrole, triazine, imidazole, benzoimidazole, triazole, thiadiazole, and thiazole. These may further have a substituent.

In a case where n o an integer of 2 or more, specific preferred examples of the (n+1)-valent aromatic ring group include groups obtained by removing arbitrary (n−1) hydrogen atoms from the specific examples of the above-described divalent aromatic ring groups.

The (n+1)-valent aromatic ring group may further have a substituent.

Examples of a substituent which may be included in the above-mentioned alkyl group, cycloalkyl group, alkoxycarbonyl group, alkylene group, and (n+1)-valent aromatic ring group include the alkyl groups exemplified by $R_{41}$, $R_{42}$, and $R_{43}$ in General Formula (I), alkoxy groups such as a methoxy group, an ethoxy group, a hydroxyethoxy group, a propoxy group, a hydroxypropoxy group, and a butoxy group; and aryl group such as a phenyl group.

As an alkyl group of $R_{64}$ in —CONR$_{64}$— ($R_{64}$ represents a hydrogen atom or an alkyl group) represented by $X_4$, an alkyl group having 20 or less carbon atoms, which may have a substituent, such as a methyl group, an ethyl group, a propyl group, an isopropyl group, a n-butyl group, a sec-butyl group, a hexyl group, a 2-ethylhexyl group, an octyl group, or a dodecyl group is preferable, and an alkyl group having 8 or less carbon atoms is more preferable.

As $X_4$, a single bond, —COO—, or —CONH— is preferable, and a single bond or —COO— is more preferable.

Preferred examples of the alkylene group in $L_4$ include an alkylene group having 1 to 8 carbon atoms, which may have a substituent, such as a methylene group, an ethylene group, a propylene group, a butylene group, a hexylene group, and an octylene group.

As $Ar_4$, an aromatic ring group having 6 to 18 carbon atoms, which may have a substituent, is more preferable, and a benzene ring group, a naphthalene ring group, or a biphenylene ring group is particularly preferable.

It is preferable that the repeating unit represented by General Formula (I) includes a hydroxystyrene structure. That is, it is preferable that $Ar_4$ is a benzene ring group.

Preferred examples of the repeating unit having a phenolic hydroxyl group contained in the resin (A) include a repeating unit represented by General Formula (p1).

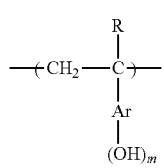

R in General Formula (p1) represents a hydrogen atom or a linear or branched alkyl group having a halogen atom or 1 to 4 carbon atoms. A plurality of R's may be the same as or different from each other. As R in General Formula (p1), a hydrogen atom is preferable.

Ar in General Formula (p1) represents an aromatic ring, and examples thereof include an aromatic hydrocarbon ring having 6 to 18 carbon atoms, which may have a substituent, such as a benzene ring, a naphthalene ring, an anthracene ring, a fluorene ring, and a phenanthrene ring; and an aromatic heterocycle including a heterocycle, such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, and a thiazole ring. Among these, a benzene ring is preferable.

m in General Formula (p1) represents an integer of 1 to 5, and is preferably 1.

Specific examples of the repeating unit having a phenolic hydroxyl group contained in the resin (A) are shown below, but the present invention is not limited thereto. In the formulae, a represents 1 or 2.

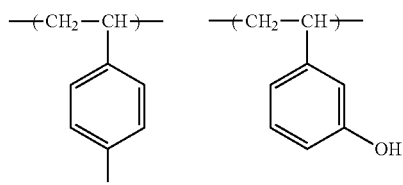

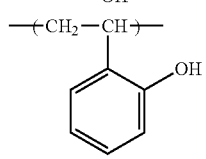

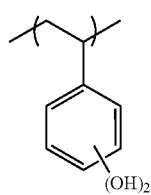 (B-1)

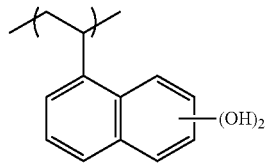 (B-2)

(B-3)

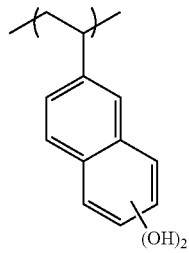

(B-4)

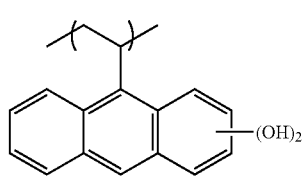

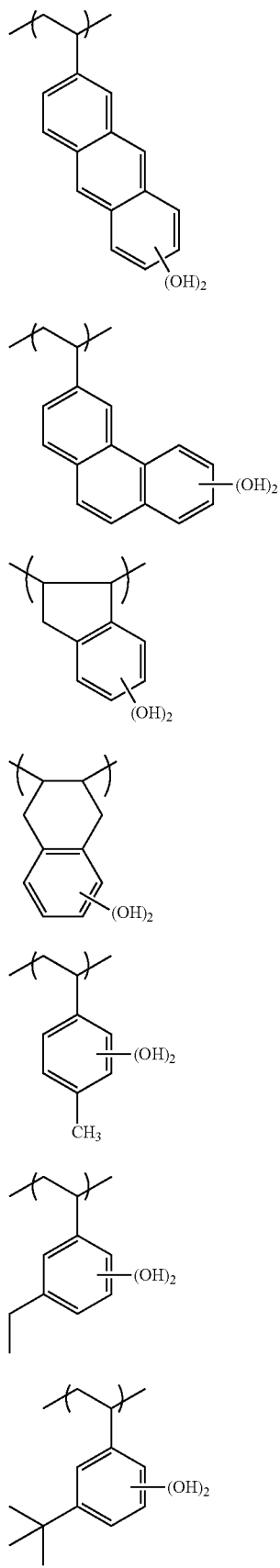
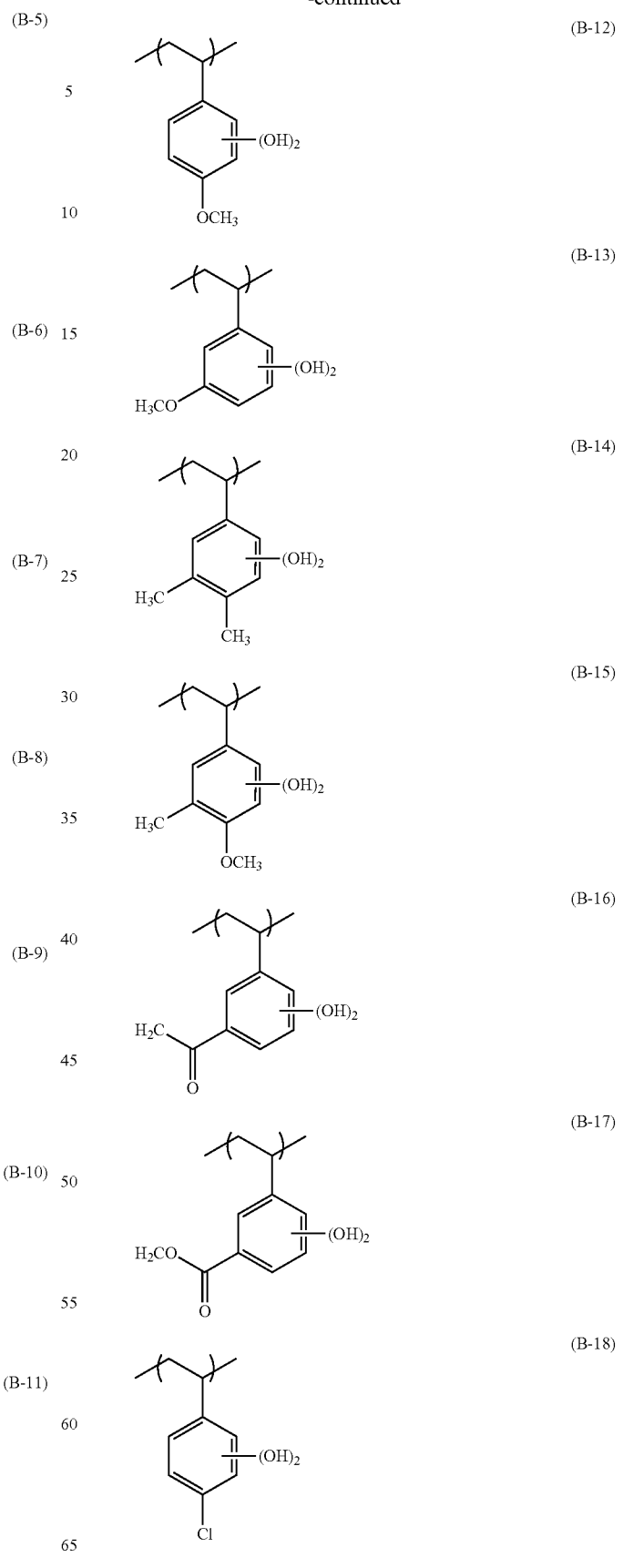

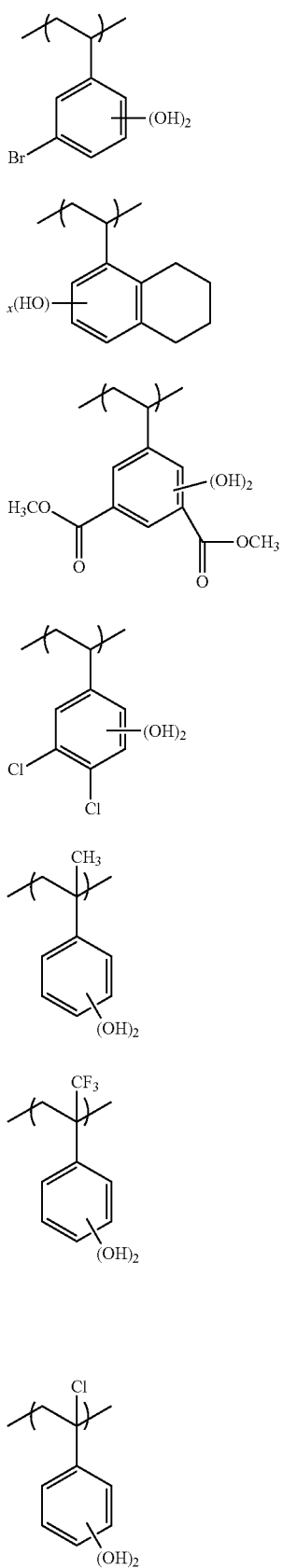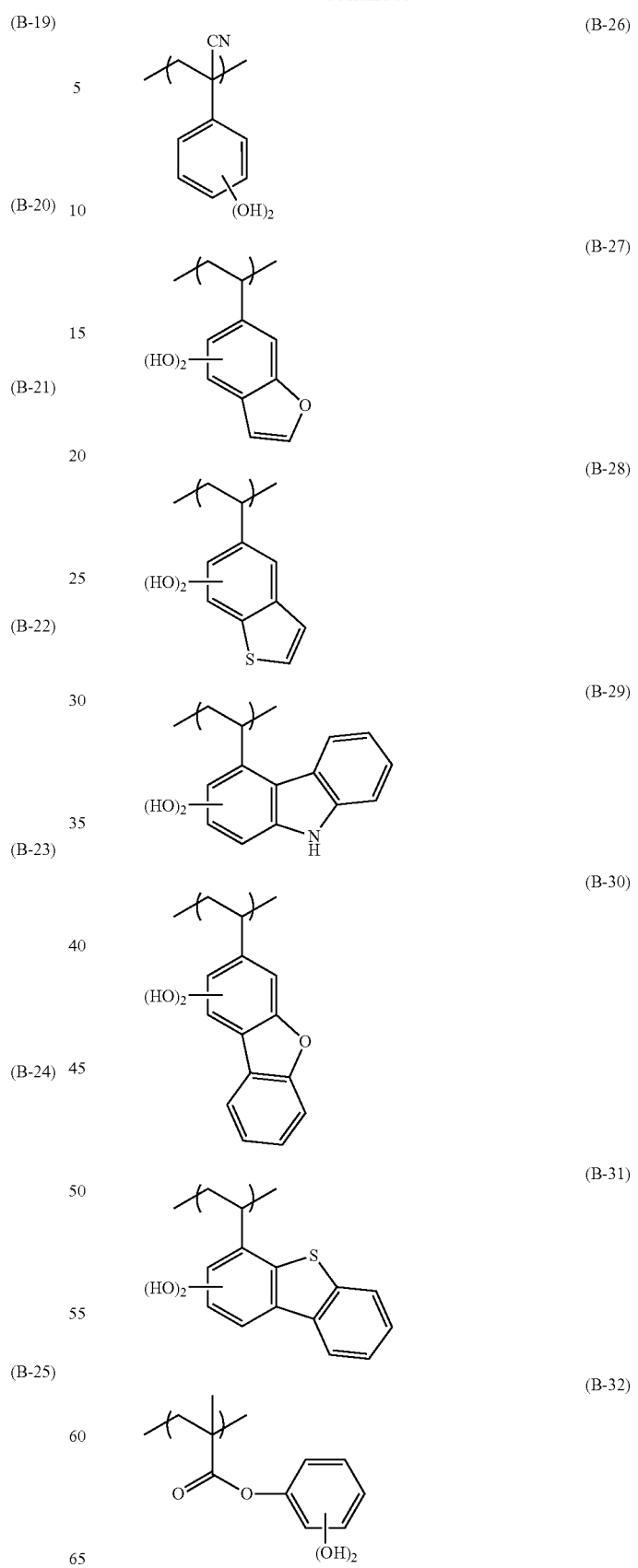

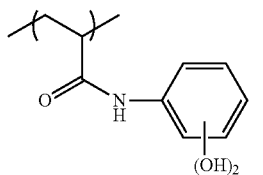
(B-33)

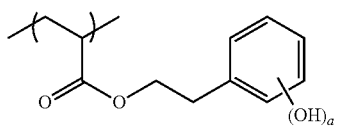
(B-34)

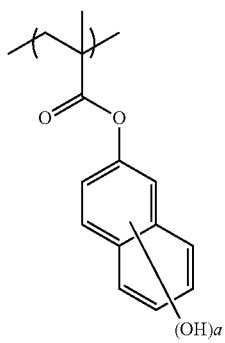
(B-35)

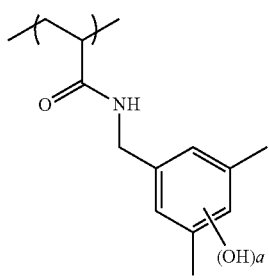
(B-36)

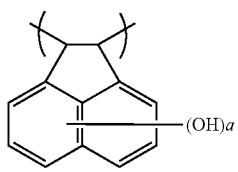
(B-37)

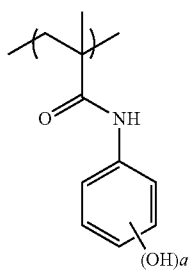
(B-38)

The content of the repeating unit having a phenolic hydroxyl group is preferably 0% to 50% by mole, more preferably 0% to 45% by mole, and still more preferably 0% to 40% by mole, with respect to all the repeating units of the resin (A).

The repeating unit having a group capable of decomposing by the action of an acid to generate a carboxyl group contained in the resin (A) is a repeating unit having a group which is substituted with a group obtained by a hydrogen atom being removed from a carboxyl group due to decomposition caused by the action of an acid.

Examples of the group capable of leaving by an acid include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

As the repeating unit having a group capable of decomposing by the action of an acid to generate a carboxyl group, which is contained in the resin (A), a repeating unit represented by General Formula (AI) is preferable.

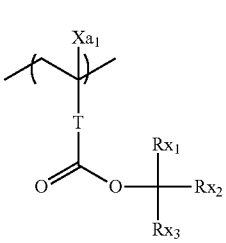
(AI)

In General Formula (AI), $Xa_1$ represents a hydrogen atom or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. In a case where all of $Rx_1$ to $Rx_3$ represent an alkyl group (linear or branched), it is preferable that at least two of $Rx_1, \ldots,$ or $Rx_3$ are a methyl group.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by —$CH_2$—$R_{11}$. $R_{11}$ represents a halogen atom (for example, a fluorine atom), a hydroxyl group, or a monovalent organic group, and examples thereof include an alkyl group having 5 or less carbon atoms and an acyl group having 5 or less carbon atoms. In particular, an alkyl group having 3 or less carbon atoms is preferable, and a methyl group is more preferable. In one aspect, $Xa_1$ is preferably a hydrogen atom, a methyl group, a trifluoromethyl group, or a hydroxymethyl group.

Examples of the divalent linking group of T include an alkylene group, a —COO-Rt- group, and a —O-Rt- group. In the formulae, Rt represents an alkylene group or a cycloalkylene group.

T is preferably a single bond or a —COO-Rt- group. Rt represents preferably an alkylene group having 1 to 5 carbon atoms, and more preferably a —$CH_2$— group, a —$(CH_2)_2$— group, or a —$(CH_2)_3$— group.

As the alkyl group of $Rx_1$ to $Rx_3$, an alkyl group having 1 to 4 carbon atoms such as a methyl group, an ethyl group, a n-propyl group, an isopropyl group, a n-butyl group, an isobutyl group, and a t-butyl group is preferable.

As the cycloalkyl group of $Rx_1$ to $Rx_3$, a monocycloalkyl group such as a cyclopentyl group and a cyclohexyl group, or a polycycloalkyl group such as a norbornyl group, a tetracyclodecanyl group, a tetracyclododecanyl group, and an adamantyl group is preferable.

As the cycloalkyl group which is formed by two of $Rx_1$ to $Rx_3$ being bonded to each other, a monocycloalkyl group such as a cyclopentyl group or a cyclohexyl group, and a polycycloalkyl group such as a norbornyl group, a tetracyclodecanyl group, a tetracyclododecanyl group, and an adamantyl group is preferable. In particular, a monocycloalkyl group having 5 or 6 carbon atoms is preferable.

In the cycloalkyl group which is formed by two of $Rx_1$ to $Rx_3$ being bonded to each other, for example, one methylene group constituting the ring may be substituted with a heteroatom such as an oxygen atom, or a group having a heteroatom, such as a carbonyl group.

In the repeating unit represented by General Formula (AI), for example, it is preferable that $Rx_1$ is a methyl group or an ethyl group and that $Rx_2$ and $Rx_3$ are bonded to each other to form the above-mentioned cycloalkyl group.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), which preferably has 8 or less carbon atoms.

As the repeating unit represented by General Formula (AI), an acid-decomposable tertiary alkyl (meth)acrylate ester-based repeating unit (a repeating unit in which $Xa_1$ represents a hydrogen atom or a methyl group, and T represents a single bond) is preferable. A repeating unit in which $Rx_1$ to $Rx_3$ each independently represent a linear or branched alkyl group is more preferable, and a repeating unit in which $Rx_1$ to $Rx_3$ each independently represent a linear alkyl group is still more preferable. Further, in the present specification, the (meth)acrylic acid means an acrylic acid and/or a methacrylic acid. This shall also apply to a (meth)acryl group and a (meth)acrylate.

Specific examples of the repeating unit having a group capable of decomposing by the action of an acid to generate a carboxyl group, contained in the resin (A), are shown below, but the present invention is not limited thereto.

In the specific examples, Rx and $Xa_1$ represent a hydrogen atom, $CH_3$, $CF_3$, or $CH_2OH$. Rxa and Rxb each independently represent an alkyl group having 1 to 4 carbon atoms. Z represents a substituent including a polar group. In a case where Z's are present in plural number, Z's each independently represent a substituent having a polar group. p represents 0 or a positive integer. Examples of the substituent having a polar group represented by Z include a linear, branched, or cyclic alkyl group having a hydroxyl group, a cyano group, an amino group, an alkylamido group, or a sulfonamide group, an alkyl group having a hydroxyl group is preferable, and as the branched alkyl group, an isopropyl group is particularly preferable.

1

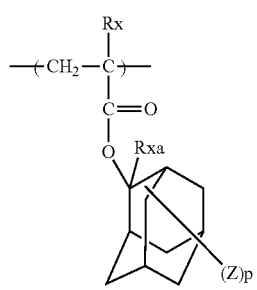

2

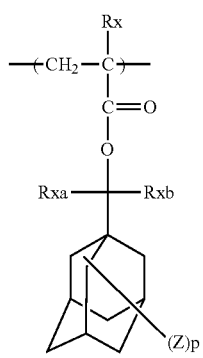

3

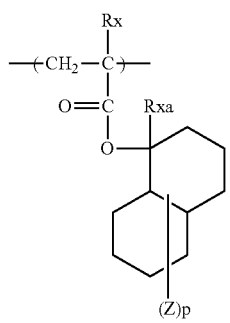

4

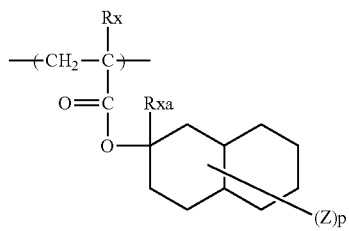

5

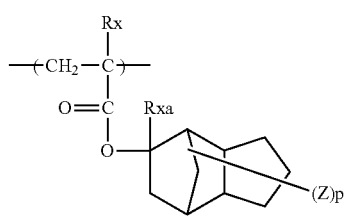

6

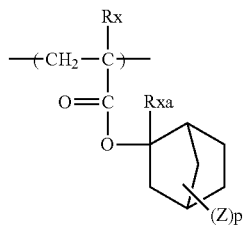

7

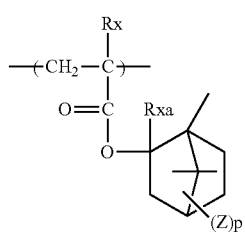

8
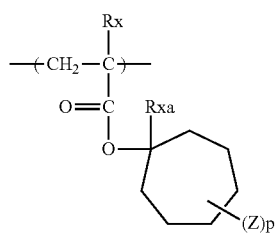
9
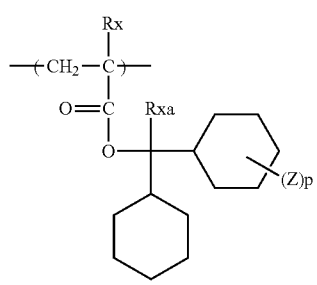
10
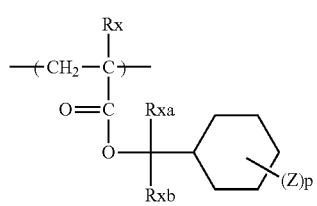
11
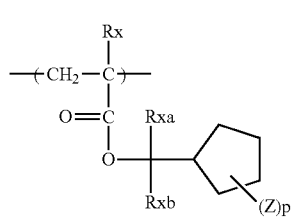
12
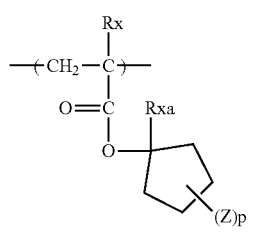
13
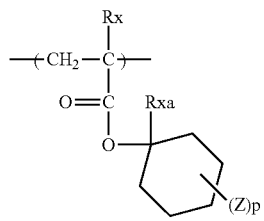
14
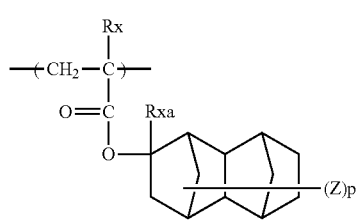
15
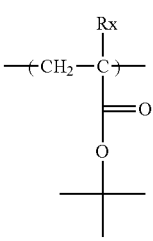
16
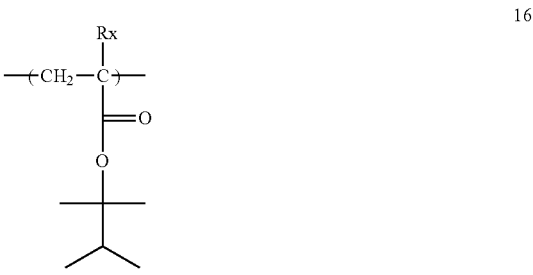
17
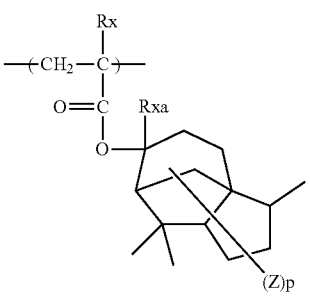
18
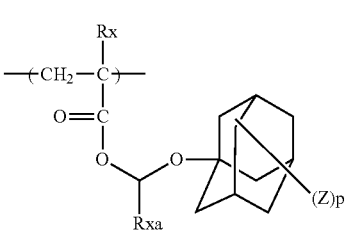
19
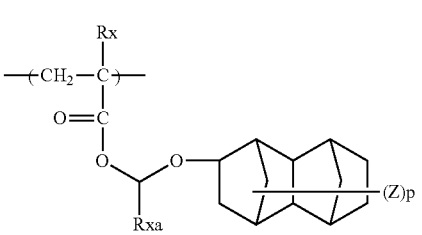
20
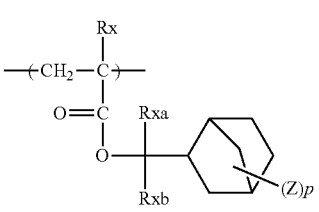

21 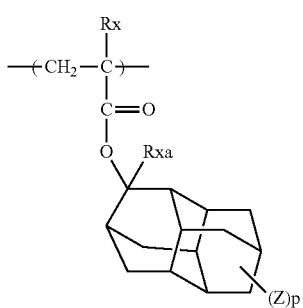

22 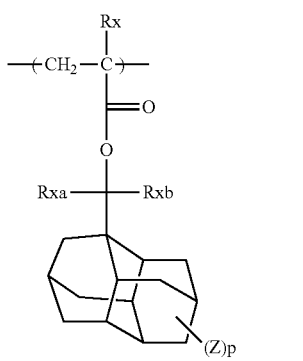

23 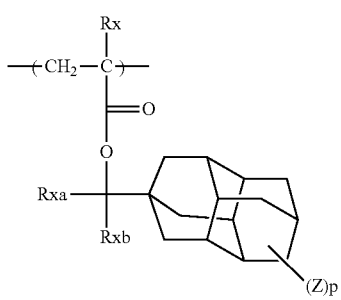

24 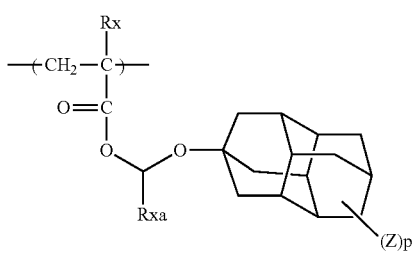

25 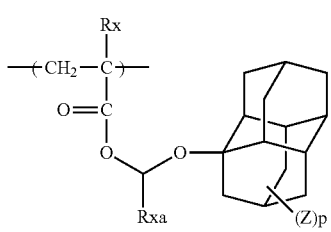

The content of the repeating unit having a group capable of decomposing by the action of an acid to generate a carboxyl group is preferably 15% to 90% by mole, more preferably 20% to 90% by mole, still more preferably 25% to 80% by mole, and particularly preferably 30% to 70% by mole with respect to all the repeating units of the resin (A).

It is preferable that the resin (A) further contains a repeating unit having a lactone group.

As the lactone group, any of groups which contain a lactone structure may be used, but a group having a 5- to 7-membered lactone structure containing a lactone structure is preferable, and a group in which another ring structure is fused to a group having a 5- to 7-membered lactone structure so as to form a bicyclo structure or a spiro structure is more preferable.

It is preferable that a repeating unit which contains a group having with a lactone structure represented by any one of General Formulae (LC1-1) to (LC1-16) is contained as the repeating group having a lactone group. As the lactone structure, a group represented by General Formula (LC1-1), (LC1-4), (LC1-5), (LC1-6), (LC1-13), or (LC1-14) is preferable. In addition, the group having a lactone structure may be directly bonded to a main chain.

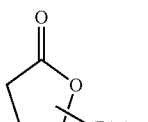
LC1-1

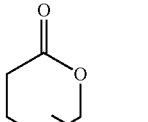
LC1-2

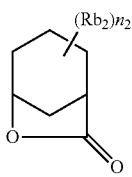
LC1-3

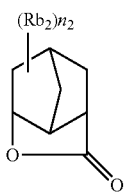
LC1-4

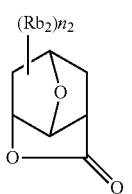
LC1-5

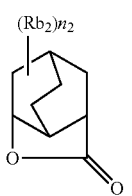
LC1-6

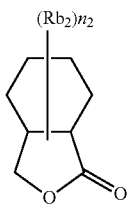
LC1-7

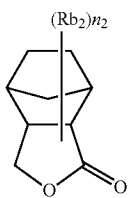
LC1-8

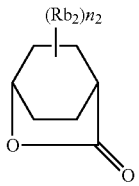
LC1-9

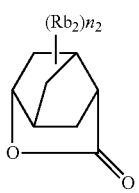
LC1-10

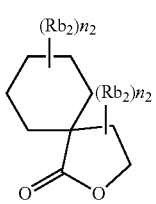
LC1-11

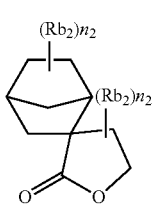
LC1-12

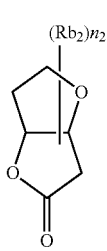
LC1-13

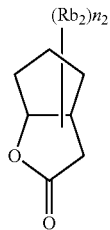
LC1-14

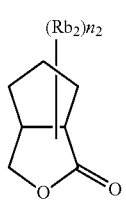
LC1-15

LC1-16

The lactone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In a case where $n_2$ is 2 or more, $Rb_2$'s present in plural number may be the same as or different from each other, or $Rb_2$'s present in plural number may be bonded to each other to form a ring.

Examples of the repeating unit which contains a group having the lactone structure represented by any one of General Formulae (LC1-1) to (LC1-16) include a repeating unit represented by General Formula (AI).

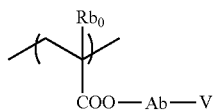

(AI)

In General Formula (AI), $Rb_0$ represents a hydrogen atom, a halogen atom, or an alkyl group having 1 to 4 carbon atoms.

Preferred examples of a substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by a combination thereof. In particular, Ab is preferably a single bond or a linking group represented by -$Ab_1$-$CO_2$—. $Ab_1$ is a linear or branched alkylene group or a monocyclic or polycyclic cycloalkylene group, and preferably a methylene group, an ethylene group, a cyclohexylene group, an adamantylene group, or a norbornylene group.

V represents a group represented by any one of General Formulae (LC1-1) to (LC1-16).

In the repeating unit which contains a group having a lactone structure, optical isomers are typically present, but any of the optical isomers may be used. In addition, one optical isomer may be used singly, or a mixture of a plurality of the optical isomers may be used. In a case where one optical isomer is mainly used, the optical purity (ee) thereof is preferably 90 or more, and more preferably 95 or more.

Specific examples of the repeating unit which has a group containing a lactone structure are shown below, but the present invention is not limited thereto.

(In the formula, Rx represents H, $CH_3$, $CH_2OH$, or $CF_3$)

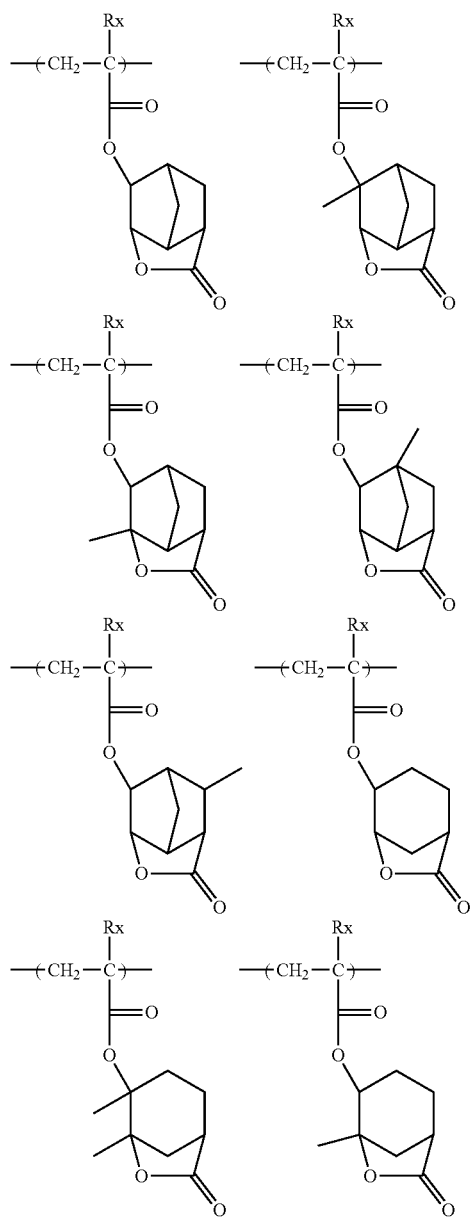

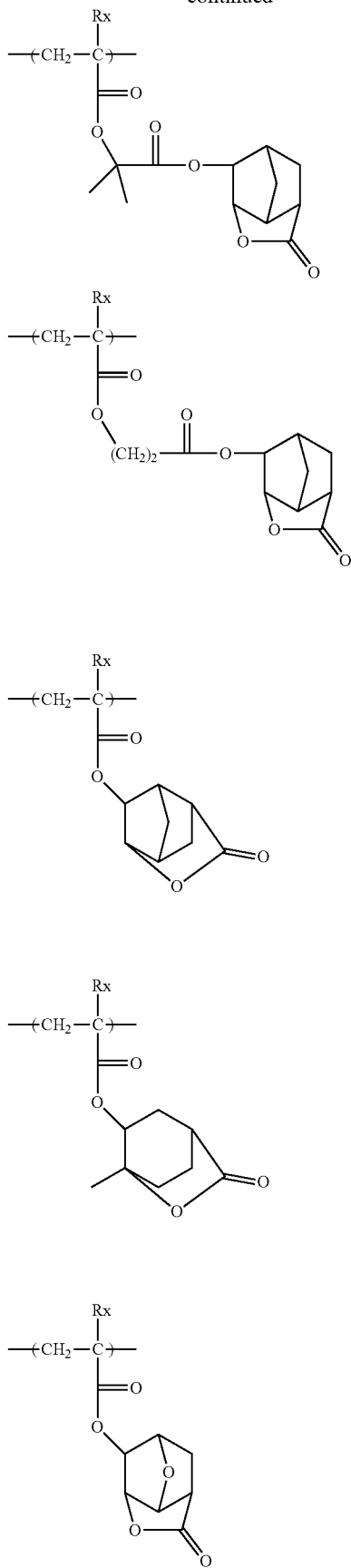

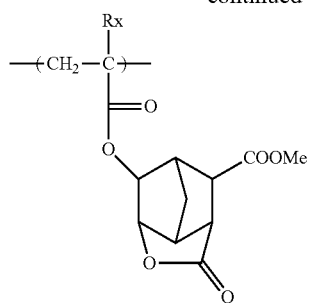
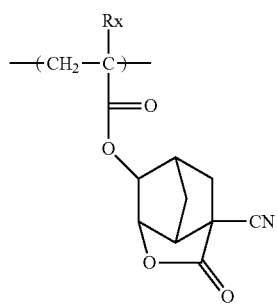
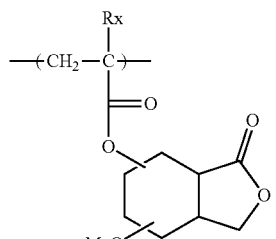
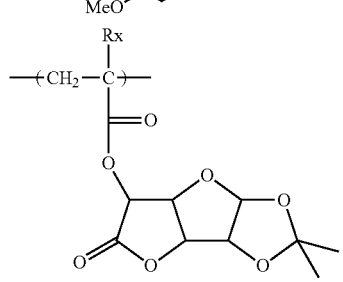
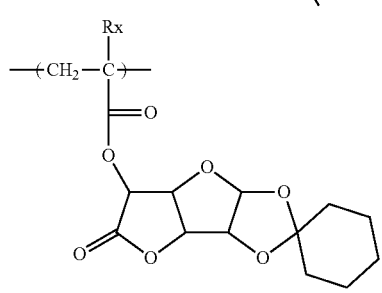
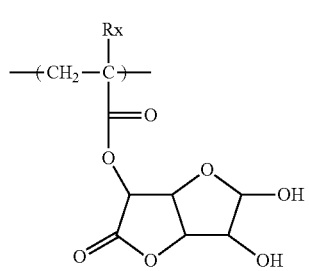

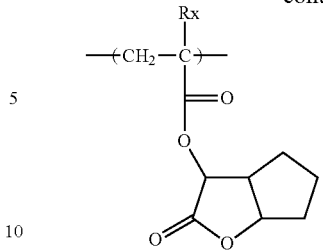
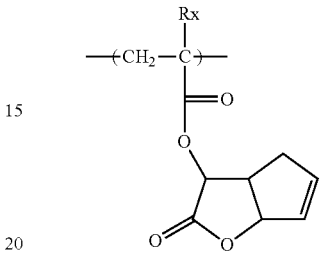
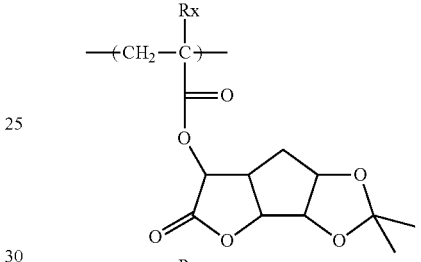
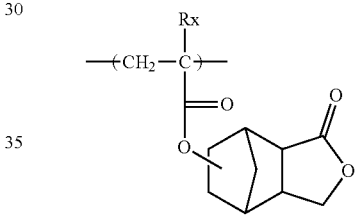
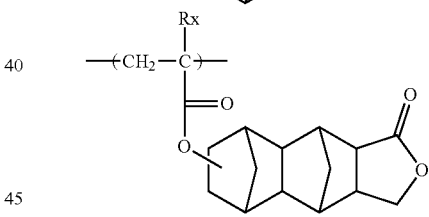
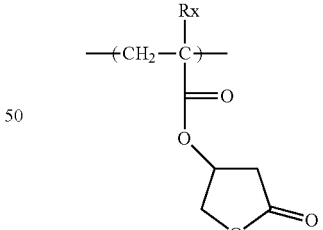

The content of the repeating unit having a lactone group is preferably 1% to 65% by mole, more preferably 1% to 30% by mole, still more preferably 5% to 25% by mole, and particularly preferably 5% to 20% by mole, with respect to all the repeating units of the resin (A).

The resin (A) may further have a repeating unit which contains an organic group having a polar group, in particular, a repeating unit which has an alicyclic hydrocarbon structure substituted with a polar group.

As a result, substrate adhesiveness and/or developer affinity is improved. As the alicyclic hydrocarbon structure substituted with a polar group, an adamantyl group, a diamantyl group, or a norbornane group is preferable. As the polar group, a hydroxyl group or a cyano group is preferable.

Specific examples of the repeating unit having a polar group are shown below, but the present invention is not limited thereto.

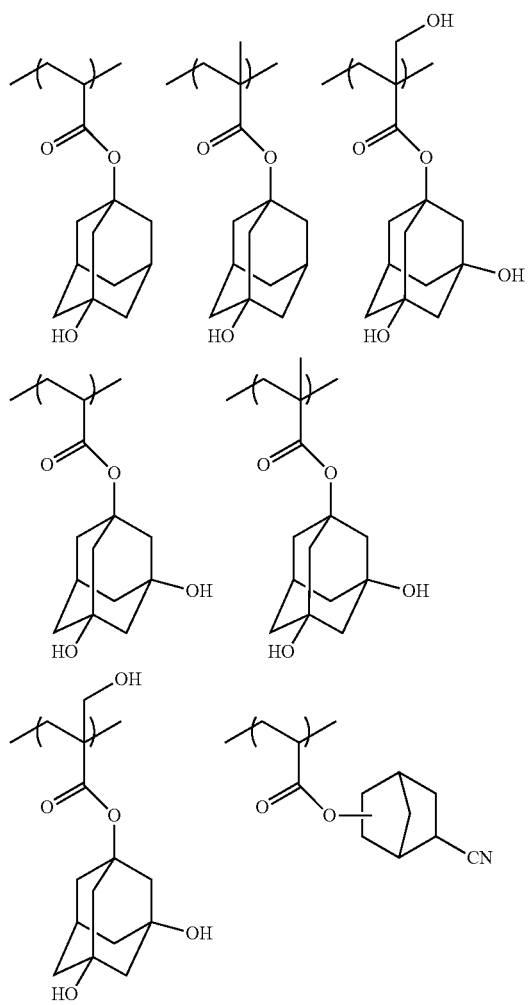

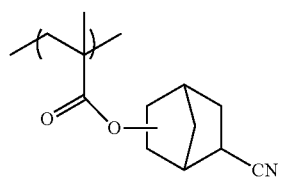

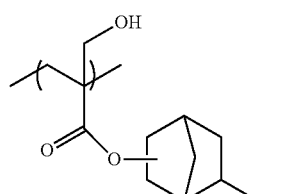

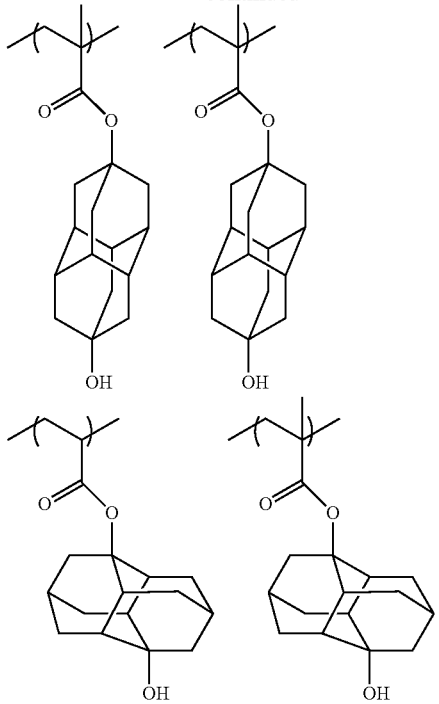

In a case where the resin (A) includes the repeating unit which contains an organic group having a polar group, the content thereof is preferably 1% to 50% by mole, more preferably 1% to 30% by mole, still more preferably 5% to 25% by mole, and particularly preferably 5% to 20% by mole, with respect to all the repeating units of the resin (A).

Furthermore, as a repeating unit other than the above-described repeating units, the resin (A) may include a repeating unit having a group (photoacid generating group) which generates an acid upon irradiation with actinic rays or radiation. In this case, it can be considered that the repeating unit having a photoacid generating group corresponds to a compound (B) described below, capable of generating an acid upon irradiation with actinic rays or radiation.

Examples of the repeating unit include a repeating unit represented by General Formula (4).

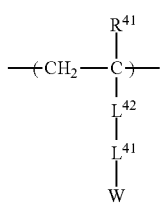

(4)

$R^{41}$ represents a hydrogen atom or a methyl group. $L^{41}$ represents a single bond or a divalent linking group. $L^{42}$ represents a divalent linking group. W represents a structural unit capable of decomposing to generate an acid in a side chain upon irradiation with actinic rays or radiation.

Specific examples of the repeating unit represented by General Formula (4) are shown below, but the present invention is not limited thereto.

51
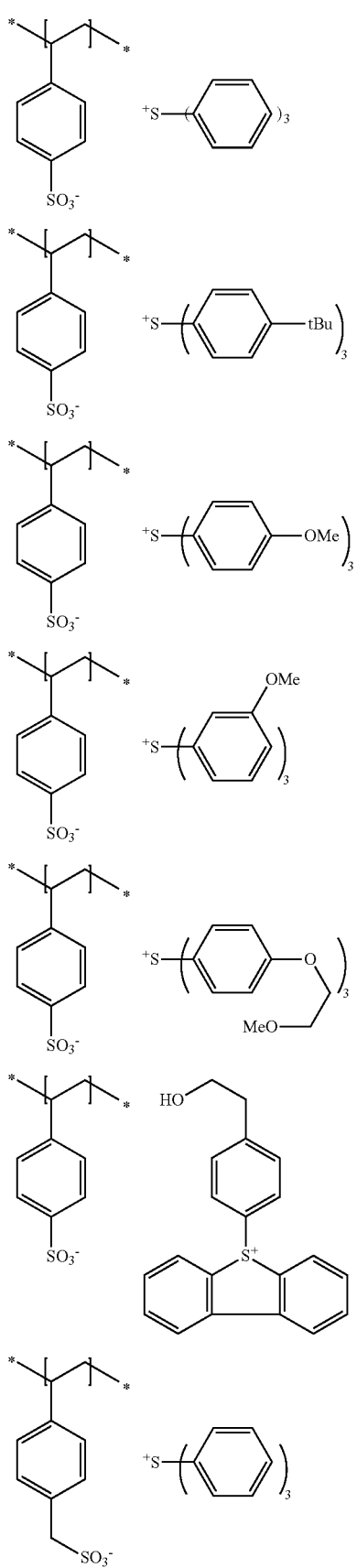
52
-continued
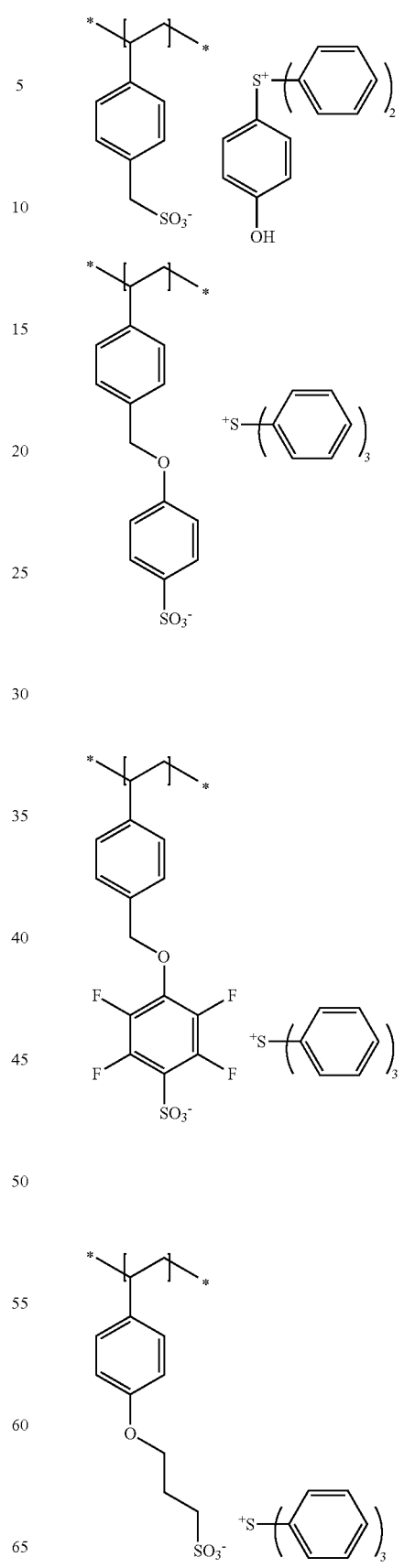

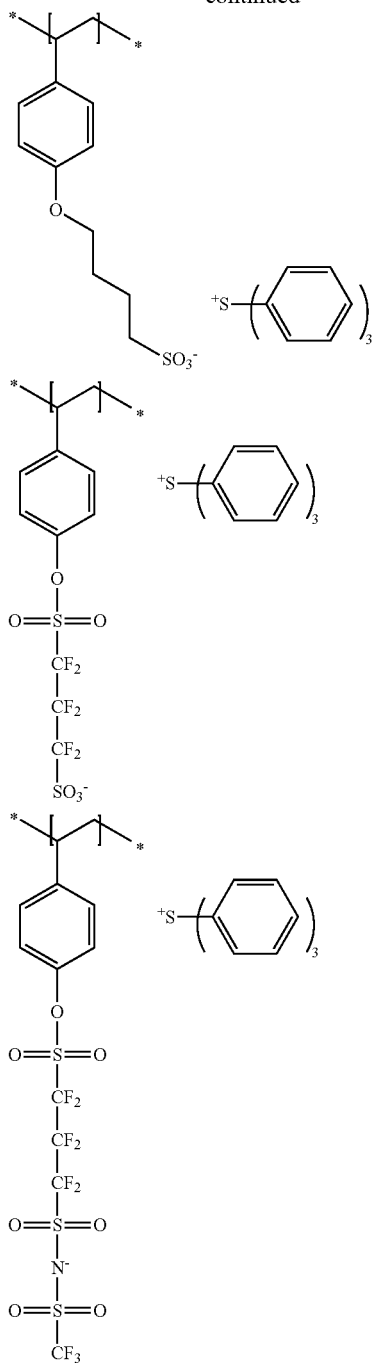

Other examples of the repeating unit represented by General Formula (4) include repeating units described in paragraphs [0094] to [0105] of JP2014-041327A.

In a case where the resin (A) contains the repeating unit having a photoacid generating group, the content of the repeating unit having a photoacid generating group is preferably 1 to 40% by mole, more preferably 5 to 35% by mole, and still more preferably 5 to 30% by mole, with respect to all the repeating units of the resin (A).

The resin (A) can be synthesized using an ordinary method (for example, radical polymerization). Examples of the general synthesis method include a batch polymerization method in which a monomer species and an initiator are dissolved in a solvent, and the solution is heated to perform polymerization, and a dropping polymerization method in which a solution of a monomer species and an initiator are added dropwise to a heated solvent for 1 to 10 hours, with the dropping polymerization method being preferable.

Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethylacetamide, and solvents for dissolving an actinic ray-sensitive or radiation-sensitive resin composition, such as propylene glycol monomethyl ether acetate, propylene glycol monomethyl ether, and cyclohexanone, which will be described later. It is preferable that the same solvent as that used in the actinic ray-sensitive or radiation-sensitive resin composition is used to perform polymerization. With such a use of the solvents, particle generation during storage can be suppressed.

It is preferable that the polymerization reaction is carried out in an inert gas atmosphere such as nitrogen and argon. In order to initiate the polymerization, a commercially available radical initiator (an azo-based initiator, a peroxide, and the like) is used as the polymerization initiator. As the radical initiator, an azo-based initiator is preferable, and an azo-based initiator having an ester group, a cyano group, or a carboxyl group is preferable. Preferred examples of the initiator include azobisisobutyronitrile, azobisdimethylvaleronitrile, and dimethyl 2,2'-azobis(2-methylpropionate). The initiator is added or added in portionwise, depending on the purposes, and after completion of the reaction, the reaction product is poured into a solvent, and then a desired polymer is recovered by a method such as powder or solid recovery. The concentration of a reactant is 5% to 50% by mass, and preferably 10% to 30% by mass.

The reaction temperature is usually 10° C. to 150° C., preferably 30° C. to 120° C., and still more preferably 60° C. to 100° C.

For purification, a typical method such as a liquid-liquid extraction method in which residual monomers and oligomer components are removed by combining water washing with an appropriate solvent, a purification method in a solid state such as ultrafiltration in which substances having a specific molecular weight or less are removed by filtration, a reprecipitation method in which residual monomers are removed by dropping a resin solution over a poor solvent to solidify the resin in the poor solvent, and a purification method in a solid state in which a resin slurry separated by filtration is washed with a poor solvent can be applied.

The weight-average molecular weight of the resin (A) is preferably 1,000 to 200,000, more preferably 3,000 to 20,000, and still more preferably 5,000 to 15,000 as a value in terms of polystyrene by a GPC method. By adjusting the weight-average molecular weight to 1,000 to 200,000, deterioration in heat resistance or dry etching resistance can be prevented, and deterioration in developability or deterioration in film forming properties caused by an increase in viscosity can also be prevented.

In another particularly preferred embodiment, the weight-average molecular weight of the resin (A) is 3,000 to 9,500 as a value in terms of polystyrene by a GPC method. By adjusting the weight-average molecular weight to 3,000 to 9,500, in particular, a resist residue (hereinafter also referred to as "scum") is suppressed, and a more satisfactory pattern can thus be formed.

A dispersity (molecular weight distribution) in the range of usually 1 to 5, preferably 1 to 3, more preferably 1.2 to 3.0, and particularly preferably 1.2 to 2.0 is used. As the dispersity decreases, a resolution and a resist shape are improved, and further, a side wall of a resist pattern is smooth and roughness properties are excellent.

In the actinic ray-sensitive or radiation-sensitive resin composition, the content of the resin (A) is preferably 50% to 99.9% by mass and more preferably 60% to 99.0% by mass with respect to the total solid content of the composition.

In addition, in the actinic ray-sensitive or radiation-sensitive resin composition, the resin (A) may be used singly or in combination of a plurality of the resins (A).

In addition, the resin (A) may include a repeating unit represented by General Formula (VI).

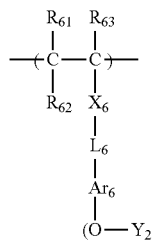

(VI)

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and in this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents a (n+1)-valent aromatic ring group, and in a case where $Ar_6$ is bonded to $R_{62}$ to form a ring, $Ar_6$ represents a (n+2)-valent aromatic ring group.

In a case of n≥2, $Y_2$'s each independently represent a hydrogen atom or a group capable of leaving by the action of an acid, provided that at least one of $Y_2$'s represents a group capable of leaving by the action of an acid.

n represents an integer of 1 to 4.

As the group capable of leaving by the action of an acid represented by $Y_2$, a structure represented by General Formula (VI-A) is more preferable.

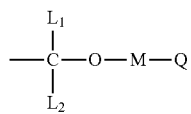

(VI-A)

Here, $L_1$ and $L_2$ each independently represent a hydrogen atom, an alkyl group, a cycloalkyl group, an aryl group, or a group formed by a combination of an alkylene group and an aryl group.

M represents a single bond or a divalent linking group.

Q represents an alkyl group, a cycloalkyl group which may have a heteroatom, an aryl group which may have a heteroatom, an amino group, an ammonium group, a mercapto group, a cyano group, or an aldehyde group.

At least two of Q, M, or $L_1$ may be bonded to each other to form a ring (preferably a 5- or 6-membered ring).

The repeating unit represented by General Formula (VI) is preferably a repeating unit represented by General Formula (3).

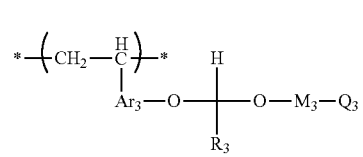

(3)

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two of $Q_3$, $M_3$, or $R_3$ may be bonded to each other to form a ring.

The aromatic ring group represented by $Ar_3$ is the same as $Ar_6$ in General Formula (VI) in a case where n in General Formula (VI) represents 1. In this case, a phenylene group or a naphthylene group is preferable, and a phenylene group is more preferable.

Specific examples of the repeating unit represented by General Formula (VI) are shown below, but the present invention is not limited thereto.

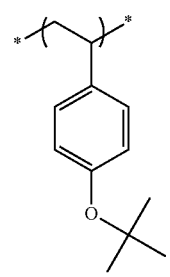

(VI-1)

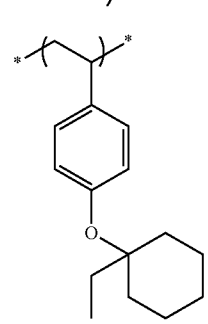

(VI-2)

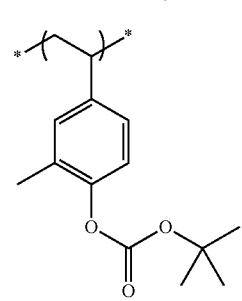

(VI-3)

(VI-4) 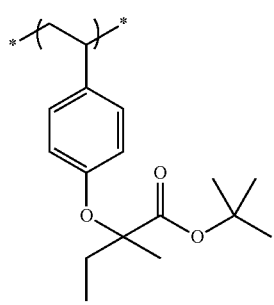
(VI-5) 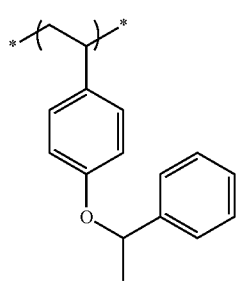
(VI-6) 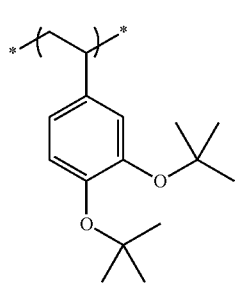
(VI-7) 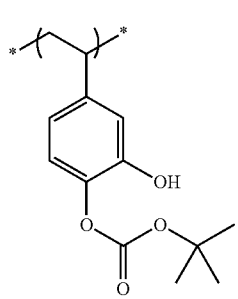
(VI-8) 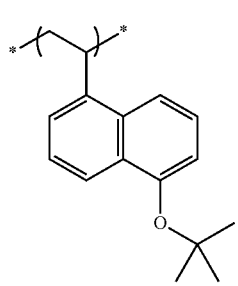
(VI-9) 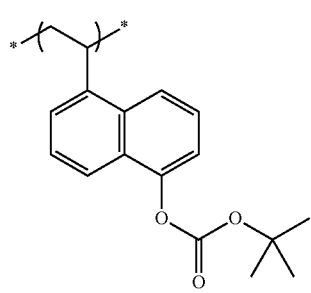
(VI-10) 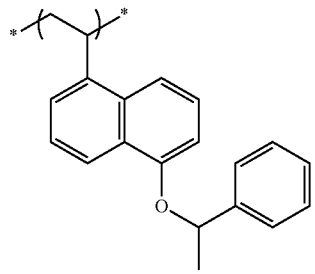
(VI-11) 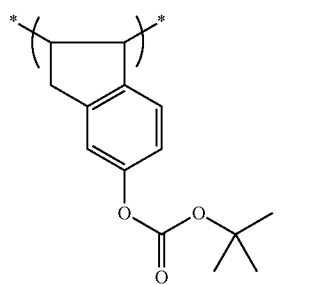
(VI-12) 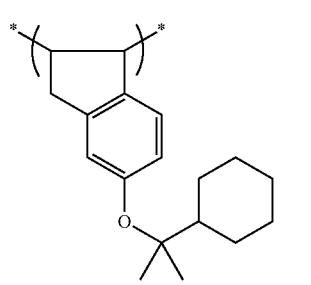
(VI-13) 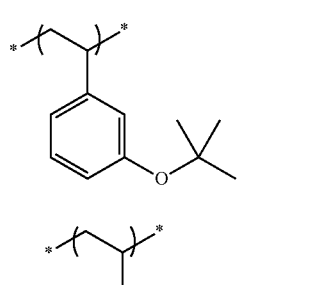
(VI-14)

(VI-15)
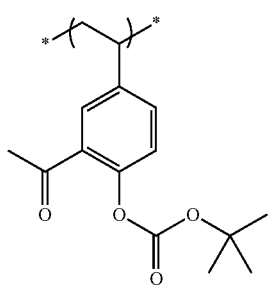
(VI-16)
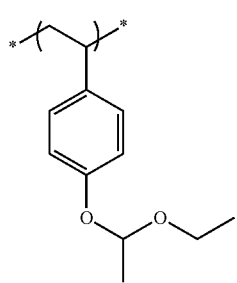
(VI-17)
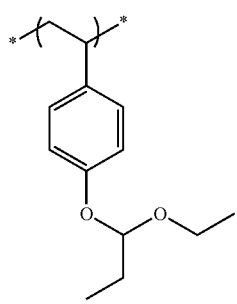
(VI-18)
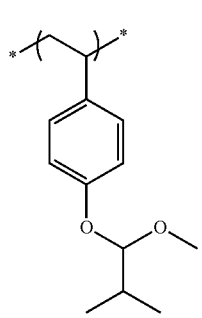
(VI-19)
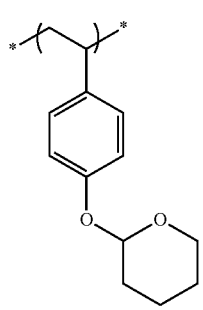
(VI-20)
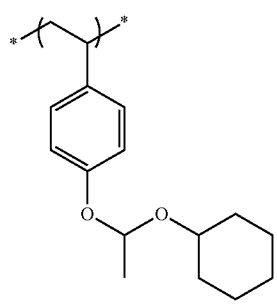
(VI-21)
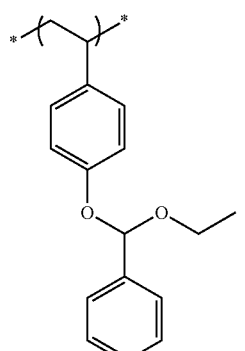
(VI-22)
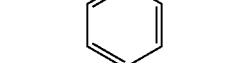
(VI-23)
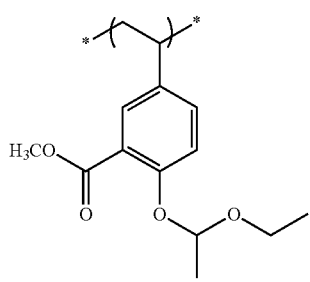
(VI-24)
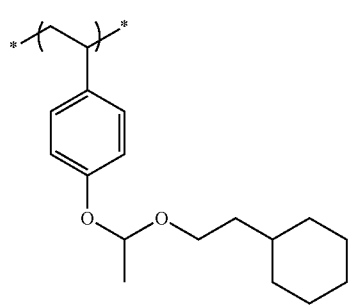

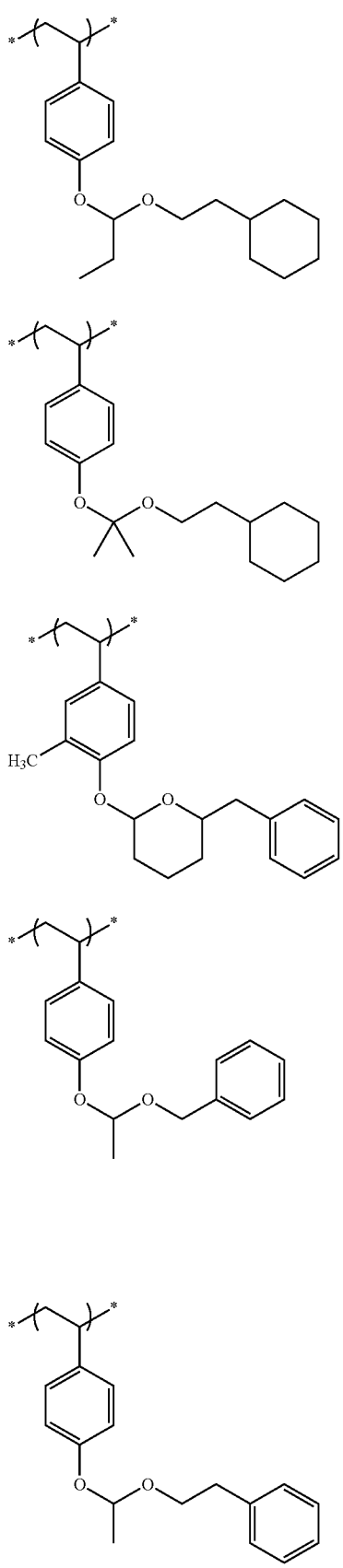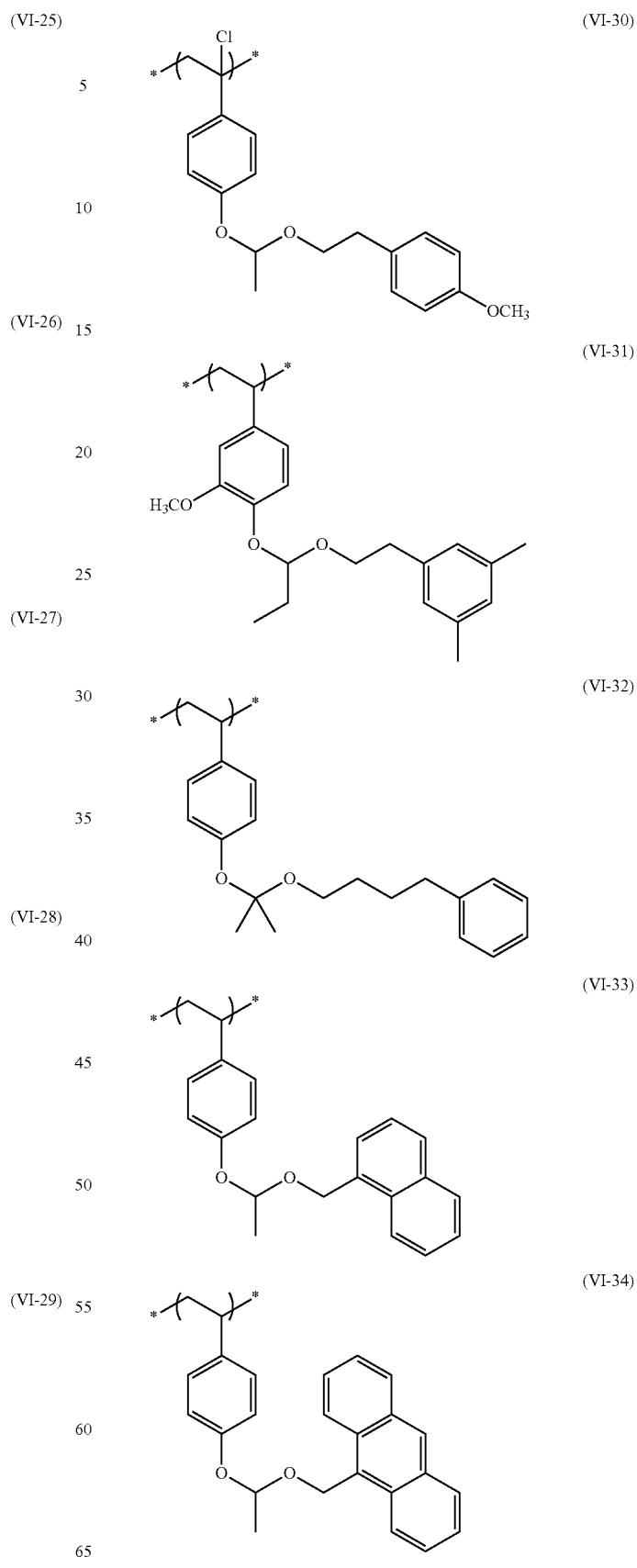

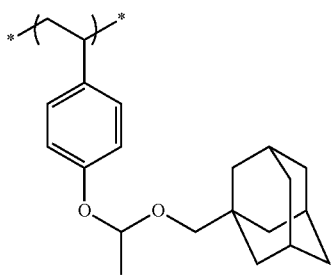
(VI-35)

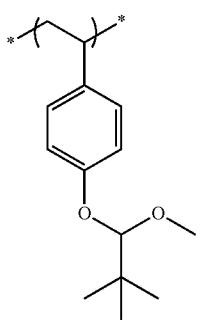
(VI-36)

It is also preferable that the resin (A) includes a repeating unit represented by General Formula (4).

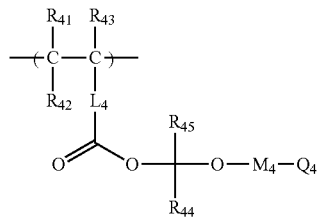
(4)

In General Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring, and in this case, $R_{42}$ represents an alkylene group.

$L_4$ represents a single bond or a divalent linking group. In a case where $L_4$ and $R_{42}$ form a ring, $L_4$ represents a trivalent linking group.

$R_{44}$ and $R_{45}$ represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, or $R_{44}$ may be bonded to each other to form a ring.

$R_{41}$, $R_{42}$, and $R_{43}$ have the same definitions and the same preferable ranges as $R_{51}$, $R_{52}$, and $R_{53}$ in General Formula (V).

$L_4$ has the same definition and the same preferable range as $L_5$ in General Formula (V).

$R_{44}$ and $R_{45}$ have the same definitions and the same preferable ranges as $R_3$ in General Formula (3).

$M_4$ has the same definition and the same preferable range as $M_3$ in General Formula (3).

$Q_4$ has the same definition and the same preferable range as $Q_3$ in General Formula (3).

Examples of a ring which is formed by at least two of $Q_4$, $M_4$, or $R_{44}$ being bonded to each other include the ring which is formed by at least two of $Q_3$, $M_3$, or $R_3$ being bonded to each other, and preferable ranges thereof are also the same.

Specific examples of the repeating unit represented by General Formula (4) are shown below, but the present invention is not limited thereto.

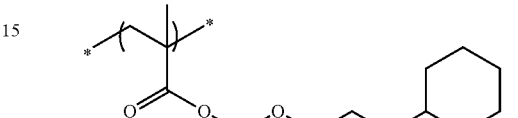

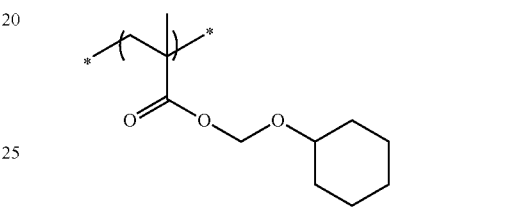

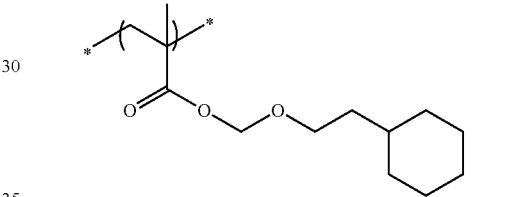

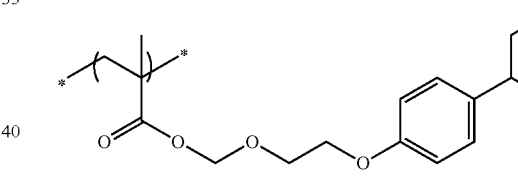

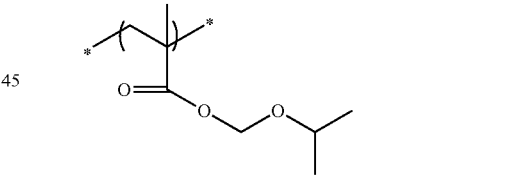

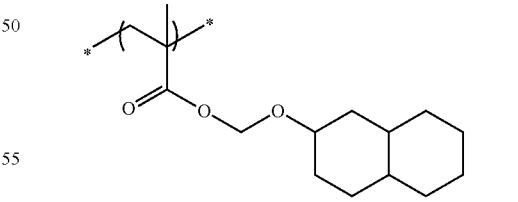

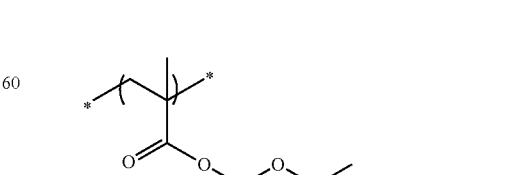

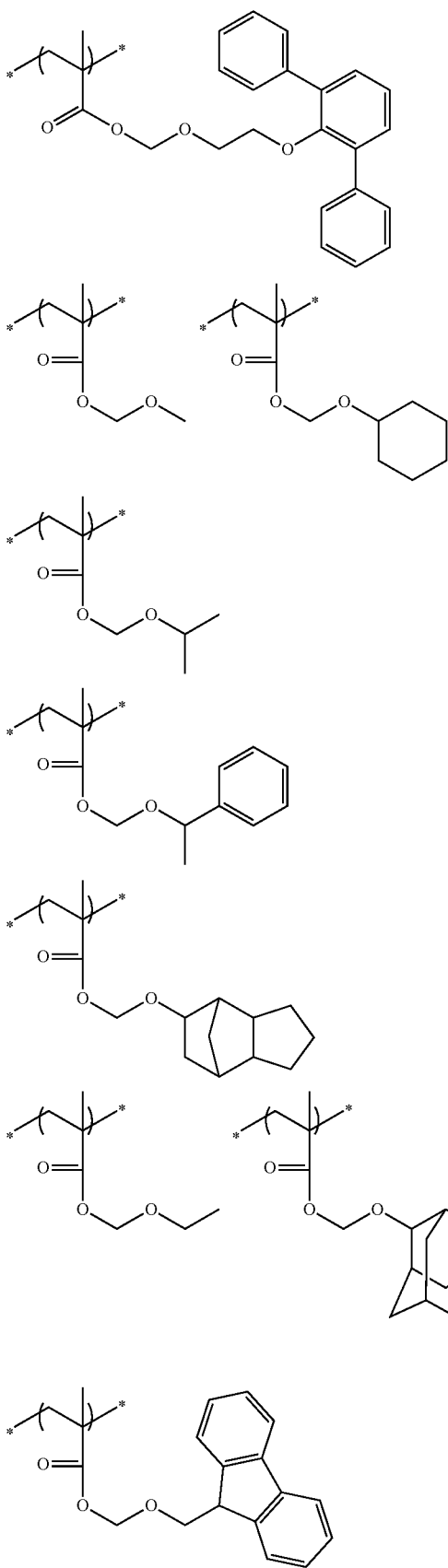

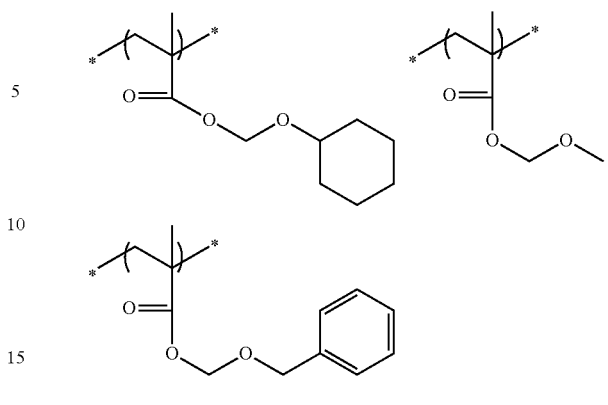

In addition, the resin (A) may include a repeating unit represented by General Formula (BZ).

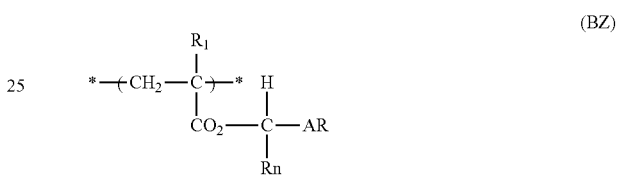

In General Formula (BZ), AR represents an aryl group. Rn represents an alkyl group, a cycloalkyl group, or an aryl group. Rn and AR may be bonded to each other to form a non-aromatic ring.

$R_1$ represents a hydrogen atom, an alkyl group, a cycloalkyl group, a halogen atom, a cyano group, or an alkyloxycarbonyl group.

Specific examples of the repeating unit represented by General Formula (BZ) are shown below, but the present invention is not limited thereto.

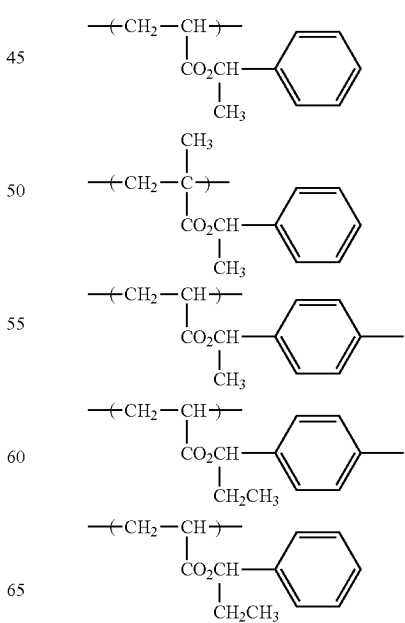

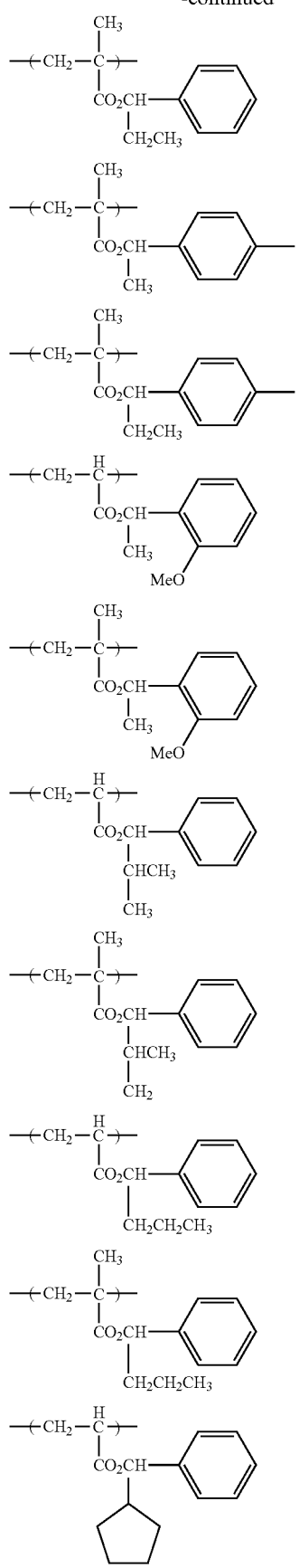
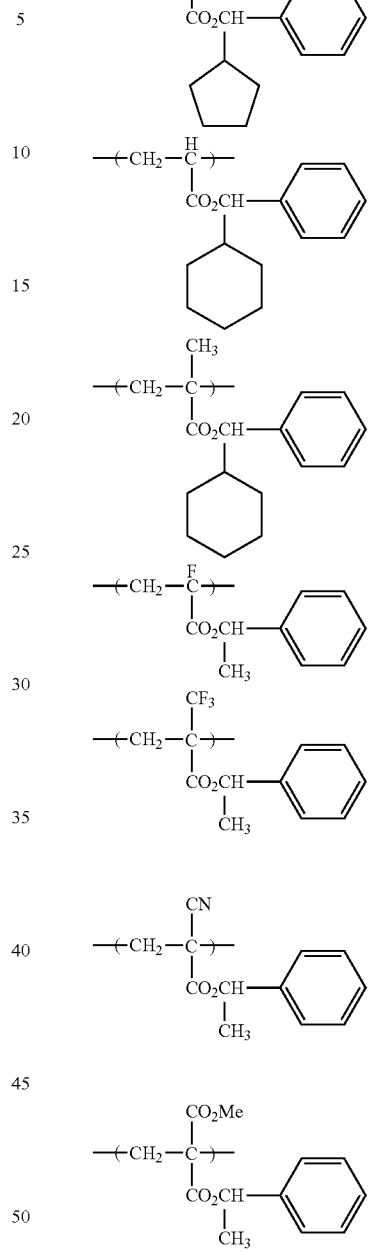

The repeating unit having an acid-decomposable group may be used singly or in combination of two or more kinds thereof.

The content of the repeating unit having an acid-decomposable group in the resin (A) (in a case where the resin (A) includes a plurality of repeating units having an acid-decomposable group, the total content thereof) is preferably from 5% by mole to 80% by mole, more preferably from 5% by mole to 75% by mole, and still more preferably from 10% by mole to 65% by mole, with respect to all the repeating units of the resin (A).

The resin (A) may contain a repeating unit represented by General Formula (V) or General Formula (VI).

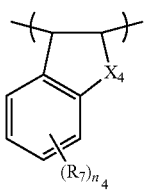
(V)

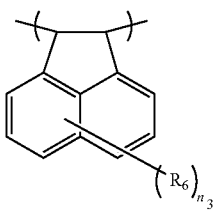
(VI)

In the formulae,

R₆ and R₇ each independently represent a hydrogen atom, a hydroxyl group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ is a methylene group, an oxygen atom, or a sulfur atom.

Specific examples of the repeating unit represented by General Formula (V) or General Formula (VI) are shown below, but the present invention is not limited thereto.

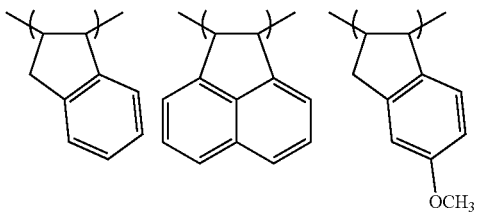

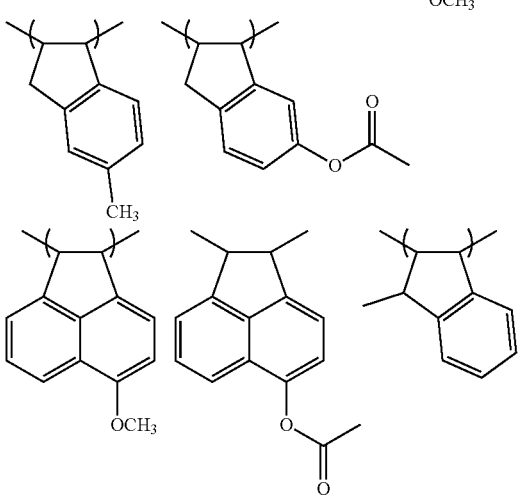

The resin (A) may further have a repeating unit having a silicon atom in a side chain. Examples of the repeating unit having a silicon atom in a side chain include a (meth) acrylate-based repeating unit having a silicon atom and a vinyl-based repeating unit having a silicon atom. The repeating unit having a silicon atom in a side chain is usually a repeating unit having a group having a silicon atom in a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, a dimethyltrimethylsiloxysilyl group, a cyclic or linear polysiloxane, and a cage-type or ladder-type or random-type silsesquioxane structure as described below. In the formulae, R and $R^1$ each independently represent a monovalent substituent. * represents a bond.

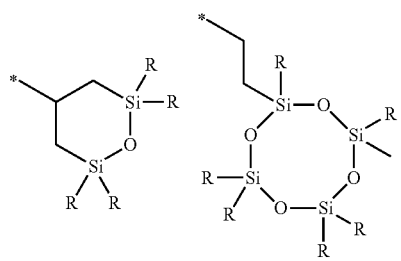

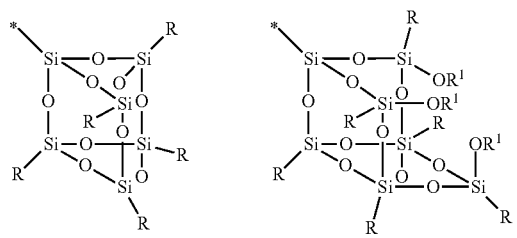

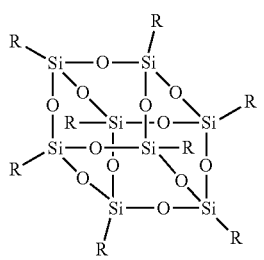

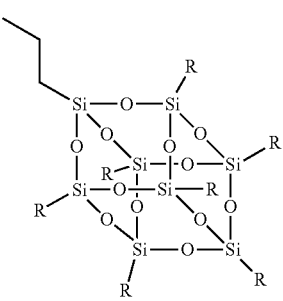

-continued

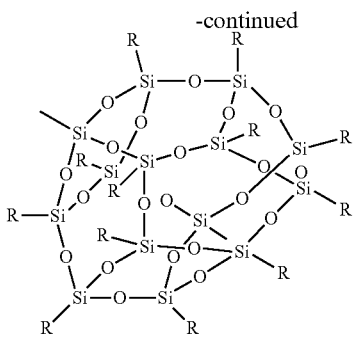

Suitable examples of the repeating units having the above-mentioned group include a repeating unit derived from an acrylate or methacrylate compound having the above-mentioned group, and a repeating unit derived from compound having the above-mentioned group and a vinyl group.

The repeating unit having a silicon atom is preferably a repeating unit having a silsesquioxane structure, whereby it is possible to express a very excellent collapse performance in the formation of an ultrafine pattern (for example, a pattern with a line width of 50 nm or less) having a cross-sectional shape of a high aspect ratio (for example, a ratio of film thickness/line width of 3 or more).

Examples of the silsesquioxane structure include a cage-type silsesquioxane structure, a ladder-type silsesquioxane structure, and a random-type silsesquioxane structure. Among those, preferred is a cage-type silsesquioxane structure.

Here, the cage-type silsesquioxane structure is a silsesquioxane structure having a cage-shaped skeleton. The cage-type silsesquioxane structure may be a complete cage-type silsesquioxane structure or an incomplete cage-type silsesquioxane structure, with the complete cage-type silsesquioxane structure being preferable.

Furthermore, the ladder-type silsesquioxane structure is a silsesquioxane structure having a ladder-shaped skeleton.

In addition, the random-type silsesquioxane structure is a silsesquioxane structure whose skeleton is of random.

The cage-type silsesquioxane structure is preferably a siloxane structure represented by Formula (S).

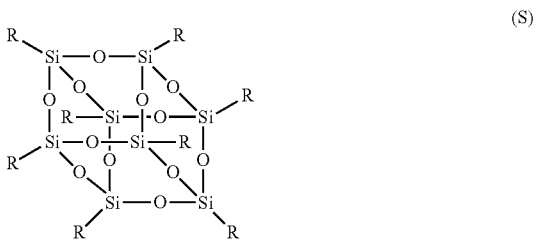

(S)

In Formula (S), R represents a monovalent organic group. R's present in plural number may be the same as or different from each other.

The organic group is not particularly limited, but specific examples thereof include a hydrocarbon group which may have a hydroxyl group, a nitro group, a carboxy group, an alkoxy group, an amino group, a mercapto group, a blocked mercapto group (for example, an acyl group-blocked (protected) mercapto group), an acyl group, an imido group, a phosphino group, a phosphinyl group, a silyl group, a vinyl group, or a heteroatom, a (meth)acrylic group-containing group, and an epoxy group-containing group.

Examples of the heteroatom in the hydrocarbon group which may have a heteroatom include an oxygen atom, a nitrogen atom, a sulfur atom, and a phosphorus atom.

Examples of the hydrocarbon group which may have a heteroatom include an aliphatic hydrocarbon group, an aromatic hydrocarbon group, and a group formed by a combination of these groups.

The aliphatic hydrocarbon group may be linear, branched or cyclic. Specific examples of the aliphatic hydrocarbon group include a linear or branched alkyl group (in particular, having 1 to 30 carbon atoms), a linear or branched alkenyl group (in particular, having 2 to 30 carbon atoms), and a linear or branched alkynyl group (in particular, having 2 to 30 carbon atoms).

Examples of the aromatic hydrocarbon group include aromatic hydrocarbon groups having 6 to 18 carbon atoms, such as a phenyl group, a tolyl group, a xylyl group, and a naphthyl group.

In the case where the resin (A) has a repeating unit having a silicon atom in the side chain, the content thereof is preferably 1% to 30% by mole, more preferably 5% to 25% by mole, and still more preferably 5% to 20% by mole, with respect to all repeating units in the resin (A).

(B) Compound (Photoacid Generator) Capable of Generating Acid by Actinic Rays or Radiation It is preferable that the actinic ray-sensitive or radiation-sensitive resin composition contains a compound (hereinafter also referred to as a "photoacid generator <<PAG>>") capable of generating an acid by actinic rays or radiation.

The photoacid generator may be in a form of a low molecular compound or in a form introduced into a part of a polymer. Further, a combination of the form of a low molecular compound and the form introduced into a part of a polymer may also be used.

In a case where the photoacid generator is in the form of a low molecular compound, the molecular weight thereof is preferably 3,000 or less, more preferably 2,000 or less, and still more preferably 1,000 or less.

In a case where the photoacid generator is included in a part of a polymer, it may be included in a part of the resin (A) or in a resin other than the resin (A).

In the present invention, it is preferable that the photoacid generator is in the form of a low molecular compound.

The photoacid generator is not particularly limited as long as it is a known photoacid generator, but the photoacid generator is preferably a compound capable of generating an organic acid, for example, at least one of sulfonic acid, bis(alkylsulfonyl)imide, or tris(alkylsulfonyl)methide, upon irradiation with actinic rays or radiation, and preferably electron beams or extreme ultraviolet rays.

More preferred examples of the photoacid generator include a compound represented by General Formula (ZI), (ZII), or (ZIII).

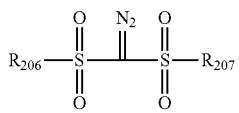

(ZIII)

In General Formula (ZI),

R$_{201}$, R$_{202}$, and R$_{203}$ each independently represent an organic group.

The number of carbon atoms in the organic group as R$_{201}$, R$_{202}$, and R$_{203}$ is generally 1 to 30, and preferably 1 to 20.

In addition, two out of R$_{201}$ to R$_{203}$ may be bonded to each other to form a ring structure, and the ring may contain therein an oxygen atom, a sulfur atom, an ester bond, an amide bond, or a carbonyl group. Examples of the group formed by the bonding of two of R$_{201}$ to R$_{203}$ include an alkylene group (for example, a butylene group and a pentylene group).

Z$^-$ represents a non-nucleophilic anion (anion having an extremely low ability of causing a nucleophilic reaction).

Examples of the non-nucleophilic anion include a sulfonate anion (such as an aliphatic sulfonate anion, an aromatic sulfonate anion, and a camphor sulfonate anion), a carboxylate anion (such as an aliphatic carboxylate anion, an aromatic carboxylate anion, and an aralkyl carboxylate anion), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and preferred examples thereof include a linear or branched alkyl group having 1 to 30 carbon atoms and a cycloalkyl group having 3 to 30 carbon atoms.

Preferred examples of the aromatic group in the aromatic sulfonate anion and the aromatic carboxylate anion include an aryl group having 6 to 14 carbon atoms, such as a phenyl group, a tolyl group, and a naphthyl group.

The alkyl group, the cycloalkyl group, and the aryl group exemplified above may have a substituent. Specific examples of the substituent include a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

The aryl group or the ring structure which is contained in each group may further have an alkyl group (preferably having 1 to 15 carbon atoms) as a substituent.

Preferred examples of the aralkyl group in the aralkyl carboxylate anion include an aralkyl group having 7 to 12 carbon atoms, such as a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with the fluorine atom and the fluorine atom-substituted alkyl group being preferable.

In addition, the alkyl groups in the bis(alkylsulfonyl) imide anion may be bonded to each other to form a ring structure. Thus, the acid strength is increased.

Other examples of the non-nucleophilic anion include fluorinated phosphorus (for example, PF$_6^-$), fluorinated boron (for example, BF$_4^-$), and fluorinated antimony (for example, SbF$_6^-$).

The non-nucleophilic anion is preferably an aliphatic sulfonate anion substituted with a fluorine atom at least at the a-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (still more preferably having 4 to 8 carbon atoms) or a fluorine atom-containing benzenesulfonate anion, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of the acid strength, it is preferable that the pKa of the acid generated is −1 or less so as to improve the sensitivity.

Moreover, an anion represented by General Formula (AN1) may also be mentioned as a preferred embodiment of the non-nucleophilic anion.

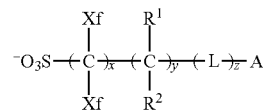

(AN1)

In the formula,

Xf's each independently represent a fluorine atom or an alkyl group substituted with at least one fluorine atom.

R$^1$ and R$^2$ each independently represent a hydrogen atom, a fluorine atom, or an alkyl group, and in a case where R$^1$'s and R$^2$'s are present in plural numbers, R$^1$'s and R$^2$'s may be the same as or different from each other.

L represents a divalent linking group, and in a case where L's are present in plural number, L's may be the same as or different from each other.

A represents a cyclic organic group.

x represents an integer of 1 to 20, y represent an integer of 0 to 10, and z represents an integer of 0 to 10.

General Formula (AN1) will be described in more detail.

As the alkyl group in the alkyl group substituted with a fluorine atom of Xf, an alkyl group having 1 to 10 carbon atoms is preferable, and an alkyl group having 1 to 4 carbon atoms is more preferable. In addition, as the alkyl group in the alkyl group substituted with a fluorine atom, of Xf, a perfluoroalkyl group is preferable.

Xf is preferably a fluorine atom or a perfluoroalkyl group having or 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom or $CF_3$ is preferable.

In particular, it is preferable that both Xf's are a fluorine atom.

The alkyl group of $R^1$ and $R^2$ may have a substituent (preferably a fluorine atom), and an alkyl group having 1 to 4 carbon atoms is preferable. A perfluoroalkyl group having 1 to 4 carbon atoms is more preferable. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

$R^1$ and $R^2$ are preferably a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent linking group of L is not particularly limited, and examples thereof include —COO—, —OCO—, —CO—, —O—, —S—, —SO—, —SO$_2$-, an alkylene group, a cycloalkylene group, an alkenylene group, a linking group obtained by linking a plurality of these groups to each other, with the linking group having 12 or less carbon atoms in total being preferable. Among these, —COO—, —OCO—, —CO—, or —O— is preferable, and —COO— or —OCO— is more preferable.

In General Formula (ANI), preferred examples of a combination of partial structures other than A include $SO^{3-}$—$CF_2$—$CH_2$—OCO—, $SO^{3-}$—$CF_2$—CHF—$CH_2$—OCO—, $SO^{3-}$—$CF_2$—COO—, $SO^{3-}$—$CF_2$—$CF_2$—$CH_2$—, and $SO^{3-}$—$CF_2$—$CH(CF_3)$—OCO—.

The cyclic organic group of A is not particularly limited as long as it has a cyclic structure, and examples thereof include an alicyclic group, an aryl group, a heterocyclic group (including not only an aromatic heterocyclic group but also a non-aromatic heterocyclic group).

The alicyclic group may be monocyclic or polycyclic, and a monocycloalkyl group such as a cyclopentyl group, a cyclohexyl group, and a cyclooctyl group, or a polycycloalkyl group such as a norbornyl group, a tricyclodecanyl group, a tetracyclodecanyl group, a tetracyclododecanyl group, and an adamantyl group is preferable. Among these, an alicyclic group with a bulky structure, having 7 or more carbon atoms, such as a norbornyl group, a tricyclodecanyl group, a tetracyclodecanyl group, a tetracyclododecanyl group, and an adamantyl group is preferable from the viewpoints of suppressing in-film diffusion in a heating step after exposure and improving a mask error enhancement factor (MEEF).

Examples of the aryl group include a benzene ring, a naphthalene ring, a phenanthrene ring, and an anthracene ring.

Examples of the heterocyclic group include a furan ring, a thiophene ring, a benzofuran ring, a benzothiophene ring, a dibenzofuran ring, a dibenzothiophene ring, and a group derived from a pyridine ring. Among these, a furan ring, a thiophene ring, or a group derived from a pyridine ring is preferable.

Moreover, examples of the cyclic organic group include a lactone structure, and specific examples thereof include lactone structures represented by General Formulae (LC1-1) to (LC1-17).

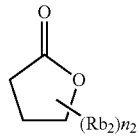
LC1-1

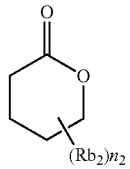
LC1-2

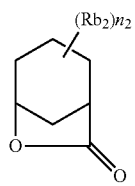
LC1-3

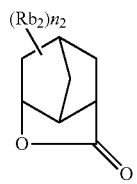
LC1-4

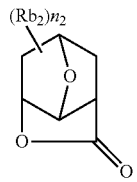
LC1-5

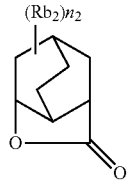
LC1-6

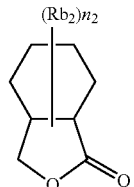
LC1-7

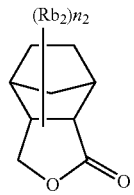
LC1-8

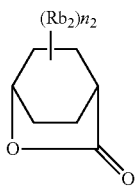
LC1-9

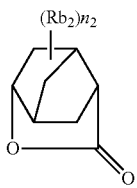
LC1-10

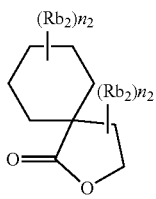
LC1-11

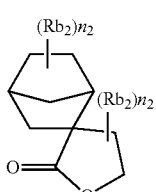
LC1-12

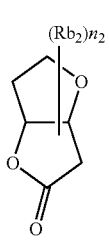
LC1-13

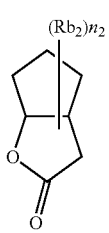
LC1-14

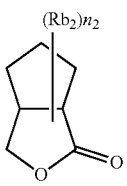
LC1-15

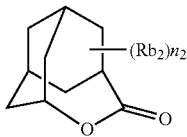
LC1-16

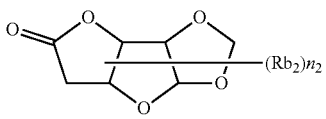
LC1-17

The cyclic organic group may have a substituent, and examples of the substituent include an alkyl group (which may be linear, branched, or cyclic, and preferably has 1 to 12 carbon atoms), a cycloalkyl group (which may be any of a monocycle, a polycycle, or a spiro ring, and preferably has 3 to 20 carbon atoms), an aryl group (which may be linear, branched, or aryl, and preferably has 6 to 14 carbon atoms), a hydroxyl group, an alkoxy group, an ester group, an amido group, a urethane group, an ureido group, a thioether group, a sulfonamide group, and a sulfonate group. Incidentally, the carbon (carbon contributing to ring formation) constituting the cyclic organic group may be carbonyl carbon.

Furthermore, the substituent corresponds to $Rb_2$ in (LC1-1) to (LC1-17). Further, in (LC1-1) to (LC1-17), $n_2$ represents an integer of 0 to 4. In a case where $n_2$ is 2 or more, Rb2's which are present in plural number may be the same as or different from each other, and Rb2's which are present in plural number may be bonded to each other to form a ring.

In General Formula (ZI), examples of the organic group of $R_{201}$, $R_{202}$, and $R_{203}$ include an aryl group, an alkyl group, and a cycloalkyl group.

It is preferable that at least one of $R_{201}$, $R_{202}$, or $R_{203}$ is an aryl group, and it is more preferable that all of $R_{201}$, $R_{202}$, or $R_{203}$ represent an aryl group. As the aryl group, not only a phenyl group or a naphthyl group but also a heteroaryl group such as an indole residue or a pyrrole residue may be used. As the alkyl group and the cycloalkyl group of $R_{201}$ to $R_{203}$, a linear or branched alkyl group having 1 to 10 carbon atoms or a cycloalkyl group having 3 to 10 carbon atoms is preferable. As the alkyl group, a methyl group, an ethyl group, a n-propyl group, an i-propyl group, or a n-butyl group is more preferable. As the cycloalkyl group, a cyclopropyl group, a cyclobutyl group, a cyclopentyl group, a cyclohexyl group, or a cycloheptyl group is more preferable. Each of the groups may further have a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), but the present invention is not limited thereto.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

As the aryl group of $R_{204}$ to $R_{207}$, a phenyl group or a naphthyl group is preferable, and a phenyl group is more preferable. The aryl group of $R_{204}$ to $R_{207}$ may be an aryl group having a heterocyclic structure having an oxygen atom, a nitrogen atom, a sulfur atom, or the like. Examples of the framework of the aryl group having a heterocyclic structure include pyrrole, furan, thiophene, indole, benzofuran, and benzothiophene.

Preferred examples of the alkyl group and the cycloalkyl group for $R_{204}$ to $R_{207}$ include a linear or branched alkyl group having 1 to 10 carbon atoms (for example, a methyl group, an ethyl group, a propyl group, a butyl group, and a pentyl group) and a cycloalkyl group having 3 to 10 carbon atoms (for example, a cyclopentyl group, a cyclohexyl group, and a norbornyl group).

The aryl group, the alkyl group, and the cycloalkyl group of $R_{204}$ to $R_{207}$ may have a substituent, and examples of the substituent which may be contained in the aryl group, the alkyl group, and the cycloalkyl group of $R_{204}$ to $R_{207}$ include an alkyl group (for example, an alkyl group having 1 to 15 carbon atoms), a cycloalkyl group (for example, a cycloalkyl group having 3 to 15 carbon atoms), an aryl group (for example, an aryl group having 6 to 15 carbon atoms), an alkoxy group (for example, an alkoxy group having 1 to 15 carbon atoms), a halogen atom, a hydroxyl group, and a phenylthio group.

Furthermore, in General Formula (ZII), $Z^-$ represents a non-nucleophilic anion, and specifically, it has the same definition and the same preferred embodiment as the one described as $Z^-$ in General Formula (ZI).

Specific examples of General Formulae (ZI) to (ZIII) are shown below, but are not limited thereto.

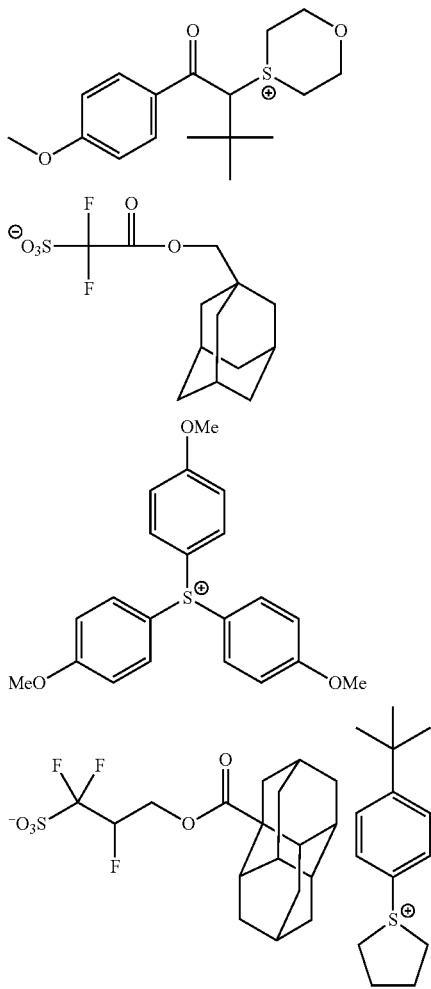

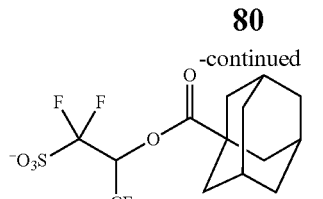

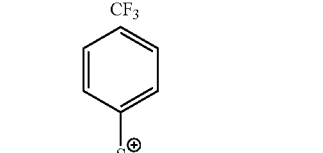

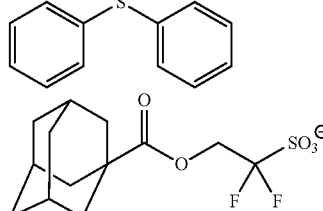

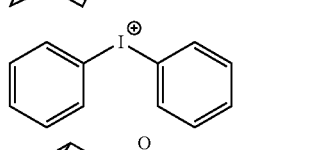

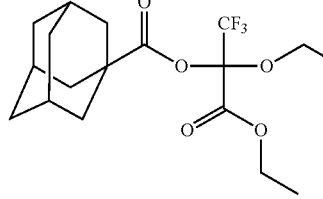

In the present invention, from the viewpoint of suppressing diffusion of an acid generated by exposure to a non-exposed area and improving resolution, the photoacid generator is preferably a compound which generates an acid (more preferably sulfonic acid) having a volume of 130 Å$^3$ or more upon irradiation with electron beams or extreme ultraviolet rays, more preferably a compound which generates an acid (more preferably sulfonic acid) having a volume of 190 Å$^3$ or more, still more preferably a compound which generates an acid (more preferably sulfonic acid) having a volume of 270 Å$^3$ or more, and particularly preferably a compound which generates an acid (more preferably sulfonic acid) having a volume of 400 Å$^3$ or more. From the viewpoints of sensitivity and coating solvent solubility, the volume is preferably 2,000 Å$^3$ or less, and more preferably 1,500 Å$^3$ or less. A value of the volume is obtained using "WinMOPAC" manufactured by FUJITSU. That is, a chemical structure of an acid according to each example is input, and then the most stable conformation of each acid is determined through a molecular field calculation using a MM3 method with the input chemical structure as an initial structure. Next, a molecular orbital calculation is carried out on the most stable conformation using a PM3 method, and as a result, "accessible volume" of each acid can be calculated. Further, 1 Å$^3$ means 0.1 nm.

In the present invention, the photoacid generators capable of generating an acid exemplified below upon irradiation with actinic rays or radiation are preferable. In some of the examples, a calculated value of the volume is added (unit: Å$^3$). Further, the value as calculated herein is a value of the volume of an acid in which a proton is bonded to the anion portion.

585 Å³
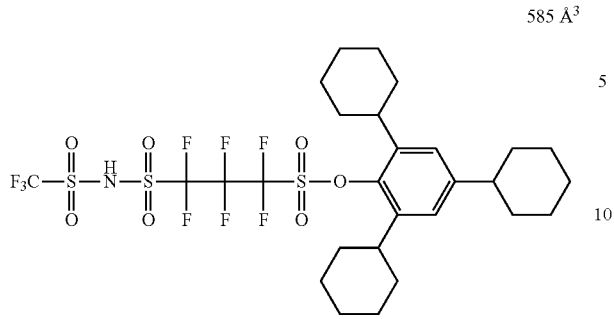
437 Å³
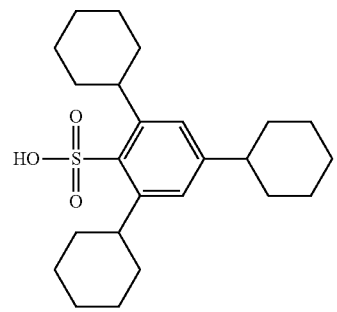
585 Å³
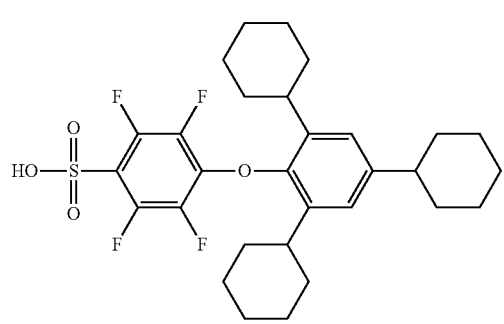
244 Å³
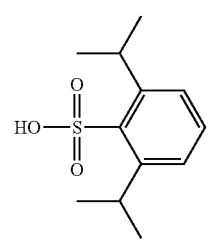
525 Å³
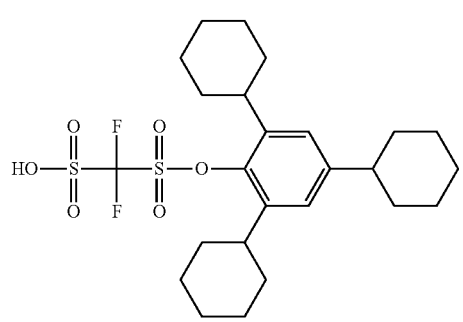
529 Å³
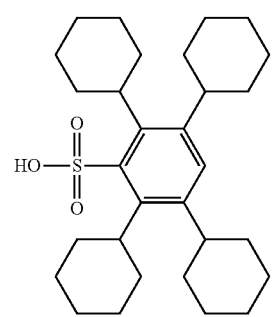
554 Å³
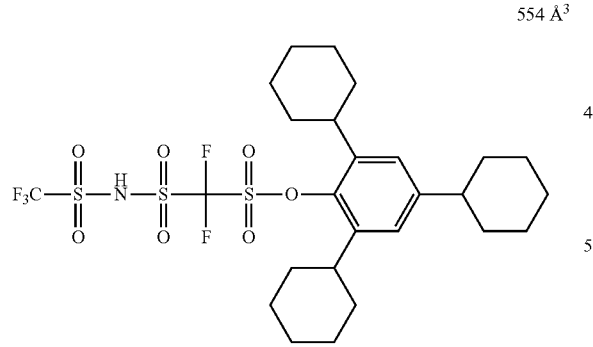
336 Å³
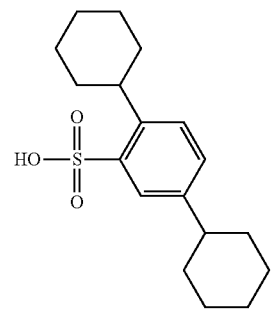
244 Å³
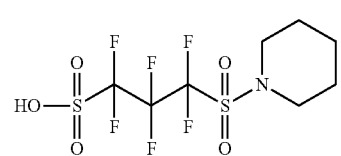
303 Å³
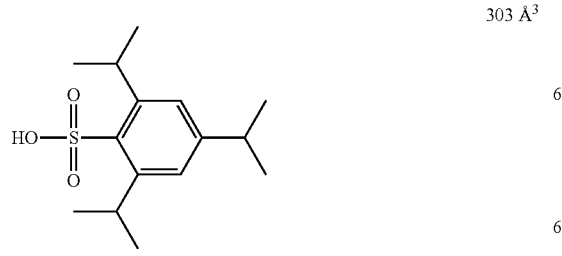
271 Å³
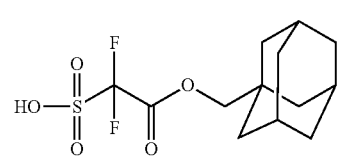

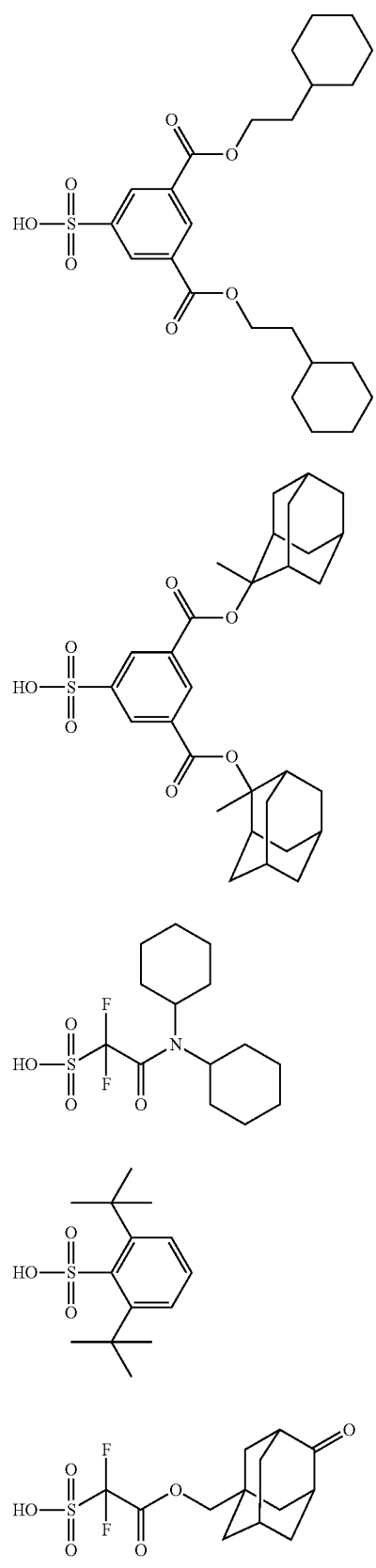

-continued
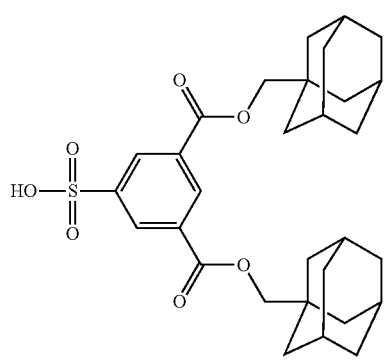
519 Å³
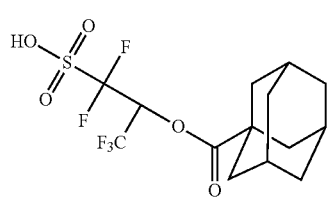
291 Å³
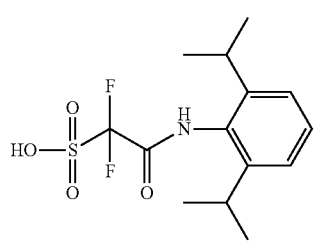
297 Å³
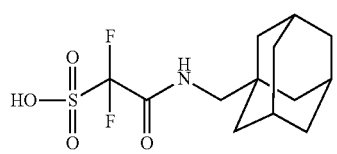
277 Å³
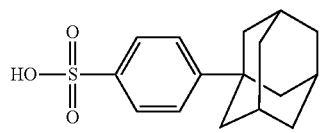
281 Å³
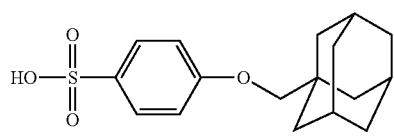
310 Å³
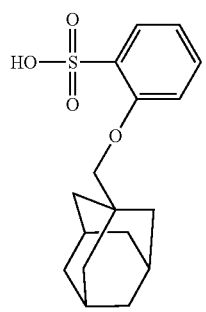
309 Å³
-continued
270 Å³
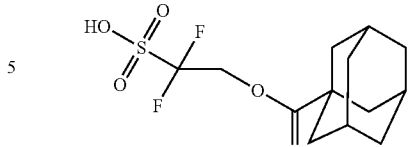
393 Å³
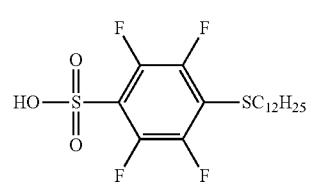
350 Å³
311 Å³
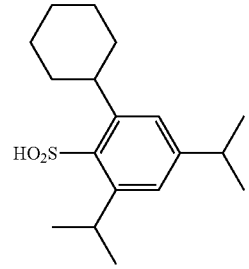
250 Å³
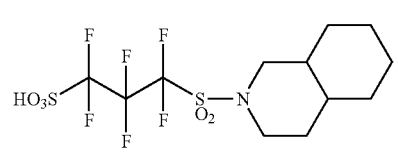
535 Å³
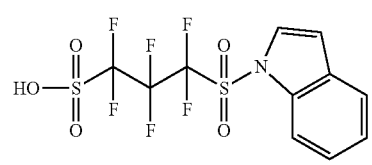
290 Å³
315 Å³
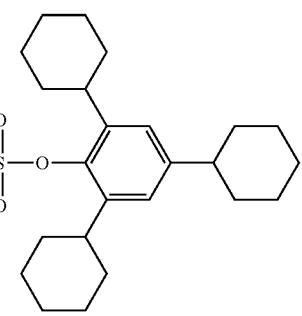
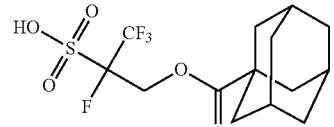
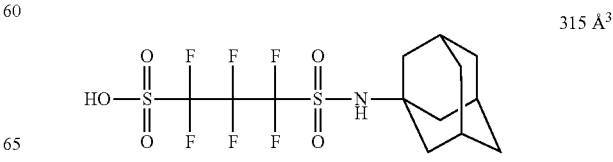

With regard to the photoacid generator, reference can be made to paragraphs [0368] to [0377] of JP2014-41328A and paragraphs [0240] to [0262] of JP2013-228681A (paragraph [0339] of the corresponding US2015/004533A), the content of which is incorporated herein by reference. In addition, specific preferred examples include, but are not limited to, the following compounds.
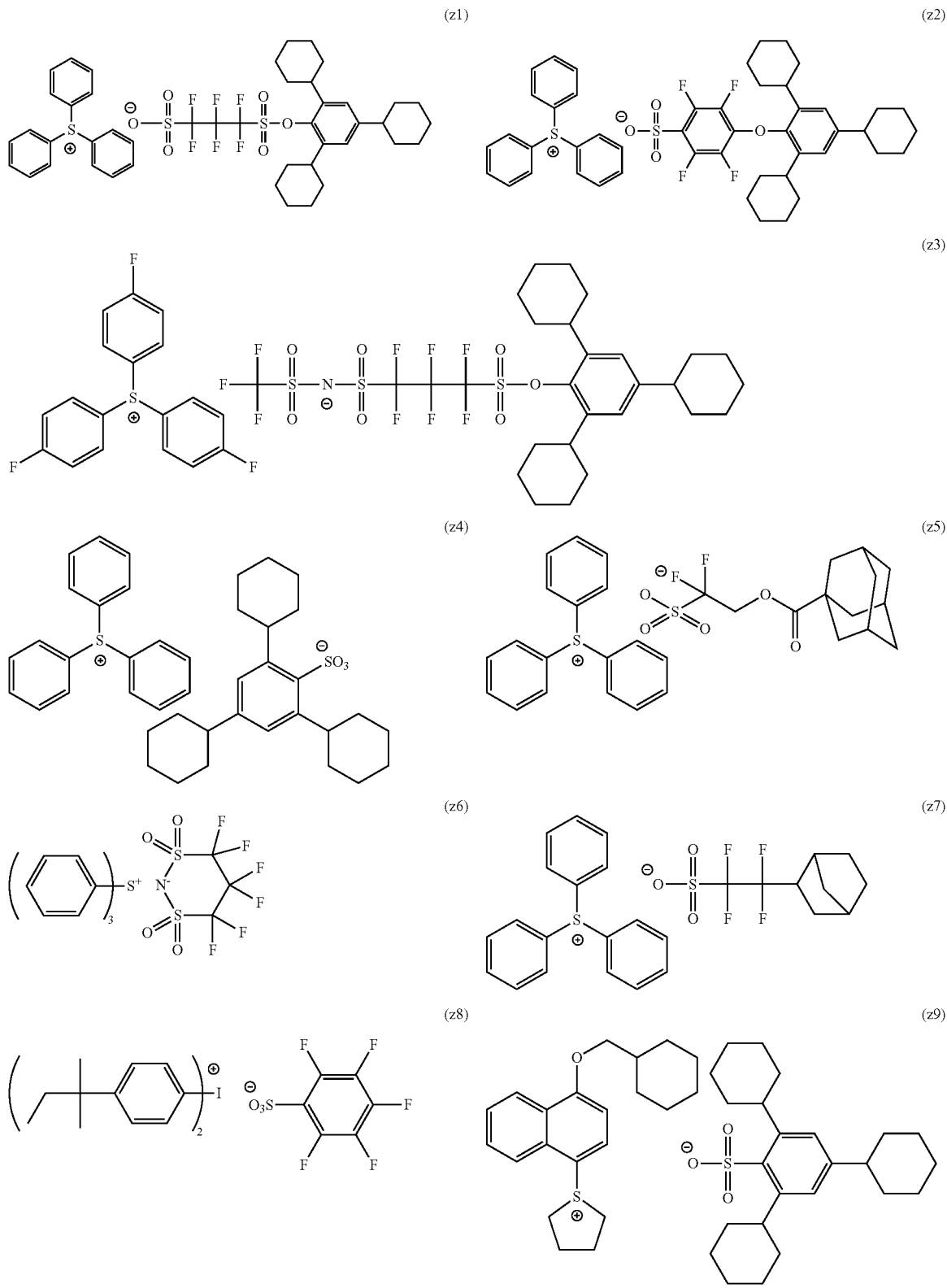

-continued
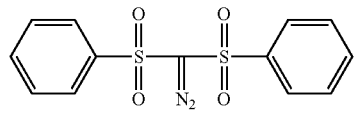
(z10)
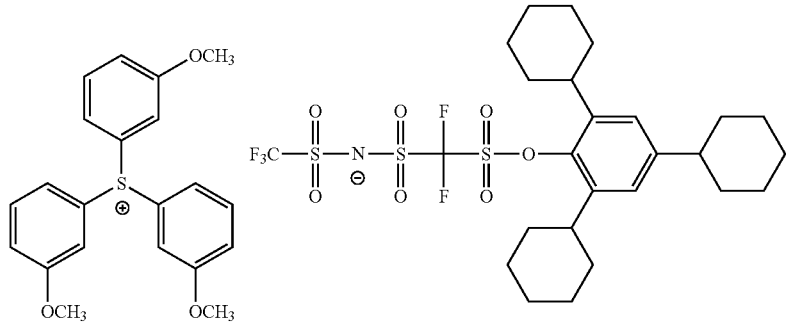
(z11)
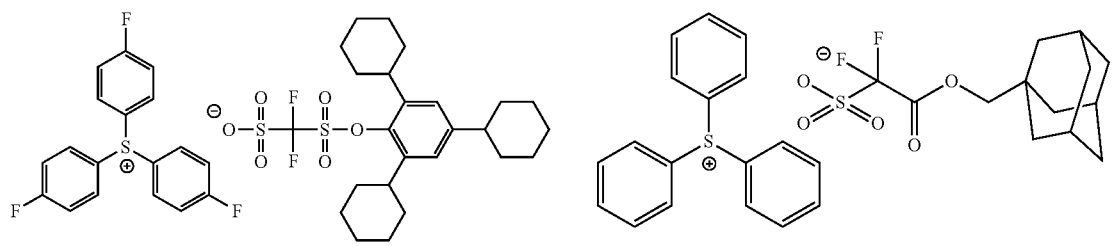
(z12) (z13)
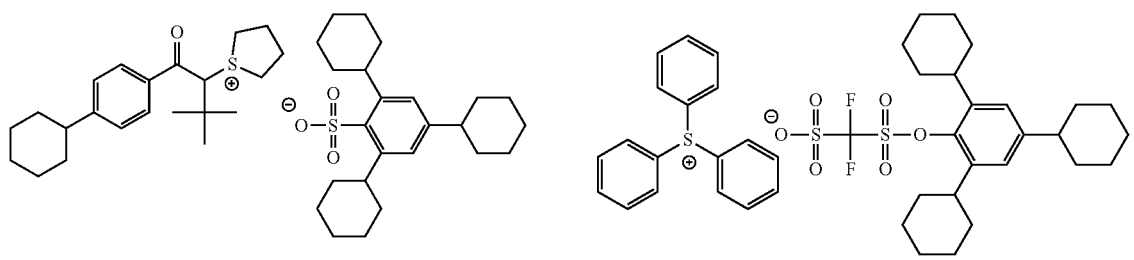
(z14) (z15)
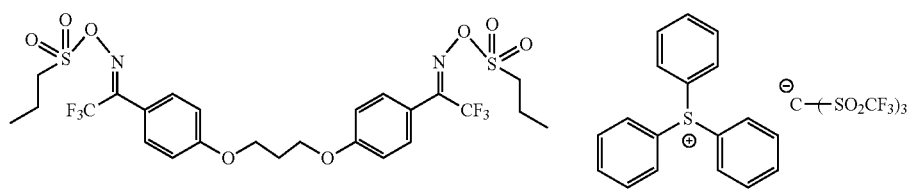
(z16) (z17)
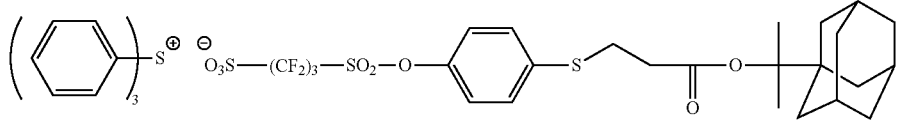
(z18)

-continued
(z19)
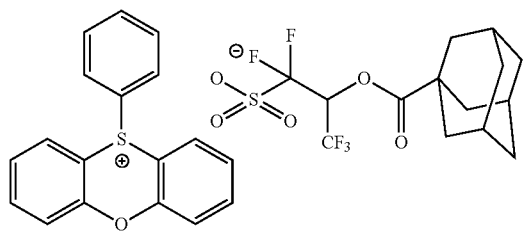
(z20)
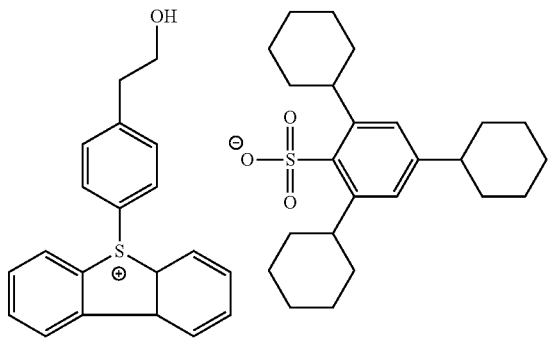
(z21)
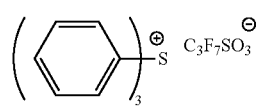
(z22)
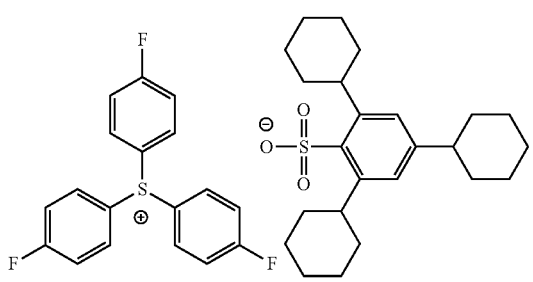
(z23)
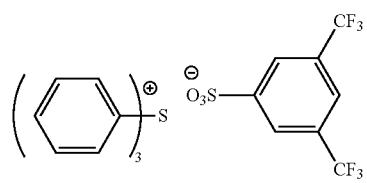
(z24)
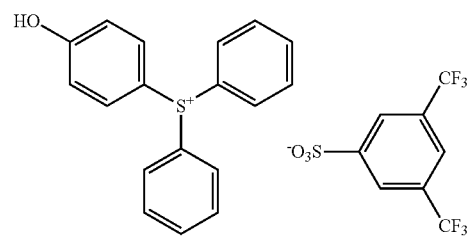
(z25)
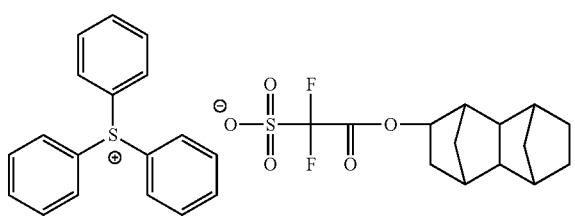
(z26)
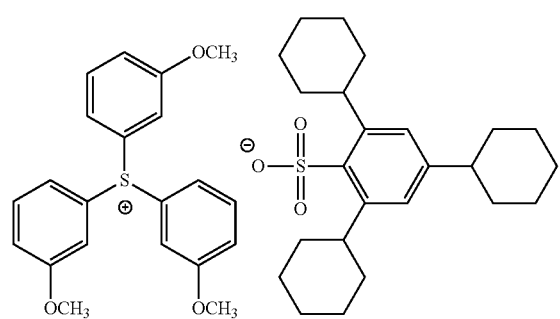

-continued
(z27)
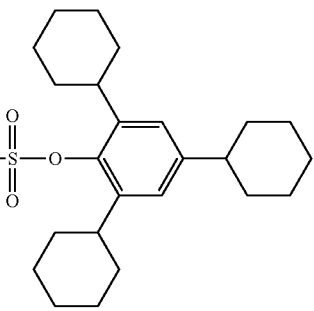
(z28)
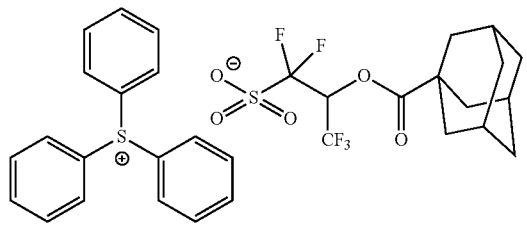
(z29)
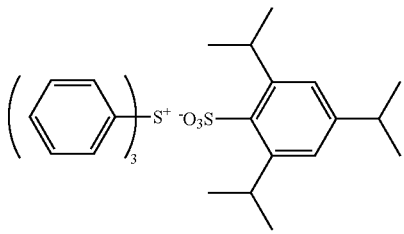
(z30)
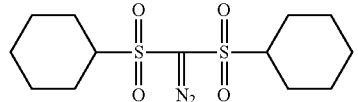
B-1
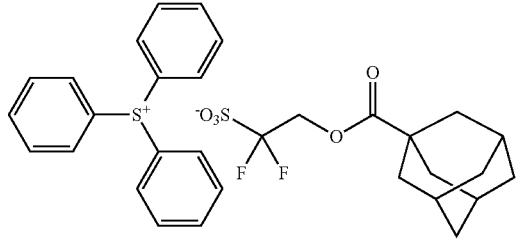
B-2
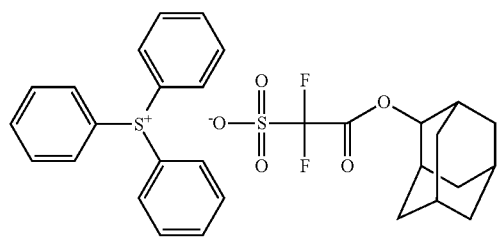
B-3
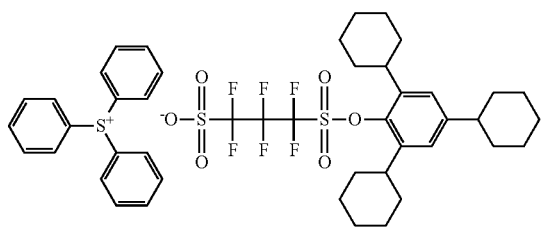
B-4
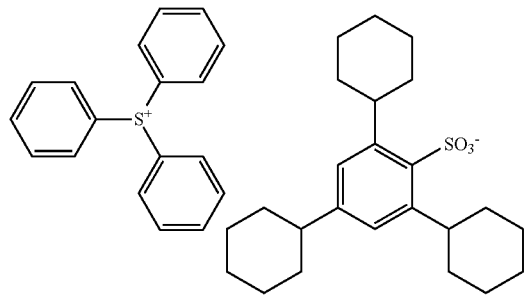
B-5
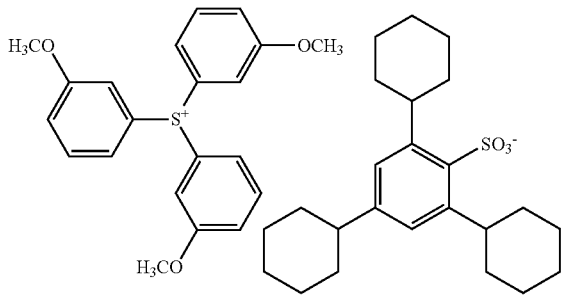

-continued

B-6
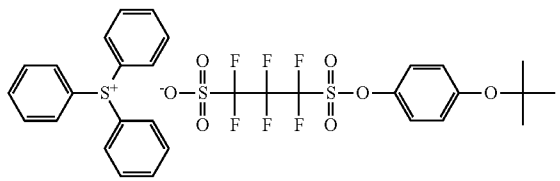

B-7
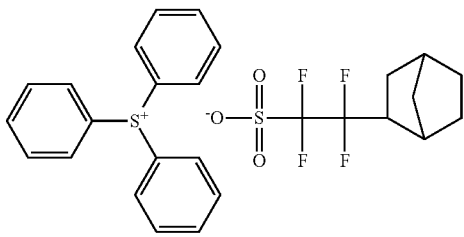

B-8
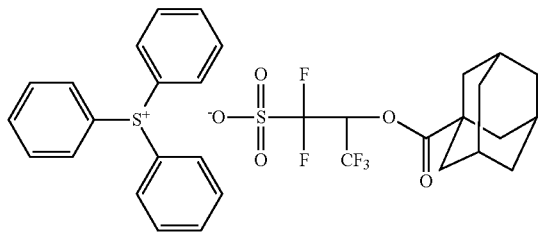

B-9
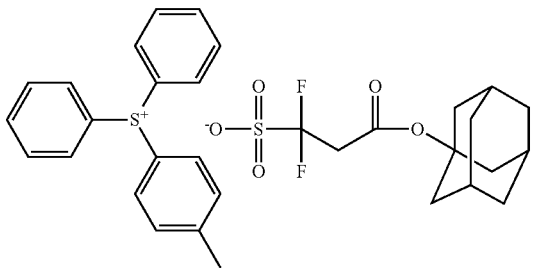

B-10
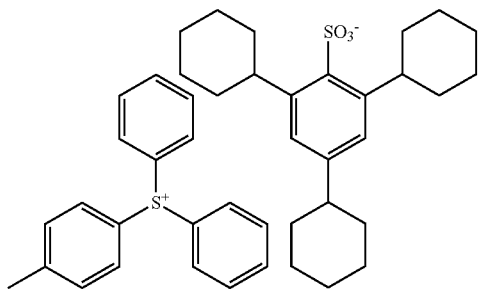

B-11
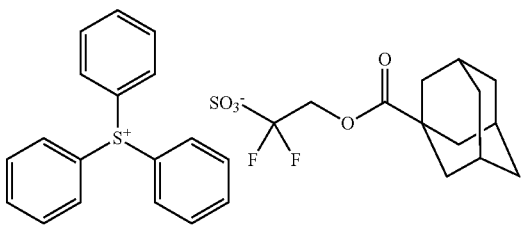

B-12
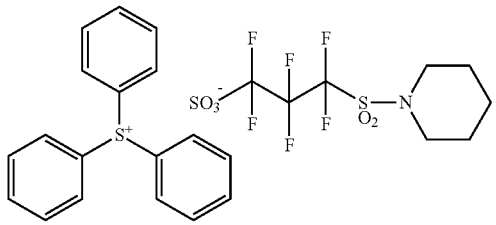

B-13
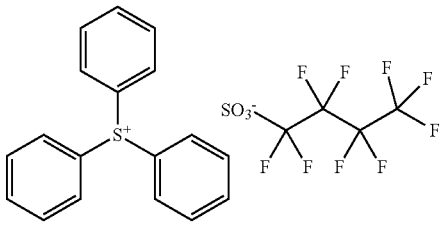

The photoacid generator may be used singly or in combination of two or more kinds thereof.

The content of the photoacid generator in the actinic ray-sensitive or radiation-sensitive resin composition is preferably 0.1% to 50% by mass, more preferably 5% to 50% by mass, and still more preferably 8% to 40% by mass with respect to the total solid content of the composition. In particular, in order to simultaneously realize high sensitivity and high resolution upon irradiation of electron beams or extreme ultraviolet rays, the content of the photoacid generator is preferably high, more preferably 10% to 40% by mass, and still more preferably 10% to 35% by mass.

(C) Solvent

In order to dissolve the respective components to prepare the actinic ray-sensitive or radiation-sensitive resin composition, a solvent can be used. Examples of the solvent used include organic solvents such as alkylene glycol monoalkyl ether carboxylate, alkylene glycol monoalkyl ether, alkyl lactate, alkyl alkoxy propionate, cyclic lactone having 4 to 10 carbon atoms, a monoketone compound having 4 to 10 carbon atoms, which may include a ring, alkylene carbonate, alkyl alkoxy acetate, and alkyl pyruvate, As the alkylene glycol monoalkyl ether carboxylate, for example, propylene glycol monomethyl ether acetate, propylene glycol monoethyl ether acetate, propylene glycol propyl ether acetate, propylene glycol monobutyl ether acetate, propylene glycol monomethyl ether propionate, propylene glycol monoethyl ether propionate, ethylene glycol monomethyl ether acetate, or ethylene glycol monoethyl ether acetate is preferable.

As the alkylene glycol monoalkyl ether, for example, propylene glycol monomethyl ether, propylene glycol monoethyl ether, propylene glycol monopropyl ether, propylene glycol monobutyl ether, ethylene glycol monomethyl ether, or ethylene glycol monoethyl ether is preferable.

As the alkyl lactate, for example, methyl lactate, ethyl lactate, propyl lactate, or butyl lactate is preferable.

As the alkyl alkoxy propionate, for example, 3-ethyl ethoxypropionate, 3-methyl methoxypropionate, 3-methyl ethoxypropionate, or ethyl 3-methoxypropionate is preferable.

As the cyclic lactone having 4 to 10 carbon atoms, for example, β-propiolactone, β-butyrolactone, γ-butyrolactone, a-methyl-γ-butyrolactone, β-methyl-γ-butyrolactone, γ-valerolactone, γ-caprolactone, γ-octanoic lactone, or a-hydroxy-γ-butyrolactone is preferable.

As the monoketone compound having 4 to 10 carbon atoms, which may contain a ring, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, or 3-methylcycloheptanone is preferable.

As the alkylene carbonate, for example, propylene carbonate, vinylene carbonate, ethylene carbonate, or butylene carbonate is preferable.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

As the alkyl pyruvate, for example, methyl pyruvate, ethyl pyruvate, or propyl pyruvate is preferable.

Examples of the solvent which can be preferably used include a solvent having a boiling point of 130° C. or more at a normal temperature under a normal pressure. Specific examples of the solvent include cyclopentanone, γ-butyrolactone, cyclohexanone, ethyl lactate, ethylene glycol monoethyl ether acetate, propylene glycol monomethyl ether acetate, 3-ethyl ethoxypropionate, ethyl pyruvate, 2-ethoxyethyl acetate, 2-(2-ethoxyethoxy)ethyl acetate, and propylene carbonate.

In the present invention, the solvents may be used singly or in combination of two or more kinds thereof.

In the present invention, as the organic solvent, a mixed solvent in which a solvent containing a hydroxyl group in a structure is mixed with a solvent containing no hydroxyl group may be used.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether or ethyl lactate is preferable.

Examples of the solvent containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide, and among these, propylene glycol monomethyl ether acetate, ethyl ethoxypropionate, 2-heptanone, γ-butyrolactone, cyclohexanone, or butyl acetate is preferable, and propylene glycol monomethyl ether acetate, ethyl ethoxypropionate, or 2-heptanone is more preferable.

A mixing ratio of the solvent containing a hydroxyl group to the solvent containing no hydroxyl group is preferably 1/99 to 99/1, more preferably 10/90 to 90/10, and still more preferably 20/80 to 60/40 by mass. In particular, a mixed solvent containing 50% by mass or more of the solvent containing no hydroxyl group is preferable from the viewpoint of coating uniformity.

It is preferable that the solvent is a mixed solvent containing two or more propylene glycol monomethyl ether acetates.

As the solvent, for example, the solvents described in paragraphs 0013 to 0029 of JP2014-219664A can also be used.

(E) Basic Compound

In order to reduce a change in performance with the lapse of time from exposure to heating, it is preferable that the actinic ray-sensitive or radiation-sensitive resin composition includes a basic compound (E).

Preferred examples of the basic compound include compounds having structures represented by General Formulae (A) to (E).

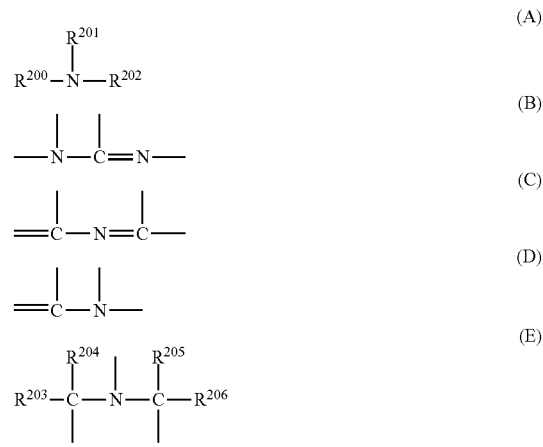

In General Formulae (A) and (E), $R^{200}$, $R^{201}$, and $R^{202}$ may be the same as or different from each other and each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms). Here, $R^{201}$ and $R^{202}$ may be bonded to each other to form a ring.

As the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other and each independently represent an alkyl group having 1 to 20 carbon atoms.

It is more preferable that the alkyl group in General Formulae (A) and (E) is unsubstituted.

Preferred examples of the compound include, in addition to guanidine, aminopyrrolidine, pyrazole, pyrazoline, piperazine, aminomorpholine, aminoalkylmorpholine, and piperidine, a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]nona-5-ene, and 1,8-diazabicyclo[5,4,0]undeca-7-ene. Examples of the compound having an onium hydroxide structure include triarylsulfonium hydroxide, phenacyl sulfonium hydroxide, and sulfonium hydroxide having a 2-oxoalkyl group, and specific examples thereof include triphenylsulfonium hydroxide, tris(t-butylphenyl) sulfonium hydroxide, bis(t-butylphenyl)iodonium hydroxide, phenacyl thiophenium hydroxide, and 2-oxopropylthiophenium hydroxide. The compound having an onium carboxylate structure is a compound obtained by carboxylation of the anionic moiety of a compound having an onium hydroxide structure, and examples thereof include acetate, adamantane-1-carboxylate, and perfluoroalkyl carboxylate. Examples of the compound having trialkylamine structure include tri-(n-butyl)amine and tri-(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound also include an amine compound having a phenoxy group and an ammonium salt compound having a phenoxy group.

As the amine compound, a primary, secondary, or tertiary amine compound can be used, and an amine compound in which at least one alkyl group is bonded to a nitrogen atom is preferable. It is more preferable that the amine compound is a tertiary amine compound. In the amine compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the amine compound has an oxygen atom at an alkyl chain to form an oxyalkylene group. The number of oxyalkylene groups in a molecule is 1 or more, preferably 3 to 9, and still more preferably 4 to 6. Among the oxyalkylene groups, an oxyethylene group ($—CH_2CH_2O—$) or an oxypropylene group ($—CH(CH_3)CH_2O—$ or $—CH_2CH_2CH_2O—$) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. In the ammonium salt compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the ammonium salt compound has an oxygen atom at an alkyl chain to form an oxyalkylene group. The number of oxyalkylene groups is 1 or more, preferably 3 to 9, and still more preferably 4 to 6 in a molecule. Among the oxyalkylene groups, an oxyethylene group ($—CH_2CH_2O—$) or an oxypropylene group ($—CH(CH_3)CH_2O—$ or $—CH_2CH_2CH_2O—$) is preferable, and an oxyethylene group is more preferable.

Examples of an anion of the ammonium salt compound include a halogen atom, a sulfonate, a borate, and a phosphate, and among these, a halogen atom or a sulfonate is preferable. As the halogen atom, a chloride, a bromide, or an iodide is preferable. As the sulfonate, an organic sulfonate having 1 to 20 carbon atoms is preferable. Examples of the organic sulfonate include an alkyl sulfonate having 1 to 20 carbon atoms and an aryl sulfonate. The alkyl group of the alkyl sulfonate may have a substituent, and examples of the substituent include fluorine, chlorine, bromine, an alkoxy group, an acyl group, and an aryl group. Specific examples of the alkyl sulfonate include methane sulfonate, ethane sulfonate, butane sulfonate, hexane sulfonate, octane sulfonate, benzyl sulfonate, trifluoromethane sulfonate, pentafluoromethane sulfonate, and nonafluoromethane sulfonate. Examples of the aryl group of the aryl sulfonate include a benzene ring, a naphthalene ring, and an anthracene ring. The benzene ring, the naphthalene ring, and the anthracene ring may have a substituent. As the substituent, a linear or branched alkyl group having 1 to 6 carbon atoms or a cycloalkyl group having 3 to 6 carbon atoms is preferable. Specific examples of the linear or branched alkyl group and the cycloalkyl group include methyl, ethyl, n-propyl, isopropyl, n-butyl, i-butyl, t-butyl, n-hexyl, and cyclohexyl. Other examples of the substituent include an alkoxy group having 1 to 6 carbon atoms, a halogen atom, cyano, nitro, an acyl group, and an acyloxy group.

The amine compound having a phenoxy group or the ammonium salt compound having a phenoxy group is an amine compound or an ammonium salt compound having a phenoxy group at a terminal of an alkyl group opposite to a nitrogen atom. The phenoxy group may have a substituent. Examples of the substituent of the phenoxy group include an alkyl group, an alkoxy group, a halogen atom, a cyano group, a nitro group, a carboxyl group, a carboxylate group, a sulfonate group, an aryl group, an aralkyl group, an acyloxy group, and an aryloxy group. The substitution position of the substituent may be any one of the 2- to 6-positions. The number of substituents is 1 to 5.

It is preferable that at least one oxyalkylene group is present between a phenoxy group and a nitrogen atom. The number of oxyalkylene groups is 1 or more, preferably 3 to 9, and still more preferably 4 to 6 in a molecule. Among the oxyalkylene groups, an oxyethylene group ($—CH_2CH_2O—$) or an oxypropylene group ($—CH(CH_3)CH_2O—$ or $—CH_2CH_2CH_2O—$) is preferable, and an oxyethylene group is more preferable.

The amine compound having a phenoxy group can be obtained by heating a primary or secondary amine having a phenoxy group and a haloalkyl ether to react with each other, adding an aqueous solution of a strong base such as sodium hydroxide, potassium hydroxide, and tetraalkylammonium to the obtained reaction product, and carrying out extraction with an organic solvent such as ethyl acetate and chloroform. Alternatively, the amine compound having a phenoxy group can be obtained by heating a primary or secondary amine and haloalkyl ether having a phenoxy group at a terminal to react with each other, adding an aqueous solution of a strong base such as sodium hydroxide, potassium hydroxide, and tetraalkylammonium to the obtained reaction product, and carrying out extraction with an organic solvent such as ethyl acetate and chloroform.

(Compound (PA) Having Proton-Accepting Functional Group, Capable of Decomposing upon Irradiation with Actinic Rays or Radiation to Generate Proton-Accepting Compound Which Exhibits Deterioration in Proton-Accepting Properties, No Proton-Accepting Properties, or Change from Proton-Accepting Properties to Acidic Properties)

The composition according to the present invention may further include, as a basic compound, a compound [hereinafter also referred to as a "compound (PA)"] having a proton-accepting functional group, capable of decomposing upon irradiation with actinic rays or radiation to generate a compound which exhibits deterioration in proton-accepting properties, no proton-accepting properties, or a change from the proton-accepting properties to acidic properties.

The proton-accepting functional group denotes a functional group having a group or an electron which is capable of electrostatically interacting with a proton, and is, for example, a functional group with a macrocyclic structure such as a cyclic polyether, or a functional group which has a nitrogen atom having an unshared electron pair not contributing to 7c-conjugation. Examples of the nitrogen atom having an unshared electron pair not contributing to 7c-conjugation include a nitrogen atom having a partial structure represented by the following general formula.

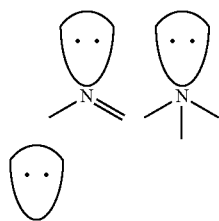

Unshared Electrom Pair

Preferred examples of a partial structure of the proton-accepting functional group include crown ether, azacrown ether, primary to tertiary amines, pyridine, imidazole, and a pyrazine structure.

The compound (PA) decomposes to generate a compound exhibiting deterioration in proton-accepting properties, no proton-accepting properties, or a change from the proton-accepting properties to acidic properties upon irradiation with actinic rays or radiation. Here, proton accepting properties deteriorating, disappearing, or changing to acidic properties represents a change in proton accepting properties caused by adding a proton to the proton-accepting functional group, and specifically represents that, in a case where a proton adduct is generated using the compound (PA) having a proton-accepting functional group and a proton, an equilibrium constant in the equilibrium constant is reduced.

Specific examples of the compound (PA) include the following compounds. Further, specific examples of the compound (PA) include compounds described in paragraphs 0421 to 0428 of JP2014-41328A and paragraphs 0108 to 0116 of JP2014-134686 Å, the content of which is incorporated herein by reference.

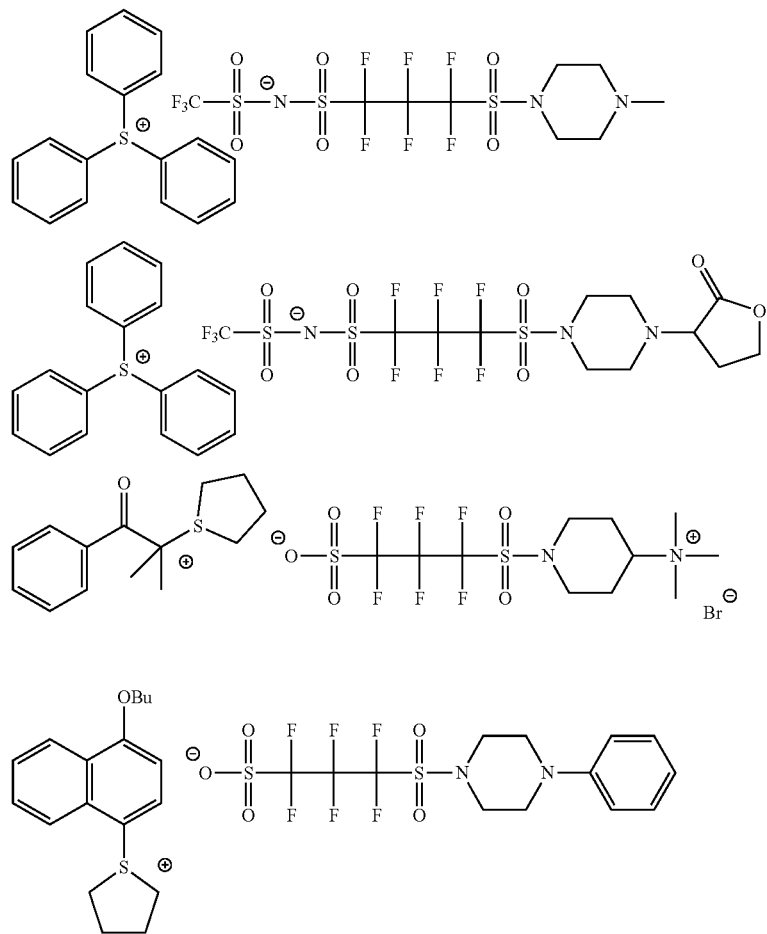

-continued
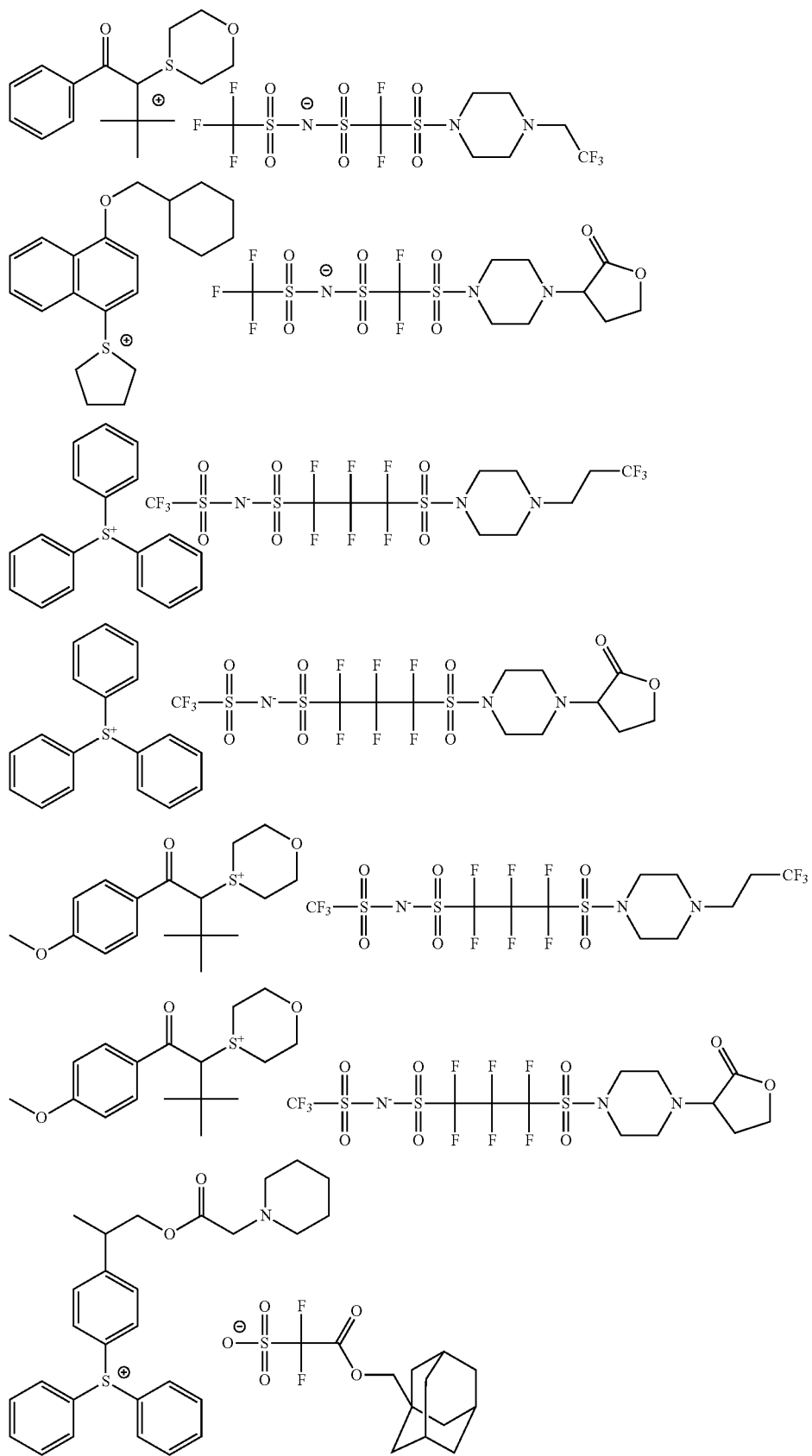

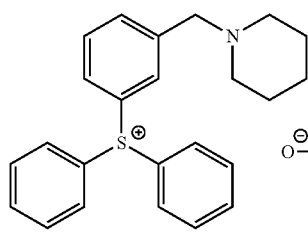
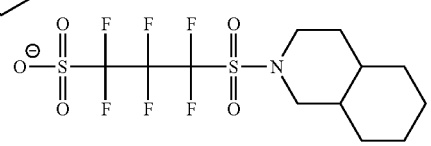

The basic compounds may be used singly or in combination of two or more kinds thereof.

The amount of the basic compound used is usually 0.001 to 10% by mass and preferably 0.01 to 5% by mass with respect to the solid content of the actinic ray-sensitive or radiation-sensitive resin composition.

It is preferable that a ratio (molar ratio; photoacid generator/basic compound) of the photoacid generator used to the basic compound used in the composition is 2.5 to 300. That is, the molar ratio is preferably 2.5 or more from the viewpoints of sensitivity and resolution, and is preferably 300 or less from the viewpoint of suppressing deterioration in resolution caused by thickening of a resist pattern with the lapse of time until a heating treatment after exposure. The molar ratio (photoacid generator/basic compound) is more preferably 5.0 to 200 and still more preferably 7.0 to 150.

As the basic compound, for example, a compound (for example, an amine compound, an amido group-containing compound, a urea compound, or a nitrogen-containing heterocyclic compound) described in paragraphs 0140 to 0144 of JP2013-11833A can be used.

(A') Hydrophobic Resin

The actinic ray-sensitive or radiation-sensitive resin composition may include a hydrophobic resin (A'), in addition to the resin (A).

It is preferable that the hydrophobic resin is designed to be localized on a surface of a resist film. Unlike the surfactant, the hydrophobic resin does not necessarily have a hydrophilic group in a molecule and does not necessarily contribute to uniform mixing with a polar/non-polar material.

Examples of an effect obtained by the addition of the hydrophobic resin include an effect of suppressing a static/dynamic contact angle of a resist film surface with respect to water and an effect of suppressing out gas.

From the viewpoint of localization on the film surface layer, the hydrophobic resin includes preferably one or more kinds and more preferably two or more kinds among "a fluorine atom", "a silicon atom", and "a $CH_3$ partial structure included in a side chain of the resin". In addition, it is preferable that the hydrophobic resin includes a hydrocarbon group having 5 or more carbon atoms. These groups may be present at a main chain or a side chain of the resin.

In a case where the hydrophobic resin includes a fluorine atom and/or a silicon atom, the fluorine atom and/or the silicon atom in the hydrophobic resin may be present at a main chain or a side chain of the resin.

In a case where the hydrophobic resin includes a fluorine atom, it is preferable that a partial structure having a fluorine atom is an alkyl group having a fluorine atom, a cycloalkyl group having a fluorine atom, or an aryl group having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom and may further have a substituent other than a fluorine atom.

The cycloalkyl group having a fluorine atom is a monocyclic or polycyclic cycloalkyl group in which at least one hydrogen atom is substituted with a fluorine atom and may further have a substituent other than a fluorine atom.

Examples of the aryl group having a fluorine atom include an aryl group, such as a phenyl group and a naphthyl group, in which at least one hydrogen atom is substituted with a fluorine atom. The aryl group having a fluorine atom may further have a substituent other than a fluorine atom.

Examples of a repeating unit having a fluorine atom or a silicon atom include the repeating units described in paragraph 0519 of US2012/0251948A1.

Moreover, it is preferable that the hydrophobic resin includes a $CH_3$ partial structure in a side chain as described above.

Here, examples of the $CH_3$ partial structure included in a side chain of the hydrophobic resin include a $CH_3$ partial structure such as an ethyl group or a propyl group.

On the other hand, a methyl group (for example, an c-methyl group of a repeating unit having a methacrylic acid structure) which is directly bonded to a main chain of the hydrophobic resin has little contribution to the surface localization of the hydrophobic resin caused by the effect of the main chain, and thus is not included in examples of the $CH_3$ partial structure according to the present invention.

With regard to the hydrophobic resin, reference can be made to the descriptions in paragraphs [0348] to [0415] of JP2014-010245 Å, the content of which is incorporated herein by reference.

As the hydrophobic resin, resins described in JP2011-248019 Å, JP2010-175859 Å, and JP2012-032544A can also be preferably used.

(F) Surfactant

The actinic ray-sensitive or radiation-sensitive resin composition may further include a surfactant (F). By incorporation of the surfactant, particularly in a case where an exposure light source having a wavelength of 250 nm or shorter, in particular, 220 nm or shorter is used, a pattern having adhesiveness and reduced development defects can be formed with high sensitivity and resolution.

As the surfactant, a fluorine-based surfactant and/or a silicon-based surfactant is particularly preferably used.

Examples of the fluorine-based surfactant and/or the silicon-based surfactant include the surfactants described in paragraph [0276] of US2008/0248425 Å. In addition, F-TOP EF301 or EF303 (manufactured by Shin Akita Chemical Co., Ltd.); FLUORAD FC430, 431, or 4430 (manufactured by Sumitomo 3M Ltd.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); F-TOP EF121, EF122 Å, EF122B, RF122C, EF125M, EF135M, EF351, EF352, EF801, EF802, or EF601 (manufactured by Gemco Inc.); PF636, PF656, PF6320, or PF6520 (manufactured by OMNOVA Corp.); or FTX-204G, 208G, 218G, 230G, 204D, 208D, 212D, 218D, or 222D (manufactured by Neos Co., Ltd.) may be used. Further, a Polysiloxane Polymer KP-341 (manufactured by Shin-Etsu Chemical Co., Ltd.) can also be used as the silicon-based surfactant.

In addition, in addition to the known surfactants as shown above, a surfactant may be synthesized using a fluoro aliphatic compound manufactured using a telomerization method (also referred to as a telomer method) or an oligomerization method (also referred to as an oligomer method). Specifically, a polymer including a fluoro aliphatic group derived from fluoro aliphatic compound may be used as the surfactant. This fluoro aliphatic compound can be synthesized, for example, using the method described in JP2002-90991 Å.

In addition, a surfactant other than the fluorine-based surfactant and/or the silicon-based surfactant described in paragraph [0280] of US2008/0248425A may be used.

These surfactants may be used singly or in combination of two or more kinds thereof.

In a case where the actinic ray-sensitive or radiation-sensitive resin composition includes the surfactant, the content of the surfactant is preferably 0% to 2% by mass, more preferably 0.0001% to 2% by mass, and still more preferably 0.0005% to 1% by mass, with respect to the total solid content of the composition.

(G) Other Additives

The actinic ray-sensitive or radiation-sensitive resin composition may further include a dissolution inhibiting compound, a dye, a plasticizer, a photosensitizer, a light absorber, and/or a compound for promoting solubility in the developer (for example, a phenol compound having a molecular weight of 1,000 or less, or an aliphatic or alicyclic compound having a carboxy group).

The actinic ray-sensitive or radiation-sensitive resin composition may further include a dissolution inhibiting compound.

Here, the "dissolution inhibiting compound" is a compound having a molecular weight of 3,000 or less, which decomposes by the action of an acid such that the solubility in the organic developer decreases.

[Upper Layer Film (Topcoat Film)]

In the pattern forming method of the present invention, an upper layer film (topcoat film) may be formed on the upper layer of the resist film.

It is preferable that the upper layer film is not mixed with the resist film, and can be uniformly applied onto the upper layer of the resist film.

The upper layer film is not particularly limited, and upper layer films known in the related art can be formed by the methods known in the related art, and the upper layer film can be formed in accordance with, for example, the description in paragraphs 0072 to 0082 of JP2014-059543A. As a material for forming the upper layer film, a hydrophobic resin or the like can also be used, in addition to the polymers described in paragraph 0072 of JP2014-059543A. As the hydrophobic resin, for example, the above-mentioned hydrophobic resin (A') can be used.

In a case where a developer containing an organic solvent is used in the developing step, it is preferable that an upper layer film containing a basic compound as described in JP2013-61648A, for example, is formed on the resist film. Specific examples of the basic compound which can be included in the upper layer film include the above-mentioned basic compound (E).

Furthermore, the upper layer film preferably includes a compound at least one of a group or bond selected from the group consisting of an ether bond, a thioether bond, a hydroxyl group, a thiol group, a carbonyl bond, and an ester bond.

In addition, the upper layer film may include a photoacid generator. As the photoacid generator, the same ones as the photoacid generator (for example, the above-mentioned photoacid generator (B)) which can be included in the actinic ray-sensitive or radiation-sensitive resin composition can be used.

Hereinafter, a resin which is preferably used in the upper layer film (topcoat film) will be described.

<Resin>

It is preferable that the composition for forming an upper layer film contains a resin. The resin which can be contained in the composition for forming an upper layer film is not particularly limited, but the same resin as the hydrophobic resin (for example, the above-mentioned hydrophobic resin (A')) which can be included in the actinic ray-sensitive or radiation-sensitive resin composition can be used.

With regard to the hydrophobic resin, reference can be made to the descriptions in [0017] of JP2013-61647A ([0017] to [0023] of the corresponding US2013/244438A), and [0016] to [0165] of JP2014-56194A, the contents of which is incorporated herein by reference.

In the present invention, the composition for forming an upper layer film preferably includes a resin containing a repeating unit having an aromatic ring. By the incorporation of the repeating unit having an aromatic ring, particularly upon irradiation with electron beams or EUV exposure, secondary electron-generating efficiency, and acid-generating efficiency from a compound capable of generating an acid by actinic rays or radiation increase, and thus effects of realizing high sensitivity and high resolution in the formation of a pattern can be expected.

The weight-average molecular weight of the resin is preferably 3,000 to 100,000, more preferably 3,000 to 30,000, and still more preferably 5,000 to 20,000. The blend amount of the resin in the composition for forming an upper layer film is preferably 50% to 99.9% by mass, more preferably 60% to 99.0% by mass, still more preferably 70% to 99.7% by mass, and even still more preferably 80% to 99.5% by mass, in the total solid content.

In a case where a plurality of the compositions (topcoat compositions) for forming an upper layer film contain a plurality of resins, the compositions preferably include at least one resin (XA) having a fluorine atom and/or a silicon atom.

As for a preferred range of the content of the fluorine atom and the silicon atom contained in the resin (XA), the content of the repeating unit including a fluorine atom and/or a silicon atom is preferably 10% to 100% by mass, more preferably 10% to 99% by mole, and still more preferably 20% to 80% by mole in the resin (XA).

Furthermore, it is more preferable that the composition for forming an upper layer film includes at least one kind of the resin (XA) having fluorine atoms and/or silicon atoms, and a resin (XB) having a smaller content of the fluorine atoms and/or the silicon atoms than that of the resin (XA). Thus, in the formation of the upper layer film, the resin (XA) is unevenly distributed on the surface of the upper layer film, and therefore, it is possible to improve performance such as developing characteristics and immersion liquid tracking properties.

The content of the resin (XA) is preferably 0.01% to 30% by mass, more preferably 0.1% to 10% by mass, still more preferably 0.10% to 8% by mass, and particularly preferably 0.10% to 5% by mass, with respect to the total solid content included in the composition for forming an upper layer film. The content of the resin (XB) is preferably 50.0% to 99.9% by mass, more preferably 60% to 99.9% by mass, still more preferably 70% to 99.9% by mass, and particularly preferably 80% to 99.9% by mass, with respect to the total solid content included in the composition for forming an upper layer film.

An embodiment in which the resin (XB) does not substantially contain fluorine atoms and silicon atoms is preferable, and in this case, specifically, the total content of the repeating unit having a fluorine atom and the repeating unit having a silicon atom is preferably 0% to 20% by mole, more preferably 0% to 10% by mole, still more preferably 0% to 5% by mole, particularly preferably 0% to 3% by mole, and ideally 0% by mole, that is, containing neither a fluorine atom nor a silicon atom, with respect to all the repeating units in the resin (XB).

<Method for Preparing Composition (Topcoat Composition) for Forming Upper Layer Film>

The composition for forming an upper layer film is preferably prepared by dissolving the respective components in a solvent, and filtered using a filter. The filter is preferably a polytetrafluoroethylene-, polyethylene- or nylon-made filter having a pore size of 0.1 µm or less, more preferably 0.05 µm or less, and still more preferably 0.03 µm or less. Further, a plurality of kinds of the filters may be connected in series or in parallel, and used. In addition, the composition may be filtered in plural times, and a step of filtering plural times may be a circulatory filtration step. Incidentally, the composition may be subjected to a deaeration treatment before and after the filtration using a filter. It is preferable that the composition for forming an upper layer film does not include impurities such as metals. The content of the metal components included in these materials is preferably 10 ppm or less, more preferably 5 ppm or less, and still more preferably 1 ppm or less, but the material not having substantially metal components (within a detection limit or less of a determination device) is particularly preferable.

In the above-mentioned <Exposing Step>, in a case where the exposure is liquid immersion exposure, the upper layer film is arranged between the actinic ray-sensitive or radiation-sensitive film and the immersion liquid, and also functions as a layer which does not bring the actinic ray-sensitive or radiation-sensitive film into direct contact with the immersion liquid. In this case, preferred characteristics required for the upper layer film (composition for forming an upper layer film) are coating suitability onto the actinic ray-sensitive or radiation-sensitive film, radiation, transparency, particularly to light at 193 nm, and poor solubility in an immersion liquid (preferably water). Further, it is preferable that the upper layer film is not mixed with the actinic ray-sensitive or radiation-sensitive film, and can be uniformly applied onto the surface of the actinic ray-sensitive or radiation-sensitive film.

Moreover, in order to uniformly apply the composition for forming an upper layer film onto the surface of the actinic ray-sensitive or radiation-sensitive film while not dissolving the actinic ray-sensitive or radiation-sensitive film, it is preferable that the composition for forming an upper layer film contains a solvent in which the actinic ray-sensitive or radiation-sensitive film is not dissolved. It is more preferable to use a solvent of components other than a developer (organic developer) containing an organic solvent as the solvent in which the actinic ray-sensitive or radiation-sensitive film is not dissolved.

A method for applying the composition for forming an upper layer film is not particularly limited, and a spin coating method, a spray method, a roll coating method, a dip method, and the like which are known in the related art can be used.

The film thickness of the upper layer film is not particularly limited, but from the viewpoint of transparency to an exposure light source, the topcoat with a thickness of usually 5 nm to 300 nm, preferably 10 nm to 300 nm, more preferably 20 nm to 200 nm, and still more preferably 30 nm to 100 nm is formed.

After forming the upper layer film, the substrate is heated (PB), as desired.

From the viewpoint of resolution, it is preferable that the refractive index of the upper layer film is close to that of the actinic ray-sensitive or radiation-sensitive film.

The upper layer film is preferably insoluble in an immersion liquid, and more preferably insoluble in water.

With regard to the receding contact angle of the upper layer film, the receding contact angle (23° C.) of the immersion liquid with respect to the upper layer film is preferably 50° to 100°, and more preferably 80° to 1000, from the viewpoint of immersion liquid tracking properties.

In the liquid immersion exposure, in a view that the immersion liquid needs to move on a wafer following the movement of an exposure head that is scanning the wafer at a high speed and forming an exposure pattern, the contact angle of the immersion liquid with respect to the actinic ray-sensitive or radiation-sensitive film in a dynamic state is important, and in order to obtain better resist performance, it is preferable that the immersion liquid has a receding contact angle in the above range.

During the release of the upper layer film, an organic developer may be used, and another release agent may also be used. As the release agent, a solvent hardly permeating the actinic ray-sensitive or radiation-sensitive film is preferable. In a view that the release of the upper layer film can be carried out simultaneously with the development of the actinic ray-sensitive or radiation-sensitive film, the upper layer film is preferably releasable with an organic developer. The organic developer used for the release is not particularly limited as long as it makes it possible to dissolve and remove a less exposed area of the actinic ray-sensitive or radiation-sensitive film.

From the viewpoint of the release using an organic developer, the dissolution rate of the upper layer film in the organic developer is preferably 1 to 300 nm/sec, and more preferably 10 to 100 nm/sec.

Here, the dissolution rate of an upper layer film in the organic developer refers to a film thickness decreasing rate in a case where the upper layer film is exposed to a developer after film formation, and is a rate in a case where the upper layer film is immersed in butyl acetate at 23° C. in the present invention.

An effect of reducing development defects after developing an actinic ray-sensitive or radiation-sensitive film is accomplished by setting the dissolution rate of an upper layer film in the organic developer to 1 nm/sec or more, and preferably 10 nm/sec or more. Further, an effect that the line edge roughness of a pattern after the development of the actinic ray-sensitive or radiation-sensitive film becomes better is accomplished as an effect of reducing the exposure unevenness during liquid immersion exposure by setting the dissolution rate to 300 nm/sec or less, and preferably 100 nm/sec.

The upper layer film may also be removed using other known developers, for example, an aqueous alkali solution. Specific examples of the usable aqueous alkali solution include an aqueous tetramethylammonium hydroxide solution.

[Allowable Content of Impurities]

It is preferable that various materials (for example, the treatment liquid (for example, a developer or a rinsing liquid) of the present invention, a resist solvent, a composition for forming an antireflection film, and a composition for forming an upper layer film) used in the actinic ray-sensitive or radiation-sensitive resin composition and the pattern forming method according to the present invention do not include impurities such as metal, a metal salt including halogen, an acid, an alkali, a sulfur-containing compound, and a phosphorous-containing compound. The content of the impurities included in these materials is preferably 1 ppm or less, more preferably 1 ppb or less, still more preferably 100 ppt or less, and particularly preferably 10 ppt or less, but the material not having substantially metal components (within a detection limit or less of a determination device) is the most preferable.

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-, polyethylene-, or nylon-made filter is preferable. The filter may be formed of a composite material formed by combining this material with an ion exchange medium. As the filter, a filter which has been washed with an organic solvent in advance may be used. In the step of filtration using a filter, a plurality of kinds of filters may be connected in series or in parallel, and used. In a case of using a plurality of kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method of selecting raw materials having a low content of metals as raw materials constituting various materials, a method of subjecting raw materials constituting various materials to filtration using a filter, and a method of carrying out distillation under the condition for suppressing the contamination as much as possible by, for example, lining the inside of a device with TEFLON (registered trademark). The preferred conditions for filtration using a filter, which is carried out for raw materials constituting various materials, are the same as the above-described conditions.

Impurities may be removed using an adsorbing material, besides the filtration using a filter, or may be removed using a combination of filtration using a filter and an adsorbing material. As the adsorbing material, known adsorbing materials can be used, and for example, inorganic adsorbing materials such as silica gel and zeolite, and organic adsorbing materials such as activated carbon can be used.

[Housing Container of Treatment Liquid]

It is preferable that the treatment liquid of the present invention, such as the developer and the rinsing liquid, is stored in a housing container for a treatment liquid for patterning a chemically amplified resist film, in which the housing container has a housing section. For example, it is preferable that the housing container is a housing container for a treatment liquid for patterning a chemically amplified resist film in which an inner wall of the housing section in contact with the treatment liquid is formed of a resin other than any of a polyethylene resin, a polypropylene resin, and a polyethylene-polypropylene resin, or is formed of a metal which has been subjected to a rust-preventing/metal elution-preventing treatment. In the housing section of the housing container, a predetermined organic solvent to be used as a treatment liquid for patterning a chemically amplified resist film is stored, and during the patterning of the chemically amplified resist film, this organic solvent which has been discharged from the housing section can be used.

In a case where the housing container further includes a sealing section for sealing the housing section, it is preferable that the sealing section is formed of a resin other than a resin selected from the group consisting of a polyethylene resin, a polypropylene resin, and a polyethylene-polypropylene resin, or is formed of a metal which has been subjected to a rust-preventing/metal elution-preventing treatment.

Here, the sealing section denotes a member capable of isolating the housing section from outside air, and preferred examples thereof include a packing and an O-ring.

The resin other than a resin selected from the group consisting of a polyethylene resin, a polypropylene resin, and a polyethylene-polypropylene resin is preferably a perfluoro resin.

Examples of the perfluoro resin include a polytetrafluoroethylene resin (PTFE), a tetrafluoroethylene-perfluoroalkylvinyl ether copolymer resin (PFA), a tetrafluoroethylene-hexafluoropropylene copolymer resin (FEP), a tetrafluoroethylene-ethylene copolymer resin (ETFE), a chlorotrifluoroethylene-ethylene copolymer resin (ECTFE), a polyvinylidene resin (PVDF), a polychlorotrifluoroethylene copolymer resin (PCTFE), and a polyvinyl fluoride resin (PVF).

Particularly preferred examples of the perfluoro resin include a tetrafluoroethylene resin, a tetrafluoroethylene-perfluoroalkylvinyl ether copolymer resin, and a tetrafluoroethylene-hexafluoropropylene copolymer resin.

Examples of the metal in the metal which has been subjected to the rust-preventing/metal elution-preventing treatment include carbon steel, alloy steel, nickel-chrome steel, nickel chrome molybdenum steel, chrome steel, chrome molybdenum steel, and manganese steel.

As the rust-preventing/metal elution-preventing treatment, a coating technique is preferably applied.

The coating technique is largely divided into three kinds of coatings such as metal coating (various platings), inorganic coating (various chemical conversion treatments, glass, concrete, ceramics, and the like) and organic coating (rust preventive oil, paint, rubber, and plastics).

Preferred examples of the coating technique include a surface treatment using a rust-preventing oil, a rust inhibitor, a corrosion inhibitor, a chelate compound, a releasable plastic, or a lining agent.

Among those, various corrosion inhibitors such as chromate, nitrite, silicate, phosphate, carboxylic acids such as oleic acid, dimer acid, and naphthalenic acid, a carboxylic acid metallic soap, sulfonate, an amine salt, esters (a glycerin ester or a phosphate ester of a higher fatty acid), chelate compounds such as ethylenediaminetetraacetic acid, gluconic acid, nitrilotriacetic acid, hydroxyethylethylenediaminetriacetic acid, and diethylenetriaminepentaacetic acid, and a fluorine resin lining are preferable. The phosphate treatment and the fluorine resin lining are particularly preferable.

Furthermore, a "pre-treatment" which is at a pre-stage for the rust-preventing treatment is also preferably employed as a treatment method which leads to extension of an anti-rust period through a coating treatment although not directly preventing rust, as compared with a direct coating treatment.

Specific suitable examples of such a pre-treatment include a treatment for removing various corrosive factors, such as chloride and sulfate, present on a metal surface through washing or polishing.

Specific examples of the housing container include the following ones.

FluoroPurePFA complex drum manufactured by Entegris Inc. (liquid contact inner surface; PFA resin lining)

Steel-made drum can manufactured by JFE (liquid contact inner surface; zinc phosphate-coated film)

Moreover, examples of the housing container include the housing containers described in paragraphs 0013 to 0030 of JP1999-021393A (JP-H11-021393 Å), and the housing containers described in paragraphs 0012 to 0024 of JP1998-45961A (JP-H10-45961 Å).

An electrically conductive compound may be added to the treatment liquid of the present invention in order to prevent the failure of chemical liquid pipes or various parts (filters, O-rings, tubes, and the like) associated with electrostatic charge and subsequently occurring electrostatic discharge.

Incidentally, since the treatment liquid of the present invention contains a high-polarity organic solvent having an SP value of 17.1 $\text{MPa}^{1/2}$ or more, it has an effect of suppressing the charging of an antistatic device as it is, but can further suppress the charging of an antistatic device by being used in combination with the above-mentioned electrically conductive compound.

The electrically conductive compound is not particularly limited, but examples thereof include methanol. The addition amount thereof is not particularly limited, but is preferably 10% by mass or less, and more preferably 5% by mass or less, from the viewpoint of maintaining preferred development characteristics. For the members of the chemical liquid pipes, various pipes coated with SUS or with polyethylene, polypropylene, or fluorine resins (polytetrafluoroethylene, a perfluoroalkoxy resin, and the like) which have been subjected to an antistatic treatment can be used. Similarly, with respect to the filters and the O-rings, polyethylene, polypropylene, or fluorine resins (polytetrafluoroethylene, a perfluoroalkoxy resin, and the like) which have been subjected to an antistatic treatment can also be used.

EXAMPLES

Hereinafter, the present invention will be described in more detail using examples, but the present invention is not limited to the following Examples as long as it does not depart from the scope of the present invention. Unless otherwise specified, "parts" and "%" are given on the basis of mass.

Furthermore, quantitative determination of metal salts including alkali or halogen in the treatment liquid (the treatment liquid described in Table 8) used in the development or rinsing in the following paragraphs were carried out, and as a result, it could be found that the treatment liquid did not substantially include metal salts including alkali or halogen.

Incidentally, similarly, for the treatment liquid (the treatment liquid described in Table 8) used in the development or rinsing in the following paragraphs, quantitative analysis of sulfur-containing compounds (measured by, for example, the method specified in JIS K 2541-6:2013 "Determination of sulfur content (Ultraviolet fluorescence method)") and quantitative analysis of phosphorous compounds (measured by spectrophotometry in terms of a total of phosphorous, based on the method specified in JIS K 0102:2013), and as a result, it could be confirmed that these compounds had not been substantially included.

In addition, the expression "doing not substantially having" herein means that none is detected in a case where the content (concentration) of these compounds is measured by a measurable method (less than a detection limit value).

1. Preparation of Resist Composition and Composition for Forming Upper Layer Film Hereinafter, various components used for the resist composition and the composition for forming an upper layer film, to be treated with the treatment methods of Examples and Comparative Examples, and methods for preparing the same will be described.

Resin (A) and the Like (Synthesis Example 1) Synthesis of Resin (A-1)

600 g of cyclohexanone was put into a 2-L flask, and purged with nitrogen for 1 hour at a flow rate of 100 mL/min. Thereafter, 4.60 g (0.02 mol) of a polymerization initiator V-601 (manufactured by Wako Pure Chemical Industries, Ltd.) was added thereto, and the flask was warmed until the internal temperature reached 80° C. Next, the following monomers and 4.60 g (0.02 mol) of the polymerization initiator V-601 (manufactured by Wako Pure Chemical Industries, Ltd.) were dissolved in 200 g of cyclohexanone to prepare a monomer solution. The monomer solution was added dropwise to the flask which had been heated to 80° C. for 6 hours. After completion of the dropwise addition, the obtained solution was further reacted at 80° C. for 2 hours.

4-Acetoxystyrene: 48.66 g (0.3 mol)
1-Ethylcyclopentyl methacrylate: 109.4 g (0.6 mol)
Monomer 1: 22.2 g (0.1 mol)

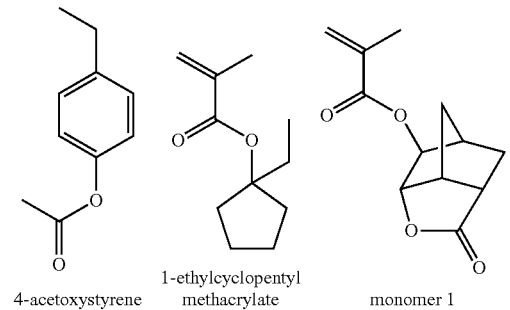

4-acetoxystyrene    1-ethylcyclopentyl methacrylate    monomer 1

The reaction solution was cooled to room temperature and added dropwise to 3 L of hexane to precipitate a polymer. A solid obtained by filtration was dissolved in 500 mL of acetone, added dropwise again to 3 L of hexane, and then a solid obtained by filtration was dried under reduced pressure to obtain 160 g of a 4-acetoxystyrene/1-ethylcyclopentyl methacrylate/monomer 1 copolymer (A-1a).

10 g of the polymer thus obtained, 40 mL of methanol, 200 mL of 1-methoxy-2-propanol, and 1.5 mL of concentrated hydrochloric acid were added to a reaction vessel, heated to 80° C., and stirred for 5 hours. The reaction solution was left to be cooled to room temperature and added dropwise to 3 L of distilled water. A solid obtained by filtration was dissolved in 200 mL of acetone, the solution was added dropwise again to 3 L of distilled water, and then, a solid obtained by filtration was dried under reduced pressure to obtain a resin (A-1) (8.5 g). As measured by gel permeation chromatography (GPC) (solvent: tetrahydrofuran (THF)) in terms of standard polystyrene, the weight-average molecular weight (Mw) was 11,200 and the molecular weight dispersity (Mw/Mn) was 1.45.

Resins (A-2) to (A-19), and (A-21) to (A-23) having the structures shown in Table 3 were synthesized by the same method as in Synthesis Example 1, except that the monomers to be used were changed.

In Table 3, the compositional ratio (molar ratio) of the resin was calculated by $^1$H-NMR (nuclear magnetic resonance) measurement. The weight-average molecular weight (Mw: in terms of polystyrene) and the dispersity (Mw/Mn) of the resin were calculated by GPC (solvent: THF) measurement. In addition, the weight-average molecular weights and the dispersities of the other resins shown in Examples were measured by the same method.

TABLE 3

| | Structure | Compositional ratio (molar ratio), from the left side | Mw | Mw/Mn |
|---|---|---|---|---|
| Resin A-1 | | 30/60/10 | 11,200 | 1.45 |
| Resin A-2 | | 30/60/10 | 12,300 | 1.51 |
| Resin A-3 | | 40/20/40 | 9,200 | 1.68 |
| Resin A-4 | | 30/60/10 | 12,300 | 1.51 |

TABLE 3-continued
| Resin A-5 | 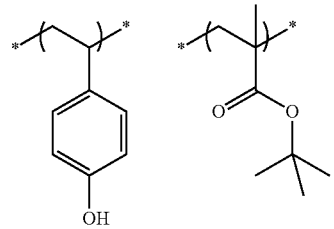 | 20/80 | 12,500 | 1.52 |
| --- | --- | --- | --- | --- |
| Resin A-6 | 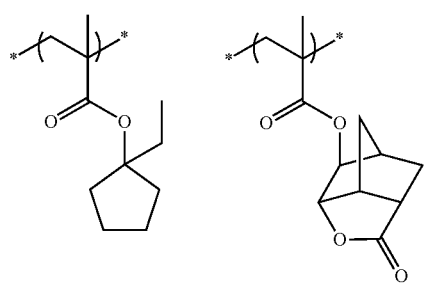 | 50/50 | 13,000 | 1.56 |
| Resin A-7 | 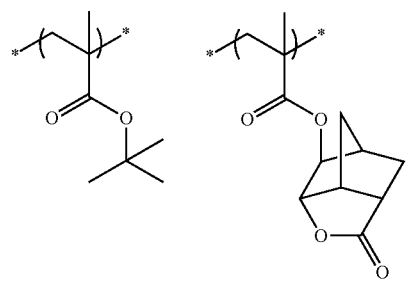 | 70/30 | 12,500 | 1.43 |
| Resin A-8 | 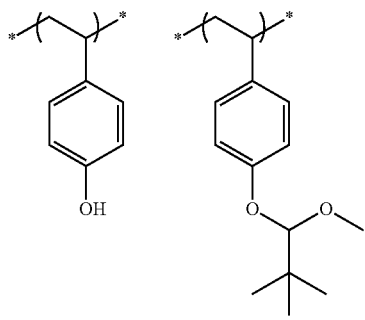 | 20/80 | 18,000 | 1.12 |
| Resin A-9 | 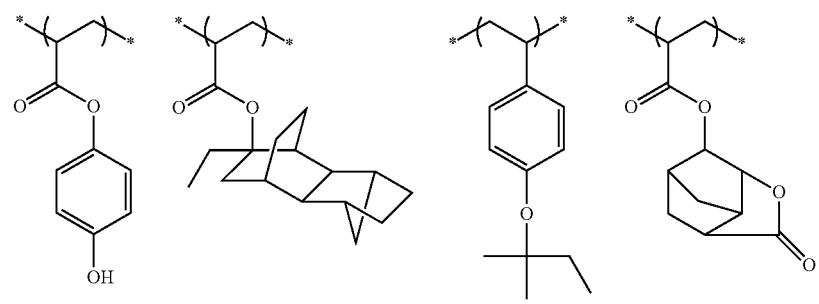 | 5/15/30/50 | 11,000 | 1.56 |

TABLE 3-continued
| Resin | Structure | Ratio | Mw | PDI |
|---|---|---|---|---|
| Resin A-10 | 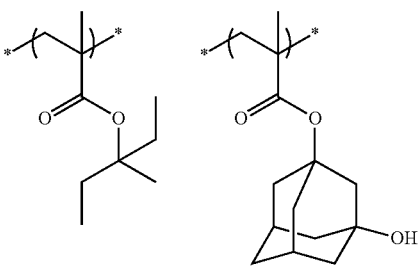 | 50/50 | 11,000 | 1.45 |
| Resin A-11 | 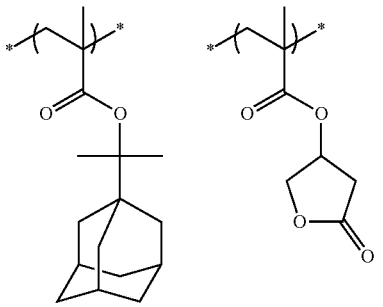 | 35/65 | 12,300 | 1.51 |
| Resin A-12 | 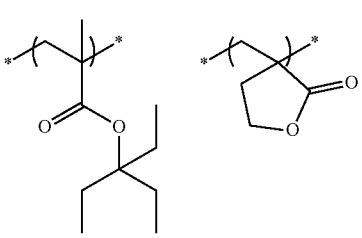 | 60/40 | 12,500 | 1.68 |
| Resin A-13 | 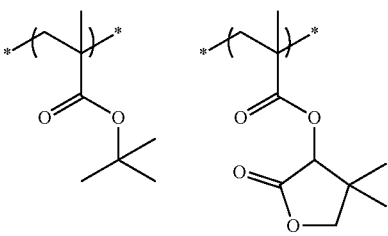 | 70/30 | 13,000 | 1.51 |
| Resin A-14 | 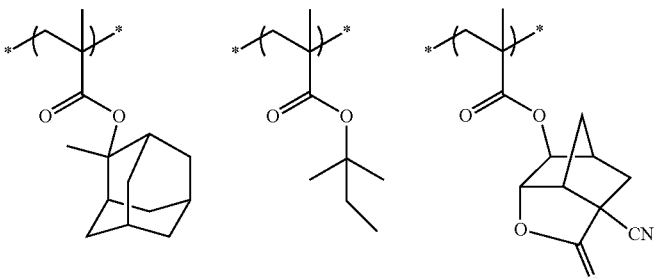 | 20/40/40 | 11,000 | 1.45 |
| Resin A-15 | 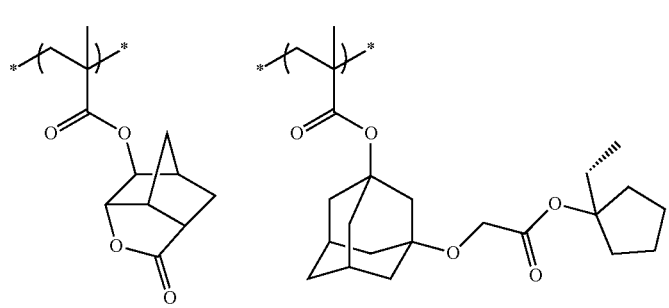 | 30/70 | 12,300 | 1.51 |

TABLE 3-continued

| Resin | Structures | Ratio | Mw | Đ |
|---|---|---|---|---|
| Resin A-16 | | 50/20/30 | 14,500 | 1.68 |
| Resin A-17 | | 30/50/10/10 | 12,100 | 1.53 |
| Resin A-18 | | 50/35/15 | 11,100 | 1.61 |

TABLE 3-continued
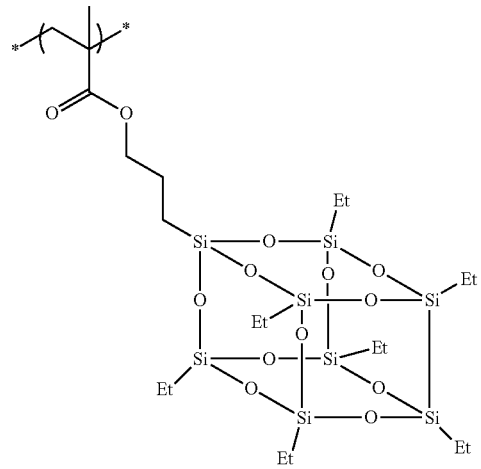
Resin A-19 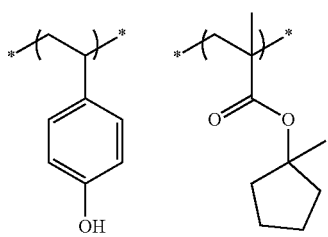 30/45/15/10 11,500 1.49
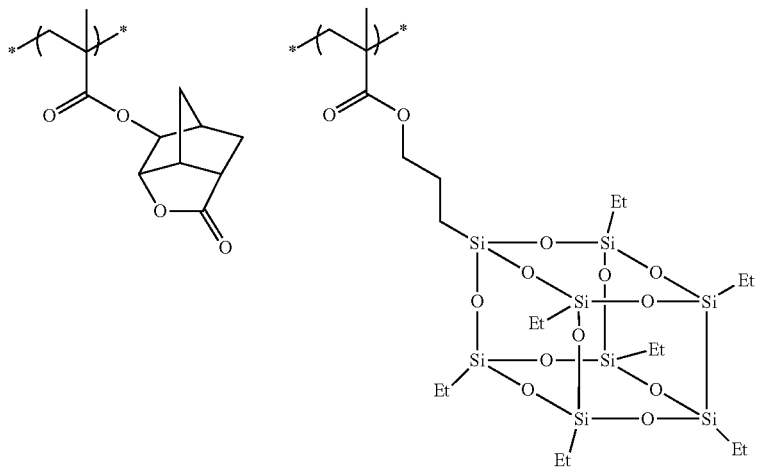
| | Structure | Composition Ratio (molar ratio), From left side | Mw | Mw/Mn | Product name |
|---|---|---|---|---|---|
| Resin A-21 | | 50/50 | 57,000 | 1.8 | ZEP520A (manufactured by Nippon Zeon Co. Ltd., positive tone) |

TABLE 3-continued

| Resin A-22 | 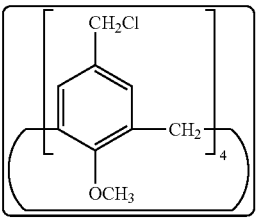 | 60/40 | — | — | TEBN-1 (manufactured by Tokuyama Corp., negative tone) |
|---|---|---|---|---|---|
| Resin A-23 | HfO$_2$ + MAA | — | — | — | Hf nanoparticles (synthesized in accordance with "Solid-Solution Nanoparticles: Use of Nonhydrolytic Sol-Gel Synthesis to Prepare HfO$_2$ and Hf$_x$Zr$_{1-x}$O$_2$ Nanocrystals", Tang, et al., Chem. Mater., 16, 1336 (2004), metal resist |

<Hydrophobic Resin (A')>

As the hydrophobic resin, the following ones were used.

TABLE 4

| | Compositional ratio (molar ratio) | | | | Mw | Mw/Mn |
|---|---|---|---|---|---|---|
| Resin (1b) | 50 | 45 | 5 | — | 7,000 | 1.30 |
| Resin (2b) | 40 | 40 | 20 | — | 18,600 | 1.57 |
| Resin (3b) | 50 | 50 | — | — | 25,400 | 1.63 |
| Resin (4b) | 30 | 65 | 5 | — | 28,000 | 1.70 |
| Resin (5b) | 10 | 10 | 30 | 50 | 12,500 | 1.65 |

Specific structural formulae of the resins (1b) to (5b) described in the table are shown below.

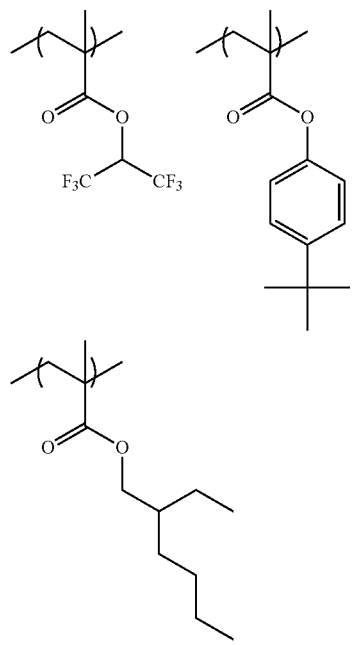

(1b)

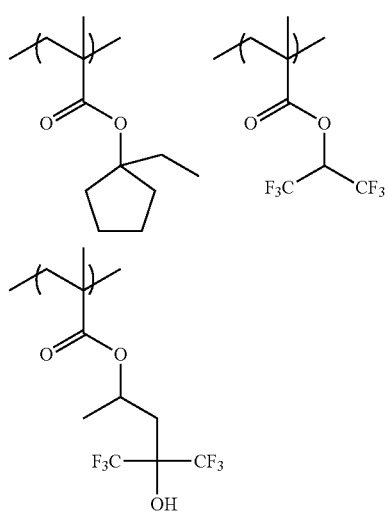

(2b)

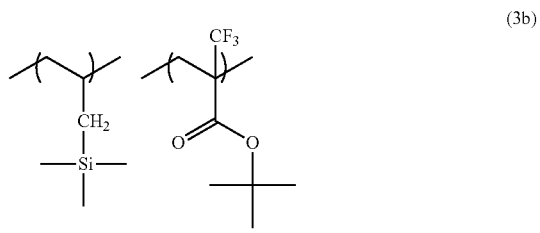

(3b)

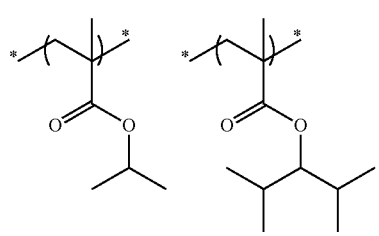

(4b)

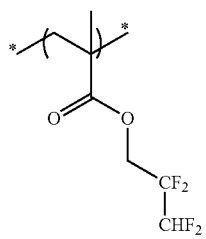
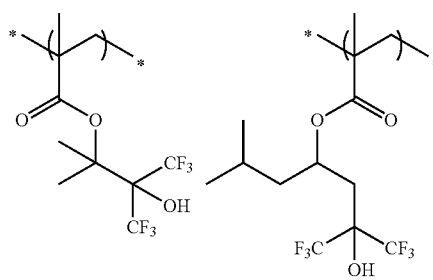
(5b)
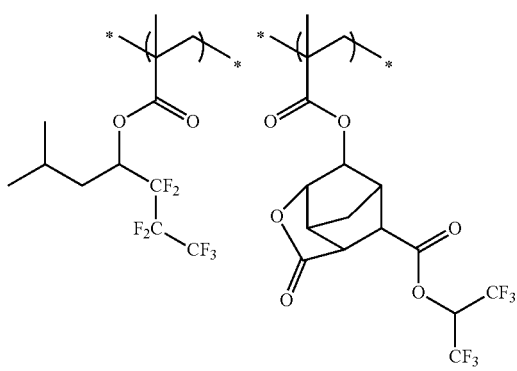
<Photoacid Generator (B)>
As the photoacid generator, the following ones were used.
(B-1)
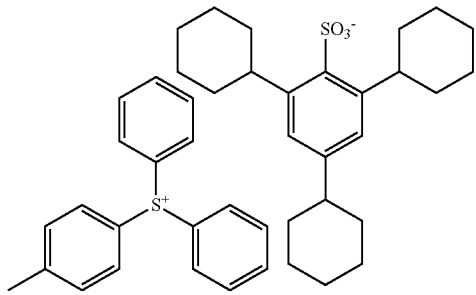
(B-2)
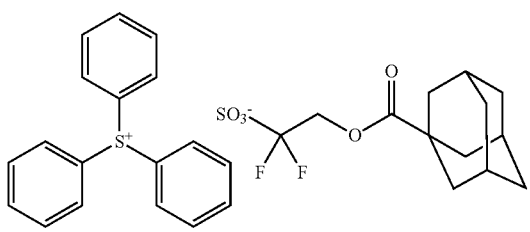
(B-3)
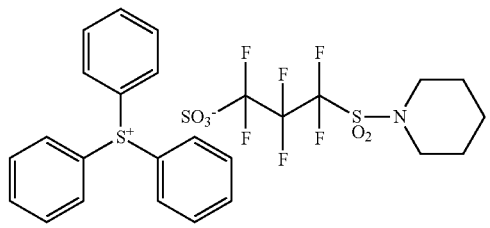
(B-4)
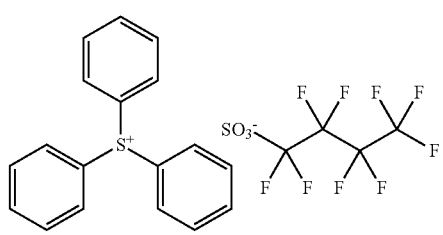
(B-5)
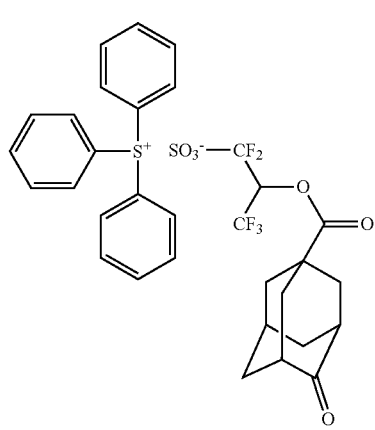
(B-6)
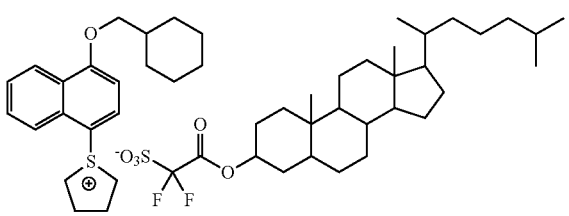
(B-7)
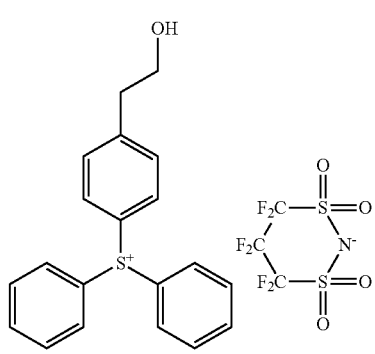

(B-8)
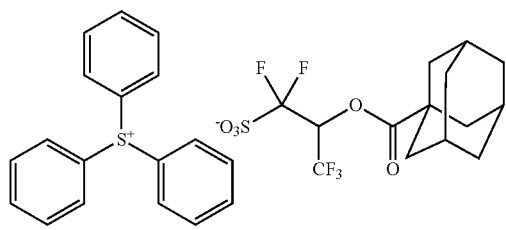
(B-10)
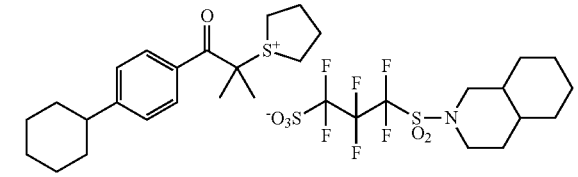
(B-9)
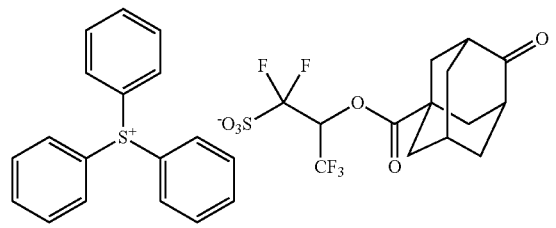
<Basic Compound (E)>
As the basic compound, the following ones were used.
(E-1)
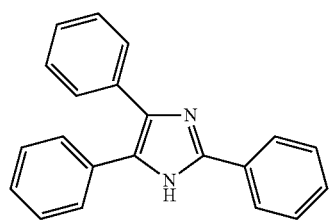
(E-2)
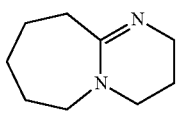
(E-3)
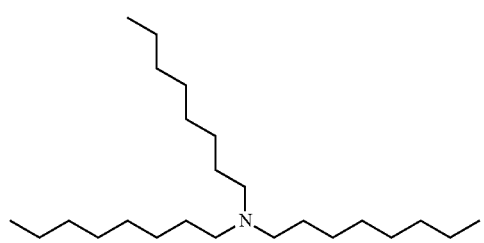
(E-4)
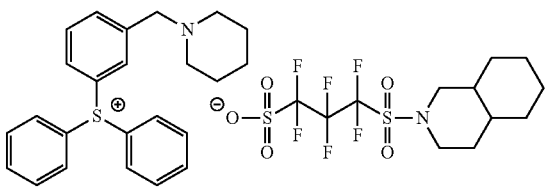
(E-5)
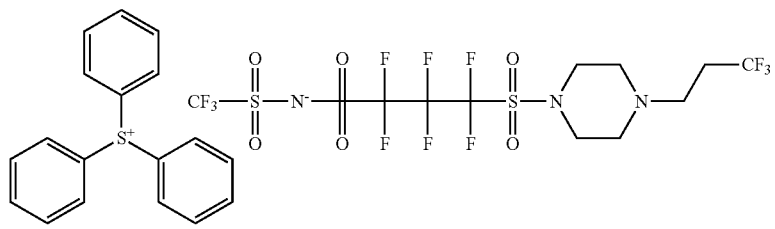
(E-6)
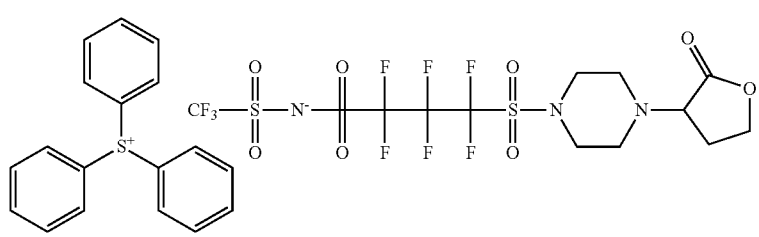

-continued

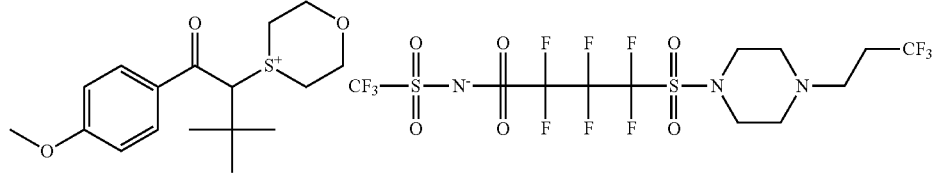 (E-7)

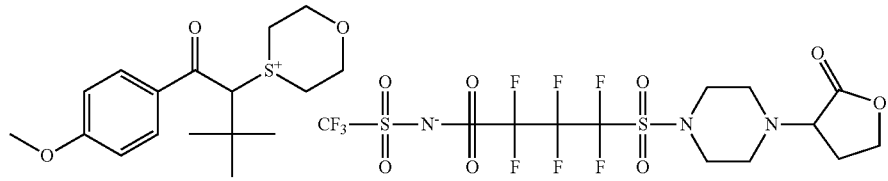 (E-8)

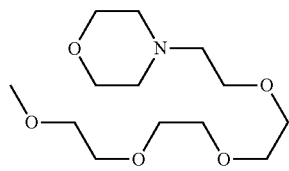 (E-9)

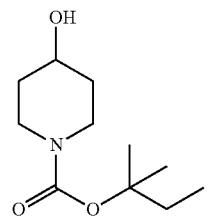 (E-10)

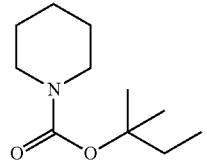 (E-11)

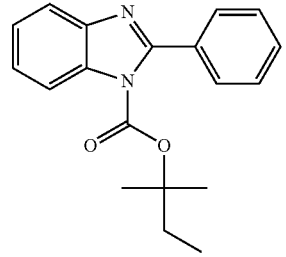 (E-12)

(E-13)

(E-14)

<Solvent (C)>

As the resist solvent, the following ones were used.
C-1: Propylene glycol monomethyl ether acetate
C-2: Propylene glycol monomethyl ether
C-3: Ethyl lactate
C-4: Cyclohexanone
C-5: Anisole <Resist Composition>

The respective components shown in Table 5 below were dissolved in a solvent shown in the same table. The solution was filtered through a polyethylene filter having a pore size of 0.03 μm to obtain a resist composition.

TABLE 5

|  | Resin (A) | Acid generator (B) | Basic compound (E) | Solvent (C) | | Hydrophobic resin (A') |
|---|---|---|---|---|---|---|
| Resist composition 1 | A-1 0.77 g | B-1 0.2 g | E-3 0.03 g | C-1 67.5 g | C-3 7.5 g | — | — |
| Resist composition 2 | A-2 0.79 g | B-2 0.18 g | E-1 0.03 g | C-1 45 g | C-2 30 g | — | — |
| Resist composition 3 | A-3 0.79 g | B-2 0.18 g | E-1 0.03 g | C-1 45 g | C-2 30 g | — | — |
| Resist composition 4 | A-4 0.79 g | B-2 0.18 g | E-1 0.03 g | C-1 60 g | C-3 15 g | — | — |

TABLE 5-continued

| | Resin (A) | Acid generator (B) | Basic compound (E) | Solvent (C) | | Other additive | |
|---|---|---|---|---|---|---|---|
| Resist composition 5 | A-5<br>0.78 g | B-3<br>0.19 g | E-3<br>0.03 g | C-1<br>67.5 g | C-3<br>7.5 g | — | — |
| Resist composition 6 | A-6<br>0.79 g | B-2<br>0.18 g | E-1<br>0.03 g | C-1<br>67.5 g | C-3<br>7.5 g | — | — |
| Resist composition 7 | A-6/A-7<br>0.395 g/0.395 g | B-4<br>0.2 g | E-4<br>0.01 g | C-1<br>45 g | C-4<br>30 g | — | — |
| Resist composition 8 | A-8<br>0.79 g | B-1<br>0.18 g | E-1<br>0.03 g | C-1<br>45 g | C-2<br>30 g | — | — |
| Resist composition 9 | A-1/A-2<br>0.395 g/0.395 g | B-2<br>0.18 g | E-1/E-5<br>0.015 g/0.015 g | C-1<br>45 g | C-2<br>30 g | — | — |
| Resist composition 10 | A-2<br>0.79 g | B-2<br>0.18 g | E-6<br>0.03 g | C-1<br>45 g | C-2<br>30 g | — | — |
| Resist composition 11 | A-2<br>0.79 g | B-2<br>0.18 g | E-7<br>0.03 g | C-1<br>45 g | C-2<br>30 g | — | — |
| Resist composition 12 | A-2<br>0.79 g | B-2<br>0.18 g | E-8<br>0.03 g | C-1<br>45 g | C-2<br>30 g | — | — |
| Resist composition 13 | A-9<br>0.76 g | B-5<br>0.18 g | E-9<br>0.03 g | C-1<br>45 g | C-2<br>15 g | C-4<br>15 g | 5b<br>0.03 g |
| Resist composition 14 | A-7<br>0.787 g | B-5<br>0.18 g | E-9<br>0.03 g | C-1<br>45 g | C-2<br>15 g | C-4<br>15 g | 4b<br>0.003 g |
| Resist composition 15 | A-6<br>0.785 g | B-4<br>0.18 g | E-10<br>0.03 g | C-1<br>45 g | C-2<br>15 g | C-4<br>15 g | 3b<br>0.005 g |
| Resist composition 16 | A-10<br>0.78 g | B-3<br>0.18 g | E-11<br>0.03 g | C-1<br>45 g | C-2<br>15 g | C-4<br>15 g | 2b<br>0.01 g |
| Resist composition 17 | A-11<br>0.72 g | B-6/B-2<br>0.15 g/0.09 g | E-12<br>0.03 g | C-1<br>45 g | C-2<br>15 g | C-4<br>15 g | 1b<br>0.01 g |
| Resist composition 18 | A-12<br>0.76 g | B-7<br>0.18 g | E-13<br>0.03 g | C-1<br>45 g | C-2<br>30 g | — | 5b<br>0.03 g |
| Resist composition 19 | A-13<br>0.787 g | B-8<br>0.18 g | E-14<br>0.03 g | C-1<br>30 g | C-2<br>45 g | — | 4b<br>0.003 g |
| Resist composition 20 | A-14<br>0.785 g | B-9<br>0.18 g | E-2<br>0.03 g | C-1<br>45 g | C-4<br>30 g | — | 3b<br>0.005 g |
| Resist composition 21 | A-15<br>0.78 g | B-10/B-2<br>0.09 g/0.09 g | E-13<br>0.03 g | C-1<br>30 g | C-4<br>45 g | — | 2b<br>0.01 g |
| Resist composition 22 | A-16<br>0.71 g | B-6<br>0.25 g | E-14<br>0.03 g | C-1<br>50 g | C-2<br>10 g | — | 1b<br>0.01 g |
| Resist composition 23 | A-17<br>0.79 g | B-2<br>0.18 g | E-1<br>0.03 g | C-1<br>60 g | C-3<br>15 g | — | — |
| Resist composition 24 | A-18<br>0.79 g | B-2<br>0.18 g | E-1<br>0.03 g | C-1<br>60 g | C-3<br>15 g | — | — |
| Resist composition 25 | A-19<br>0.79 g | B-2<br>0.18 g | E-1<br>0.03 g | C-1<br>60 g | C-3<br>15 g | — | — |

| | Resin (A) | Acid generator (B) | Basic compound (E) | Solvent (C) | Other additive |
|---|---|---|---|---|---|
| Resist composition 31 | A-21<br>1 g | — | — | C-5<br>75 g | — |
| Resist composition 32 | A-22<br>1 g | — | — | C-1<br>75 g | — |
| Resist composition 33 | A-23<br>0.95 g | B-4<br>0.05 g | — | C-1<br>75 g | — |

<Composition for Forming Upper Layer Film>

The respective components shown in Table 6 below were dissolved in a solvent shown in the same table. The solution was filtered through a polyethylene filter having a pore size of 0.03 m to obtain a composition for forming an upper layer film. Incidentally, "MIBC" in the following table represents methyl isobutyl carbinol.

TABLE 6

| Composition for forming upper layer film | Resin | Photoacid generator | Additive | Solvent (mixing ratio (mass ratio)) |
|---|---|---|---|---|
| T-1 | V1<br>1.0 g | — | — | MIBC/decane<br>30/70 |
| T-2 | V1<br>1.0 g | B-2<br>0.02 g | — | MIBC/decane<br>50/50 |
| T-3 | V1<br>1.0 g | — | E-11<br>0.02 g | MIBC/decane<br>30/70 |
| T-4 | V1<br>1.0 g | — | X1<br>0.02 g | MIBC/decane<br>30/70 |
| T-5 | V1<br>1.0 g | B-2<br>0.02 g | X1<br>0.02 g | MIBC/decane<br>30/70 |
| T-6 | V2<br>1.0 g | — | — | MIBC/decane<br>30/70 |
| T-7 | V3<br>1.0 g | — | — | MIBC/decane<br>30/70 |
| T-8 | V4<br>1.0 g | — | — | MIBC/decane<br>30/70 |
| T-9 | V1:1b<br>0.9 g:0.1 g | — | — | MIBC/decane<br>20/80 |

Resins V-1 to V-4, and 1b, and an additive X1 which were used are shown below. The other additives are the same as described above.

The compositional ratios, the weight-average molecular weights, and the dispersities of the resins V-1 to V-4, and 1b are shown in another table (Table 7).

V-1
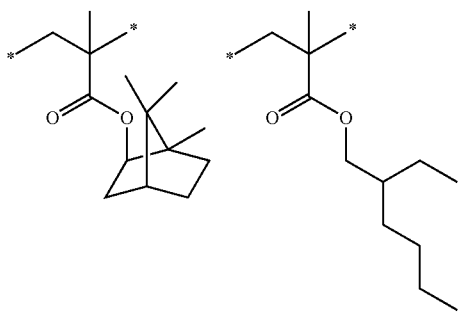
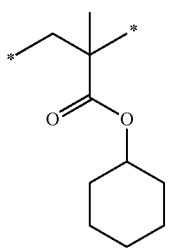
V-2
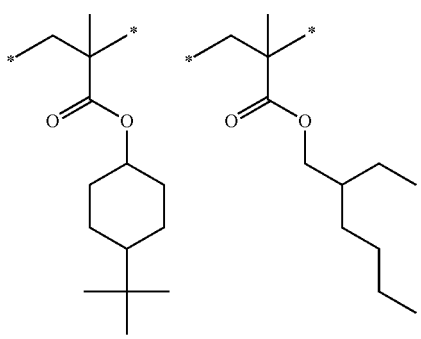
V-3
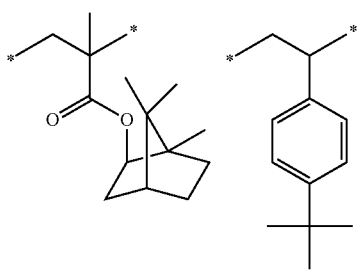
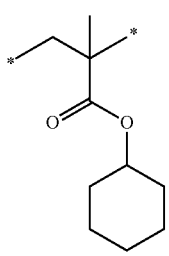
-continued
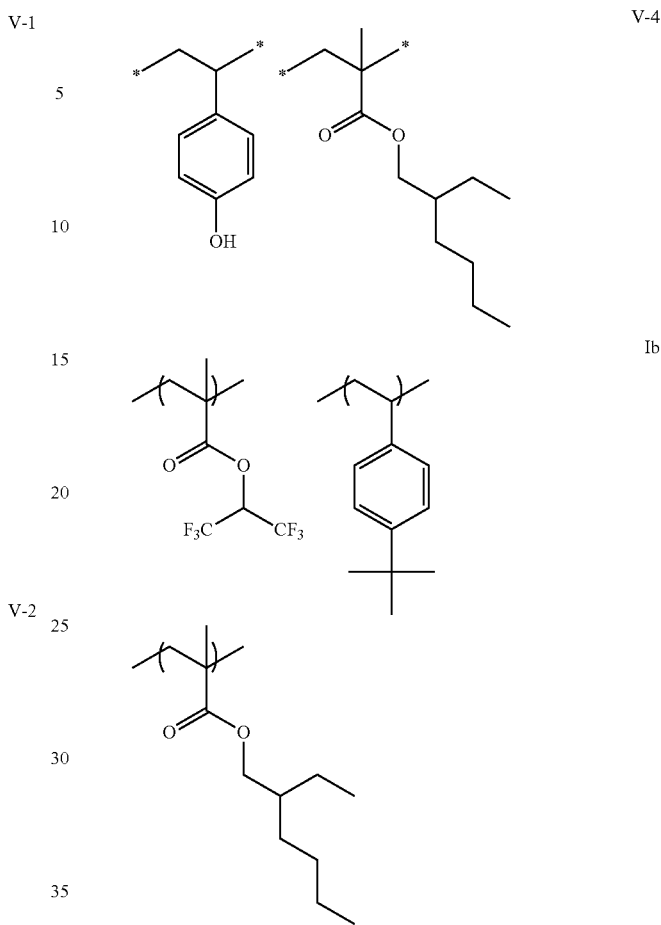
V-4
Ib
TABLE 7
| Resin for forming upper layer film | Compositional ratio (molar ratio) | Weight-average molecular weight | Dispersity |
|---|---|---|---|
| V-1 | 40/40/20 | 11,000 | 1.45 |
| V-2 | 60/40 | 9,500 | 1.59 |
| V-3 | 40/40/20 | 9,300 | 1.67 |
| V-4 | 30/70 | 12,000 | 1.33 |
| 1b | 40/50/10 | 11,000 | 1.45 |
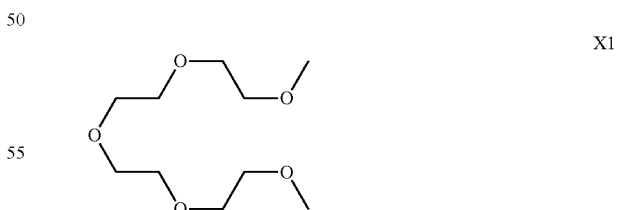
X1
2. EUV Exposure (Examples 1-1 to 1-44, and Comparative Examples 1-1 to 1-7)
<EUV Exposure Evaluation>
Using the resist composition described in Table 5, a resist pattern was formed through the following operation.

[Application and Post-Application Baking (PB) of Resist Composition]

An organic film DUV44 (manufactured by Brewer Science, Inc.) was applied onto a 12-inch silicon wafer (1 inch=2.54 cm), and baked at 200° C. for 60 seconds to form an organic film having a film thickness of 60 nm. Each of the resist compositions obtained as above was applied thereonto and baked for 60 seconds under the conditions of 90° C. to 180° C. (refer to the PB section in Table 9) to form a resist film having a film thickness of 40 nm.

Incidentally, the resist composition 31 used in Example 1-24 was a positive tone resist composition, and in the other Examples and Comparative Examples, negative tone resist compositions were used.

[Application and Post-Application Baking (PB) of Composition for Forming Upper Layer Film]

With regard to Examples 1-30 to 1-37, and 1-42 to 1-44, the composition (topcoat composition) for forming an upper layer film shown in Table 6 was applied onto the baked resist film, and then baked at a PB temperature (unit: ° C.) shown in Table 9 over 60 seconds to form an upper layer film (topcoat) having a film thickness of 40 nm.

[Exposure]
(L/S Pattern)

The wafer manufactured above was subjected to EUV exposure with a numerical aperture (NA) of 0.25 and a dipole illumination (Dipole 60x, outer sigma of 0.81, inner sigma of 0.43). Specifically, the EUV exposure was carried out by varying the exposure doses through a mask including a pattern (for evaluation of pattern collapse of L/S) for forming a line-and-space pattern in a dimension with a pitch of 40 nm and a width of 20 nm on the wafer.

(C/H Pattern)

The wafer manufactured above was subjected to EUV exposure with a numerical aperture (NA) of 0.25 and a Quasar illumination (Quasar 45, outer sigma of 0.81, inner sigma of 0.51). Specifically, the EUV exposure was carried out by varying the exposure doses through a mask including a pattern (for evaluation of pattern collapse of C/H) for forming a contact hole pattern in a dimension with a pitch of 60 nm and a hole size of 30 nm on the wafer.

[Post-Exposure Baking (PEB)]

After the irradiation, the film was taken out from the EUV exposure device, and immediately baked for 60 seconds under the conditions of 85° C. to 130° C. (refer to the PEB section in Table 9).

[Development]

Thereafter, using a shower type developing device (ADE3000S, manufactured by ACTES Kyosan, Inc.), development was carried out by spray-discharging a developer (23° C.) for 30 seconds at a flow rate of 200 mL/min while rotating the wafer at 50 rotations (rpm). Further, as the developer, any one treatment liquid out of S-1 to S-20, and SA-1 to SA-9 described in Table 8 was used. The types of the developers used in the respective Examples and Comparative Examples are shown in Table 9.

TABLE 8

| Treatment liquid | First organic solvent | | | Second organic solvent | | | Mixing ratio (first:second = % by weight: % by weight) | Other organic solvents or components to be added | | | Mixing ratio (first:second: others = % by weight:% by weight:% by weight) |
|---|---|---|---|---|---|---|---|---|---|---|---|
| | Organic solvent | SP value (MPa$^{1/2}$) | Relative dielectric constant | Organic solvent | SP value (MPa$^{1/2}$) | Relative dielectric constant | | Organic solvents or components to be added | SP value (MPa$^{1/2}$) | Relative dielectric constant | |
| S-1 | Undecane | 16.0 | 2.0 | PGME | 23.0 | 12.3 | 80:20 | — | — | — | — |
| S-2 | Decane | 15.8 | 2.0 | Cyclohexanone | 20.0 | 18.2 | 80:20 | — | — | — | — |
| S-3 | Octane | 15.5 | 2.0 | 2-heptanone (MAK) | 18.1 | 12.0 | 80:20 | — | — | — | — |
| S-4 | Dodecane | 16.1 | 2.0 | 5-nonanone | 18.0 | 10.6 | 80:20 | — | — | — | — |
| S-5 | Dipropyl ether | 15.5 | 3.4 | PGMEA | 17.9 | 8.3 | 80:20 | — | — | — | — |
| S-6 | Di-isopropyl ether | 14.6 | 4.0 | Ethyl lactate | 24.4 | 13.1 | 80:20 | — | — | — | — |
| S-7 | Undecane | 16.0 | 2.0 | 3,3-dimethyl-2-butanong | 17.3 | 13.1 | 80:20 | — | — | — | — |
| S-8 | Undecane | 16.0 | 2.0 | 4-hepta none | 18.1 | 12.6 | 80:20 | — | — | — | — |
| S-9 | Undecane | 16.0 | 2.0 | Di-isobutyl ketone | 17.4 | 9.9 | 90:10 | — | — | — | — |
| S-10 | Undecane | 16.0 | 2.0 | Di-isobutyl ketone | 17.4 | 9.9 | 70:30 | — | — | — | — |
| S-11 | Undecane | 16.0 | 2.0 | Di-isobutyl ketone | 17.4 | 9.9 | 60:40 | — | — | — | — |
| S-12 | Undecane | 16.0 | 2.0 | Di-isobutyl ketone | 17.4 | 9.9 | 40:60 | — | — | — | — |
| S-13 | Undecane | 16.0 | 2.0 | Di-isobutyl ketone | 17.4 | 9.9 | — | 2-methyl 2-nitro-propane | 16.5 | 23.7 | 80:10:10 |
| S-14 | Undecane | 16.0 | 2.0 | Di-isobutyl ketone | 17.4 | 9.9 | — | 5-nonanone (as second organic solvent) | 18.0 | 10.6 | 80:10:10 |
| S-15 | Undecane | 16.0 | 2.0 | Di-isobutyl ketone | 17.4 | 9.9 | — | Decane (as first organic solvent) | 15.8 | 2.0 | 60:20:20 |

TABLE 8-continued

| Treatment liquid | First organic solvent | | | Second organic solvent | | | Mixing ratio (first:second = % by weight: % by weight) | Other organic solvents or components to be added | | | Mixing ratio (first:second:others = % by weight:% by weight:% by weight) |
|---|---|---|---|---|---|---|---|---|---|---|---|
| | Organic solvent | SP value (MPa$^{1/2}$) | Relative dielectric constant | Organic solvent | SP value (MPa$^{1/2}$) | Relative dielectric constant | | Organic solvents or components to be added | SP value (MPa$^{1/2}$) | Relative dielectric constant | |
| S-16 | Dipropyl ether | 15.5 | 3.4 | PGME | 23.0 | 12.3 | — | IL-P14 (manufactured by Koei Chemical Co., Ltd.) | — | — | 17:80:3 |
| S-17 | Undecane | 16.0 | 2.0 | Di-isobutyl ketone | 17.4 | 9.9 | 10:90 | — | — | — | — |
| S-18 | Undecane | 16.0 | 2.0 | Di-isobutyl ketone | 17.4 | 9.9 | 20:80 | — | — | — | — |
| S-19 | Undecane | 16.0 | 2.0 | PGME | 23.0 | 12.3 | 20:80 | — | — | — | — |
| S-20 | Undecane | 16.0 | 2.0 | Di-isobutyl ketone | 17.4 | 9.9 | 30:70 | — | — | — | — |
| SA-1 | 2,6-dimethyl 4-heptanone | 17.4 | 9.9 | 2-heptanone (MAK) | 18.1 | 12.0 | 50:50 | — | — | — | — |
| SA-2 | 2,6-dimethyl 4-heptanone | 17.4 | 9.9 | 2-heptanone (MAK) | 18.1 | 12.0 | 25:75 | — | — | — | — |
| SA-3 | 2,6-dimethyl 4-heptanone | 17.4 | 9.9 | 2-heptanone (MAK) | 18.1 | 12.0 | 75:25 | — | — | — | — |
| SA-4 | 2,6-dimethyl 4-heptanone | 17.4 | 9.9 | 2-heptanone (MAK) | 18.1 | 12.0 | 80:20 | — | — | — | — |
| SA-5 | n-butyl acetate | 17.8 | 5.0 | n-hexyl acetate | 17.8 | 4.4 | 80:20 | — | — | — | — |
| SA-6 | Di-n-propyl ether | 15.5 | 3.4 | Di-isopropyl ether | 14.6 | 4 | 80:20 | — | — | — | — |
| SA-7 | Isoamyl acetate | 17.4 | 4.8 | — | — | — | — | — | — | — | — |
| SA-8 | n-butyl acetate | 17.8 | 5.0 | — | — | — | — | — | — | — | — |
| SA-9 | Dodecane | 16.1 | 2.0 | — | — | — | — | — | — | — | — |

Here, in Table 8, the SP value of each developer/rinsing liquid is a value calculated using the Fedors method described in "Properties of Polymers, 2$^{nd}$ edition, published in 1976" (unit MPa$^{1/2}$).

In addition, the "relative dielectric constant: is a value using the relative dielectric constant (usually the value at a temperature of 20° C.) described in "Handbook of Organic Solvent Properties, Ian M. Smallwood, 1996, Elsevier" and "CRC Handbook of Chemistry and Physics, 96th Edition, William M. Haynes, 2015, CRC Press".

[Rinsing]

Thereafter, a rinsing treatment was carried out by spray-discharging a rinsing liquid (23° C.) for 15 seconds at a flow rate of 200 mL/min while rotating the wafer at 50 rotations (rpm).

Lastly, the wafer was dried by high-speed rotating it for 60 seconds at 2,500 rotations (rpm). Further, as the rinsing liquid, any one treatment liquid out of S-1 to S-20, and SA-1 to SA-9 described in Table 8 was used. The types of the rinsing liquids used in the respective Examples and Comparative Examples are shown in Table 9.

[Evaluation Test]

With regard to the following items, evaluation of the resist pattern was carried out. Details of the results are shown in Table 9.

(Pattern Collapse Performance of L/S)

The resolution states of the line-and-space patterns exposed at different exposure doses were observed at a magnification of 200 k, using a scanning electron microscope (S-9380II, manufactured by Hitachi, Ltd.), and a minimum line width with which the pattern collapse did not occur in one field of view observed was determined and used as an index of the pattern collapse. A smaller numeral value thereof indicates better pattern collapse performance.

(Omission Performance of C/H)

The resolution states of the contact hole patterns exposed at different exposure doses were observed at a magnification of 200 k, using a scanning electron microscope (S-9380II, manufactured by Hitachi, Ltd.), and a minimum hole size with which the omission failure of a hole did not occur in one field of view observed was determined and used as an index of the omission performance of C/H. A smaller numeral value thereof indicates better omission performance of C/H.

TABLE 9

| | | PB (60 seconds) | Upper layer film | PB of upper layer film (60 seconds) | PEB (60 seconds) | Development | Rinsing | L/S collapse (nm) | C/H omission (nm) |
|---|---|---|---|---|---|---|---|---|---|
| Example 1-1 | Resist composition 1 | 120° C. | — | — | 90° C. | SA-8 | S-1 | 13.8 | 28.4 |
| Example 1-2 | Resist composition 2 | 110° C. | — | — | 110° C. | SA-8 | S-2 | 13.1 | 29.4 |
| Example 1-3 | Resist composition 3 | 100° C. | — | — | 110° C. | SA-7 | S-3 | 13.1 | 25.2 |
| Example 1-4 | Resist composition 4 | 90° C. | — | — | 85° C. | SA-8 | S-4 | 16.7 | 23.7 |
| Example 1-5 | Resist composition 5 | 130° C. | — | — | 110° C. | SA-8 | S-5 | 15.2 | 24.6 |
| Example 1-6 | Resist composition 6 | 120° C. | — | — | 120° C. | SA-8 | S-6 | 17.0 | 27.5 |
| Example 1-7 | Resist composition 7 | 110° C. | — | — | 100° C. | SA-7 | S-7 | 14.5 | 22.2 |
| Example 1-8 | Resist composition 8 | 100° C. | — | — | 110° C. | SA-7 | S-8 | 13.0 | 23.8 |
| Example 1-9 | Resist composition 9 | 90° C. | — | — | 110° C. | SA-7 | S-9 | 14.7 | 21.8 |
| Example 1-10 | Resist composition 10 | 130° C. | — | — | 110° C. | SA-7 | S-10 | 14.3 | 20.2 |
| Example 1-11 | Resist composition 11 | 120° C. | — | — | 130° C. | SA-7 | S-11 | 14.3 | 20.2 |
| Example 1-12 | Resist composition 12 | 110° C. | — | — | 110° C. | SA-7 | S-12 | 14.8 | 22.7 |
| Example 1-13 | Resist composition 13 | 100° C. | — | — | 110° C. | SA-7 | S-13 | 13.6 | 20.3 |
| Example 1-14 | Resist composition 1 | 120° C. | — | — | 90° C. | SA-7 | S-14 | 14.6 | 21.3 |
| Example 1-15 | Resist composition 2 | 110° C. | — | — | 110° C. | SA-7 | S-15 | 13.6 | 22.1 |
| Example 1-16 | Resist composition 3 | 100° C. | — | — | 110° C. | SA-7 | S-16 | 14.6 | 20.1 |
| Example 1-17 | Resist composition 4 | 90° C. | — | — | 85° C. | SA-7 | S-11 | 13.9 | 21.2 |
| Example 1-18 | Resist composition 5 | 130° C. | — | — | 110° C. | S-17 | S-12 | 14.4 | 22.6 |
| Example 1-19 | Resist composition 6 | 120° C. | — | — | 120° C. | S-18 | S-13 | 14.9 | 22.9 |
| Example 1-20 | Resist composition 7 | 110° C. | — | — | 100° C. | S-19 | S-14 | 13.8 | 20.2 |
| Example 1-21 | Resist composition 8 | 100° C. | — | — | 110° C. | S-17 | SA-9 | 13.8 | 29.7 |
| Example 1-22 | Resist composition 9 | 90° C. | — | — | 110° C. | S-18 | SA-9 | 14.3 | 28.7 |
| Example 1-23 | Resist composition 10 | 130° C. | — | — | 110° C. | S-19 | SA-9 | 14.1 | 28.7 |
| Example 1-24 | Resist composition 31 | 180° C. | — | — | — | SA-8 | S-4 | 17.9 | 24.8 |
| Example 1-25 | Resist composition 32 | 110° C. | — | — | — | SA-8 | S-5 | 15.4 | 24.1 |
| Example 1-26 | Resist composition 33 | — | — | — | — | SA-8 | S-6 | 16.8 | 27.8 |
| Example 1-27 | Resist composition 3 | 120° C. | — | — | 85° C. | SA-7 | S-17 | 14.4 | 22.8 |
| Example 1-28 | Resist composition 4 | 110° C. | — | — | 90° C. | SA-7 | S-18 | 14.6 | 22.7 |
| Example 1-29 | Resist composition 5 | 100° C. | — | — | 110° C. | SA-7 | S-20 | 14.8 | 23.0 |
| Example 1-30 | Resist composition 4 | 120° C. | T-1 | 90° C. | 90° C. | SA-7 | S-11 | 13.9 | 20.1 |
| Example 1-31 | Resist composition 4 | 120° C. | T-2 | 120° C. | 90° C. | SA-7 | S-11 | 13.1 | 22.3 |
| Example 1-32 | Resist composition 4 | 120° C. | T-3 | 90° C. | 90° C. | SA-7 | S-11 | 14.8 | 20.6 |
| Example 1-33 | Resist composition 4 | 120° C. | T-4 | 120° C. | 90° C. | SA-7 | S-11 | 13.2 | 20.6 |
| Example 1-34 | Resist composition 4 | 120° C. | T-5 | 120° C. | 90° C. | SA-7 | S-11 | 14.7 | 20.4 |
| Example 1-35 | Resist composition 4 | 120° C. | T-6 | 90° C. | 90° C. | SA-7 | S-11 | 14.2 | 22.6 |
| Example 1-36 | Resist composition 4 | 120° C. | T-7 | 120° C. | 90° C. | SA-7 | S-11 | 14.5 | 20.3 |
| Example 1-37 | Resist composition 4 | 120° C. | T-8 | 90° C. | 90° C. | SA-7 | S-11 | 13.2 | 20.6 |
| Example 1-38 | Resist composition 4 | 120° C. | — | — | 85° C. | SA-7 | S-20 | 14.4 | 22.5 |
| Example 1-39 | Resist composition 23 | 120° C. | — | — | 90° C. | SA-1 | S-20 | 14.5 | 22.4 |
| Example 1-40 | Resist composition 24 | 120° C. | — | — | 110° C. | SA-1 | S-20 | 14.4 | 22.3 |
| Example 1-41 | Resist composition 25 | 120° C. | — | — | 95° C. | SA-1 | S-20 | 14.3 | 22.5 |
| Example 1-42 | Resist composition 25 | 120° C. | T-1 | 90° C. | 95° C. | SA-1 | S-20 | 14.4 | 22.6 |
| Example 1-43 | Resist composition 4 | 120° C. | T-9 | 120° C. | 90° C. | SA-7 | S-10 | 14.0 | 20.9 |
| Example 1-44 | Resist composition 25 | 120° C. | T-9 | 90° C. | 90° C. | SA-1 | S-20 | 14.2 | 22.7 |
| Comparative Example 1-1 | Resist composition 6 | 90° C. | — | — | 120° C. | SA-8 | SA-9 | 20.3 | 40.3 |
| Comparative Example 1-2 | Resist composition 6 | 90° C. | — | — | 120° C. | SA-8 | SA-3 | 20.8 | 29.7 |
| Comparative Example 1-3 | Resist composition 6 | 90° C. | — | — | 120° C. | SA-8 | SA-4 | 21.1 | 29.6 |
| Comparative Example 1-4 | Resist composition 6 | 90° C. | — | — | 120° C. | SA-8 | SA-6 | 20.4 | 37.3 |
| Comparative Example 1-5 | Resist composition 6 | 90° C. | — | — | 120° C. | SA-1 | SA-6 | 20.5 | 44.7 |
| Comparative Example 1-6 | Resist composition 6 | 90° C. | — | — | 120° C. | SA-2 | SA-9 | 20.2 | 34.2 |
| Comparative Example 1-7 | Resist composition 6 | 90° C. | — | — | 120° C. | SA-5 | SA-9 | 19.7 | 41.6 |

3. EUV Exposure-Double Patterning (Example 1-45)

[Application and Post-Application Baking (PB) of Resist Composition]

An organic film DUV44 (manufactured by Brewer Science, Inc.) was applied onto a 12-inch silicon wafer, and baked at 200° C. for 60 seconds to form an organic film having a film thickness of 60 nm. The resist composition 1 was applied thereonto and baked for 60 seconds at 90° C. to form a resist film having a film thickness of 60 nm.

[Exposure]

(L/S Pattern)

The wafer manufactured above was subjected to EUV exposure with a numerical aperture (NA) of 0.25 and a dipole illumination (Dipole 60x, outer sigma of 0.81, inner sigma of 0.43). Specifically, a first EUV exposure was carried out through a mask including a pattern with a space of 40 nm and a line pattern of 120 nm, and a second exposure was carried out with the same pattern as the first mask while the position of a mask was shifted 80 nm to arrange a space between the first exposure spaces.

(C/H Pattern)

The wafer manufactured above was subjected to a first EUV exposure with a numerical aperture (NA) of 0.25 and a Dipole illumination (X deflection, Dipole 60x, outer sigma of 0.81, inner sigma of 0.43), using a line-space mask with a half pitch of 30 nm, and then to a second EUV exposure with a Dipole illumination (Y deflection, Dipole 60y, outer sigma of 0.81, inner sigma of 0.43), using a line-space mask with a half pitch of 30 nm.

[Development]

Thereafter, using a shower type developing device (ADE3000S, manufactured by ACTES Kyosan, Inc.), development was carried out by using a treatment liquid SA-7 shown in Table 8 as a developer (23° C.) while rotating the wafer at 50 rotations (rpm), and spray-discharging it for 30 seconds at a flow rate of 200 mL/min.

[Rinsing]

Thereafter, a rinsing treatment was carried out by using a treatment liquid S-11 shown in Table 8 as a rinsing liquid (23° C.) while rotating the wafer at 50 rotations (rpm), and spray-discharging it for 15 seconds at a flow rate of 200 mL/min. Lastly, the wafer was dried by high-speed rotating it for 60 seconds at 2,500 rotations (rpm).

[Evaluation Test]

(Results of L/S Pattern Evaluation)

The exposure was carried out while appropriately adjusting the exposure dose for forming a pattern, and as a result, a pattern with a line of 14 nm and a pitch of 40 nm was resolved without pattern collapse.

(Results of C/H Pattern Evaluation)

The exposure was carried out while appropriately adjusting the exposure dose for forming a pattern, and as a result, a pattern with a hole of 23 nm and a pitch of 60 nm was resolved without omission failure of C/H.

4. EB Exposure (Examples 2-1 to 2-27, and Comparative Examples 2-1 to 2-7)

<EB Exposure Evaluation>

Using the resist composition described in Table 5, a resist pattern was formed through the following operation.

[Application and Post-Application Baking (PB) of Resist Composition]

An organic film DUV44 (manufactured by Brewer Science, Inc.) was applied onto a 6-inch silicon wafer, and baked at 200° C. for 60 seconds to form an organic film having a film thickness of 60 nm. The resist composition described in Table 5 was applied thereonto and baked for 60 seconds under the conditions of 90° C. to 180° C. (refer to the PB section in Table 10) to form a resist film having a film thickness of 40 nm.

Incidentally, the resist composition 31 used in Example 2-24 was a positive tone resist composition, and in the other Examples and Comparative Examples, negative tone resist compositions were used.

[Exposure]

(L/S Pattern)

The wafer manufactured above was subjected to EB exposure (for evaluation of pattern collapse of L/S) by designing a layout of EB drawing as in the formation of a line-and-space pattern having a dimension on the wafer with a pitch of 40 nm and a width of 20 nm, and varying the exposure doses, using an electron beam irradiation device (JBX6000FS/E, manufactured by JEOL; accelerating voltage of 50 keV).

(C/H Pattern)

The wafer manufactured above was subjected to EB exposure (for evaluation of pattern collapse of C/H) by designing a layout of EB drawing for forming a contact hole pattern for the formation of a contact hole pattern having a dimension on the wafer with a pitch of 60 nm and a hole size of 30 nm, and varying the exposure doses.

[Post-Exposure Baking (PEB)]

After the irradiation, the film was taken out from the electron beam irradiation device, and immediately heated on a hot plate under the conditions of 85° C. to 130° C. (refer to the PEB section in Table 10) for 60 seconds.

[Development]

Using a shower type developing device (ADE3000S, manufactured by ACTES Kyosan, Inc.), development was carried out by spray-discharging a developer (23° C.) for 30 seconds at a flow rate of 200 mL/min while rotating the wafer at 50 rotations (rpm). Further, as the developer, any one treatment liquid out of S-1 to S-20 and SA-1 to SA-9 described in Table 8 was used. The types of the developers used in the respective Examples and Comparative Examples are shown in Table 10.

[Rinsing]

Thereafter, a rinsing treatment was carried out by spray-discharging a rinsing liquid (23° C.) for 15 seconds at a flow rate of 200 mL/min while rotating the wafer at 50 rotations (rpm).

Lastly, the wafer was dried by high-speed rotating it for 60 seconds at 2,500 rotations (rpm). Further, as the rinsing liquid, any one treatment liquid out of S-1 to S-20 and SA-1 to SA-9 described in Table 8 was used. The types of the rinsing liquids used in the respective Examples and Comparative Examples are shown in Table 10.

[Evaluation Test]

With regard to the same items as in the above-mentioned "EUV Exposure Evaluation", evaluation of the resist pattern was carried out by the same method as above, except that "S-9220" (manufactured by Hitachi, Ltd.) was used as a scanning electron microscope. Details of the results are shown in Table 10.

TABLE 10

| | | PB (60 seconds) | PEB (60 seconds) | Development | Rinsing | L/S collapse (nm) | C/H omission (nm) |
|---|---|---|---|---|---|---|---|
| Example 2-1 | Resist composition 1 | 120° C. | 90° C. | SA-8 | S-1 | 13.5 | 28.2 |
| Example 2-2 | Resist composition 2 | 110° C. | 110° C. | SA-8 | S-2 | 13.7 | 26.7 |
| Example 2-3 | Resist composition 3 | 100° C. | 110° C. | SA-7 | S-3 | 14.8 | 25.5 |
| Example 2-4 | Resist composition 4 | 90° C. | 85° C. | SA-8 | S-4 | 17.8 | 24.9 |
| Example 2-5 | Resist composition 5 | 130° C. | 110° C. | SA-8 | S-5 | 15.3 | 23.7 |
| Example 2-6 | Resist composition 6 | 120° C. | 120° C. | SA-8 | S-6 | 17.3 | 26.9 |
| Example 2-7 | Resist composition 7 | 110° C. | 100° C. | SA-7 | S-7 | 14.1 | 21.7 |

TABLE 10-continued

|  |  | PB (60 seconds) | PEB (60 seconds) | Development | Rinsing | L/S collapse (nm) | C/H omission (nm) |
|---|---|---|---|---|---|---|---|
| Example 2-8 | Resist composition 8 | 100° C. | 110° C. | SA-7 | S-8 | 14.7 | 25.3 |
| Example 2-9 | Resist composition 9 | 90° C. | 110° C. | SA-7 | S-9 | 14.8 | 22.1 |
| Example 2-10 | Resist composition 10 | 130° C. | 110° C. | SA-7 | S-10 | 14.1 | 20.1 |
| Example 2-11 | Resist composition 11 | 120° C. | 130° C. | SA-7 | S-11 | 13.9 | 21.9 |
| Example 2-12 | Resist composition 12 | 110° C. | 110° C. | SA-7 | S-12 | 15.4 | 22.7 |
| Example 2-13 | Resist composition 13 | 100° C. | 110° C. | SA-7 | S-13 | 14.2 | 20.1 |
| Example 2-14 | Resist composition 1 | 120° C. | 90° C. | SA-7 | S-14 | 14.4 | 21.5 |
| Example 2-15 | Resist composition 2 | 110° C. | 110° C. | SA-7 | S-15 | 13.3 | 22.5 |
| Example 2-16 | Resist composition 3 | 100° C. | 110° C. | SA-7 | S-16 | 14.1 | 22.5 |
| Example 2-17 | Resist composition 4 | 90° C. | 85° C. | SA-7 | S-11 | 13.1 | 21.7 |
| Example 2-18 | Resist composition 5 | 130° C. | 110° C. | S-17 | S-12 | 13.8 | 20.0 |
| Example 2-19 | Resist composition 6 | 120° C. | 120° C. | S-18 | S-13 | 14.7 | 21.5 |
| Example 2-20 | Resist composition 7 | 110° C. | 100° C. | S-19 | S-14 | 13.5 | 22.7 |
| Example 2-21 | Resist composition 8 | 100° C. | 110° C. | S-17 | SA-9 | 13.8 | 29.1 |
| Example 2-22 | Resist composition 9 | 90° C. | 110° C. | S-18 | SA-9 | 14.6 | 28.6 |
| Example 2-23 | Resist composition 10 | 130° C. | 110° C. | S-19 | SA-9 | 14.9 | 29.6 |
| Example 2-24 | Resist composition 31 | 180° C. | — | SA-8 | S-4 | 16.9 | 25.9 |
| Example 2-25 | Resist composition 32 | 110° C. | — | SA-8 | S-5 | 16.3 | 24.7 |
| Example 2-26 | Resist composition 33 | — | — | SA-8 | S-6 | 17.7 | 29.3 |
| Example 2-27 | Resist composition 25 | 110° C. | 90° C. | S-17 | SA-9 | 13.7 | 20.2 |
| Comparative Example 2-1 | Resist composition 6 | 90° C. | 120° C. | SA-8 | SA-9 | 21.3 | 40.4 |
| Comparative Example 2-2 | Resist composition 6 | 90° C. | 120° C. | SA-8 | SA-3 | 20.8 | 29.8 |
| Comparative Example 2-3 | Resist composition 6 | 90° C. | 120° C. | SA-8 | SA-4 | 21.1 | 29.5 |
| Comparative Example 2-4 | Resist composition 6 | 90° C. | 120° C. | SA-8 | SA-6 | 19.9 | 41.1 |
| Comparative Example 2-5 | Resist composition 6 | 90° C. | 120° C. | SA-1 | SA-6 | 21.6 | 44.7 |
| Comparative Example 2-6 | Resist composition 6 | 90° C. | 120° C. | SA-2 | SA-9 | 20.5 | 39.8 |
| Comparative Example 2-7 | Resist composition 6 | 90° C. | 120° C. | SA-5 | SA-9 | 20.1 | 37.0 |

4. ArF Exposure (Examples 3-1 to 3-35, and Comparative Examples 3-1 to 3-7)

<ArF Exposure Evaluation>

Using the resist composition described in Table 5, a resist pattern was formed through the following operation.

[Application and Post-Application Baking (PB) of Resist Composition]

An organic antireflection film ARC29SR (manufactured by Brewer Science, Inc.) was applied onto a 8-inch silicon wafer, and baked at 205° C. for 60 seconds to form an antireflection film having a film thickness of 86 nm. Each of the resist compositions obtained as above was applied thereonto and baked for 60 seconds under the conditions of 90° C. to 120° C. (refer to the PB section in Table 11) to form a resist film having a film thickness of 40 nm.

[Application and Post-Application Baking (PB) of Composition for Forming Upper Layer Film]

With regard to Examples 3-24 to 3-31 and 3-33 to 3-35, the composition (topcoat composition) for forming an upper layer film shown in Table 6 was applied onto the baked resist film, and then baked at a PB temperature (unit: ° C.) shown in Table 11 over 60 seconds to form an upper layer film (topcoat) having a film thickness of 40 nm.

[Exposure]

(L/S Pattern)

The wafer manufactured above was subjected to pattern-wise exposure of the resist film through a 6% halftone mask (with a space portion shielded) having a 1:1 line-and-space pattern with a line width of 50 nm, using an ArF excimer liquid immersion scanner (manufactured by ASML; XT1700i, NA1.20, C-Quad, outer sigma of 0.750, inner sigma of 0.650, and Y deflection) while varying the exposure doses. Ultrapure water was used as an immersion liquid. Thereafter, the resist film was heated (post-exposure baked; PEB) for 60 seconds under the conditions of 90° C. to 120° C. (refer to the PEB section in Table 11). Then, the resist film was developed by puddling it for 30 seconds with a developer described in Table 11 (with regard to each of the developers, refer to Table 8), using a development device (RF$^3$; manufactured by SOKUDO Co., Ltd.). Thereafter, rinsing was carried out for 15 seconds with a rinsing liquid described in Table 11 (with regard to each of the rinsing liquids, refer to Table 8) while rotating the wafer at 50 rotations (rpm), and subsequently, the wafer was rotated for 30 seconds at a rotation speed of 2,000 rpm to obtain a line-and-space pattern.

(C/H Pattern)

The wafer manufactured above was subjected to pattern-wise exposure of the resist film through a 6% halftone mask with 65 nm of a hole portion and a square array with a pitch between holes of 100 nm (with a space portion shielded), using an ArF excimer liquid immersion scanner (manufactured by ASML; XT1700i, NA1.20, C-Quad, outer sigma of 0.730, inner sigma of 0.630, and XY deflection) while varying the exposure doses. Ultrapure water was used as an immersion liquid. Thereafter, the resist film was heated (post-exposure baked; PEB) for 60 seconds under the conditions of 90° C. to 120° C. (refer to the PEB section in Table 11). Then, the resist film was developed by puddling it for 30 seconds with a developer described in Table 11 (with regard to each of the developers, refer to Table 8), using a development device (RF3; manufactured by SOKUDO Co., Ltd.). Thereafter, rinsing was carried out for 15 seconds with a rinsing liquid described in Table 11 (with regard to each of the rinsing liquids, refer to Table 8) while rotating the wafer at 50 rotations (rpm), and subsequently, the wafer was rotated for 30 seconds at a rotation speed of 2,000 rpm to obtain a hole pattern.

[Evaluation Test]

With regard to the same items as in the above-mentioned "EUV Exposure Evaluation", evaluation of the resist pattern was carried out by the same method as above, using "S-9380II" (manufactured by Hitachi, Ltd.) as a scanning electron microscope. Details of the results are shown in Table 11.

occurrence of pattern collapse in a resist L/S pattern and the occurrence of omission failure in a resist C/H pattern.

On the other hand, as clearly seen from Comparative Examples, it was found that in a case where both of the developer and the rinsing liquid do not contain the first organic solvent having an SP value of 16.3 MPa$^{1/2}$ or less and the second organic solvent having an SP value of 17.1 MPa$^{1/2}$ or more, it is impossible to simultaneously suppress the occurrence of pattern collapse in a resist L/S pattern and the occurrence of omission failure in a resist C/H pattern.

TABLE 11

| | | PB (60 seconds) | Upper layer film | PB (60 seconds) of upper layer film | PEB (60 seconds) | Development | Rinsing | L/S collapse (nm) | C/H omission (nm) |
|---|---|---|---|---|---|---|---|---|---|
| Example 3-1 | Resist composition 14 | 120° C. | — | — | 90° C. | SA-8 | S-1 | 39.4 | 60.5 |
| Example 3-2 | Resist composition 15 | 110° C. | — | — | 120° C. | SA-8 | S-2 | 38.7 | 60.1 |
| Example 3-3 | Resist composition 16 | 100° C. | — | — | 90° C. | SA-7 | S-3 | 38.7 | 58.5 |
| Example 3-4 | Resist composition 17 | 90° C. | — | — | 120° C. | SA-8 | S-4 | 47.7 | 58.7 |
| Example 3-5 | Resist composition 18 | 120° C. | — | — | 90° C. | SA-8 | S-5 | 43.1 | 57.9 |
| Example 3-6 | Resist composition 19 | 110° C. | — | — | 120° C. | SA-8 | S-6 | 46.7 | 64.5 |
| Example 3-7 | Resist composition 20 | 100° C. | — | — | 90° C. | SA-7 | S-7 | 36.6 | 55.5 |
| Example 3-8 | Resist composition 21 | 90° C. | — | — | 120° C. | SA-7 | S-8 | 38.4 | 56.2 |
| Example 3-9 | Resist composition 22 | 120° C. | — | — | 90° C. | SA-7 | S-9 | 37.0 | 52.1 |
| Example 3-10 | Resist composition 14 | 110° C. | — | — | 120° C. | SA-7 | S-10 | 38.3 | 55.0 |
| Example 3-11 | Resist composition 15 | 100° C. | — | — | 120° C. | SA-7 | S-11 | 38.6 | 55.7 |
| Example 3-12 | Resist composition 16 | 90° C. | — | — | 120° C. | SA-7 | S-12 | 36.8 | 53.0 |
| Example 3-13 | Resist composition 17 | 120° C. | — | — | 90° C. | SA-7 | S-13 | 39.3 | 55.4 |
| Example 3-14 | Resist composition 18 | 110° C. | — | — | 120° C. | SA-7 | S-14 | 39.8 | 54.6 |
| Example 3-15 | Resist composition 19 | 100° C. | — | — | 120° C. | SA-7 | S-15 | 38.6 | 54.2 |
| Example 3-16 | Resist composition 20 | 90° C. | — | — | 120° C. | SA-7 | S-16 | 38.3 | 55.9 |
| Example 3-17 | Resist composition 21 | 120° C. | — | — | 90° C. | SA-7 | S-11 | 38.9 | 55.6 |
| Example 3-18 | Resist composition 22 | 110° C. | — | — | 120° C. | S-17 | S-12 | 39.3 | 53.4 |
| Example 3-19 | Resist composition 16 | 100° C. | — | — | 90° C. | S-18 | S-13 | 38.5 | 53.5 |
| Example 3-20 | Resist composition 17 | 90° C. | — | — | 120° C. | S-19 | S-14 | 39.1 | 52.5 |
| Example 3-21 | Resist composition 14 | 120° C. | — | — | 90° C. | S-17 | SA-9 | 37.7 | 60.9 |
| Example 3-22 | Resist composition 19 | 110° C. | — | — | 120° C. | S-18 | SA-9 | 38.8 | 64.0 |
| Example 3-23 | Resist composition 20 | 100° C. | — | — | 90° C. | S-19 | SA-9 | 38.1 | 61.8 |
| Example 3-24 | Resist composition 20 | 100° C. | T-1 | 90° C. | 90° C. | SA-8 | S-1 | 38.6 | 59.5 |
| Example 3-25 | Resist composition 20 | 100° C. | T-2 | 120° C. | 90° C. | SA-8 | S-1 | 38.8 | 58.7 |
| Example 3-26 | Resist composition 20 | 100° C. | T-3 | 90° C. | 90° C. | SA-7 | S-1 | 40.0 | 57.2 |
| Example 3-27 | Resist composition 20 | 100° C. | T-4 | 120° C. | 90° C. | SA-7 | S-1 | 41.5 | 57.0 |
| Example 3-28 | Resist composition 20 | 100° C. | T-5 | 120° C. | 90° C. | SA-8 | S-1 | 39.8 | 58.6 |
| Example 3-29 | Resist composition 20 | 100° C. | T-6 | 90° C. | 90° C. | SA-8 | S-1 | 38.3 | 58.0 |
| Example 3-30 | Resist composition 20 | 100° C. | T-7 | 120° C. | 90° C. | SA-8 | S-1 | 40.4 | 57.8 |
| Example 3-31 | Resist composition 20 | 100° C. | T-8 | 90° C. | 90° C. | SA-7 | S-8 | 39.4 | 56.4 |
| Example 3-32 | Resist composition 24 | 120° C. | — | — | 105° C. | SA-1 | S-8 | 39.3 | 56.2 |
| Example 3-33 | Resist composition 24 | 120° C. | T-3 | 105° C. | 105° C. | SA-1 | S-9 | 37.5 | 52.8 |
| Example 3-34 | Resist composition 20 | 100° C. | T-9 | 120° C. | 95° C. | SA-7 | S-1 | 40.5 | 56.6 |
| Example 3-35 | Resist composition 24 | 120° C. | T-9 | 90° C. | 105° C. | SA-1 | S-9 | 37.3 | 52.2 |
| Comparative Example 3-1 | Resist composition 14 | 120° C. | — | — | 90° C. | SA-8 | SA-9 | 50.7 | 72.5 |
| Comparative Example 3-2 | Resist composition 15 | 110° C. | — | — | 120° C. | SA-8 | SA-3 | 53.2 | 67.5 |
| Comparative Example 3-3 | Resist composition 16 | 100° C. | — | — | 90° C. | SA-8 | SA-4 | 53.5 | 66.6 |
| Comparative Example 3-4 | Resist composition 17 | 90° C. | — | — | 120° C. | SA-8 | SA-6 | 52.1 | 73.9 |
| Comparative Example 3-5 | Resist composition 14 | 120° C. | — | — | 90° C. | SA-1 | SA-6 | 53.4 | 70.8 |
| Comparative Example 3-6 | Resist composition 15 | 110° C. | — | — | 120° C. | SA-2 | SA-9 | 52.7 | 70.3 |
| Comparative Example 3-7 | Resist composition 16 | 100° C. | — | — | 90° C. | SA-5 | SA-9 | 52.0 | 74.6 |

5. Evaluation Results

As shown in each of Examples in Tables 9 to 11, it could be seen that in cases where any of the exposure light sources are used, the use of at least one treatment liquid of the developer or the rinsing liquid, which contains a first organic solvent having an SP value of 16.3 MPa$^{1/2}$ or less and a second organic solvent having an SP value of 17.1 MPa$^{1/2}$ or more, makes it possible to simultaneously suppress the In addition, it could be confirmed that in a case where the treatment liquid which contains the first organic solvent having an SP value of 16.3 MPa$^{1/2}$ or less and the second organic solvent having an SP value of 17.1 MPa$^{1/2}$ or more is used as the rinsing liquid, the occurrence of the pattern failure in the C/H pattern can further be suppressed.

Moreover, it could be confirmed that the treatment liquid of the present invention can be applied to any of a negative tone resin and a positive tone resin.

In a case where the treatment liquid according to the present invention was stored in a FluoroPurePFA composite drum (inner surface in contact with liquid; PFA resin lining) manufactured by Entegris, Inc., and a steel-made drum can manufactured by JFE Steel Corporation (inner surface in contact with liquid; zinc phosphate-coated film) at normal temperature for 14 days, using the method described in JP2014-112176 Å, and then subjected to analysis of concentrations of wet particles and organic impurities, and analysis of concentration of metal impurities were carried out, better results could be obtained from the Fluoro-PurePFA composite drum manufactured by Entegris, Inc. (inner surface in contact with liquid; PFA resin lining) than from the steel-made drum can manufactured by JFE Steel Corporation (inner surface in contact with liquid; zinc phosphate-coated film).

What is claimed is:

1. A treatment liquid for patterning a resist film,
used for subjecting a resist film obtained from an actinic ray-sensitive or radiation-sensitive resin composition to at least one of development or washing, and
containing an organic solvent,
wherein the treatment liquid contains a first organic solvent having an solubility parameter value of 16.3 MPa$^{1/2}$ or less and a second organic solvent having an solubility parameter value of 17.1 MPa$^{1/2}$ or more, wherein the first organic solvent includes undecane, and an amount of the first organic solvent is 40% or less by weight with respect to a total weight of the treatment liquid, and
the treatment liquid is a rinsing liquid.

2. The treatment liquid according to claim 1,
wherein the second organic solvent includes a ketone-based solvent.

3. The treatment liquid according to claim 2,
wherein the ketone-based solvent includes an acyclic ketone.

4. A treatment liquid for patterning a resist film,
used for subjecting a resist film obtained from an actinic ray-sensitive or radiation-sensitive resin composition to at least one of development or washing, and
containing an organic solvent and an ionic liquid,
wherein the treatment liquid contains a first organic solvent having an solubility parameter value of 16.3 MPa$^{1/2}$ or less and a second organic solvent having an solubility parameter value of 17.1 MPa$^{1/2}$ or more, wherein the first organic solvent includes undecane, and an amount of the first organic solvent is 40% or less by weight with respect to a total weight of the treatment liquid.

5. A pattern forming method comprising:
a resist film forming step of forming a resist film using an actinic ray-sensitive or radiation-sensitive resin composition;
an exposing step of exposing the resist film; and
a treating step of treating the exposed resist film with the treatment liquid according to claim 1.

6. A pattern forming method comprising:
a resist film forming step of forming a resist film using an actinic ray-sensitive or radiation-sensitive resin composition;
an exposing step of exposing the resist film; and
a treating step of treating the exposed resist film with the treatment liquid according to claim 1,
wherein the treating step includes:
a developing step of carrying out development with a developer; and
a rinsing step of carrying out washing with a rinsing liquid, and
the rinsing liquid is the treatment liquid.

7. The pattern forming method according to claim 6,
wherein the developer includes an ester-based solvent.

8. The pattern forming method according to claim 7,
wherein the ester-based solvent is a solvent including at least one selected from the group consisting of butyl acetate, amyl acetate, isoamyl acetate, 2-methylbutyl acetate, 1-methylbutyl acetate, hexyl acetate, pentyl propionate, hexyl propionate, heptyl propionate, butyl butanoate, and butyl isobutanoate.

* * * * *